(12) United States Patent
Kim et al.

(10) Patent No.: US 9,012,326 B2
(45) Date of Patent: Apr. 21, 2015

(54) METHODS FOR PATTERNING MICROELECTRONIC DEVICES USING TWO SACRIFICIAL LAYERS

(75) Inventors: Nam-Gun Kim, Seoul (KR); Yoonjae Kim, Yongin-si (KR); Sungil Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 531 days.

(21) Appl. No.: 13/087,208

(22) Filed: Apr. 14, 2011

(65) Prior Publication Data

US 2012/0040528 A1    Feb. 16, 2012

(30) Foreign Application Priority Data

Aug. 13, 2010   (KR) ........................ 10-2010-0078474

(51) Int. Cl.

| | |
|---|---|
| H01L 21/44 | (2006.01) |
| H01L 21/768 | (2006.01) |
| H01L 27/108 | (2006.01) |
| H01L 27/22 | (2006.01) |
| H01L 49/02 | (2006.01) |
| H01L 29/66 | (2006.01) |
| H01L 29/78 | (2006.01) |
| H01L 21/033 | (2006.01) |
| H01L 21/308 | (2006.01) |
| H01L 21/311 | (2006.01) |

(Continued)

(52) U.S. Cl.

CPC ....... *H01L 21/76816* (2013.01); *H01L 27/1021* (2013.01); *H01L 27/10817* (2013.01); *H01L 27/10855* (2013.01); *H01L 27/10882* (2013.01); *H01L 27/10894* (2013.01); *H01L 27/11524* (2013.01); *H01L 27/11556* (2013.01); *H01L 27/1157* (2013.01); *H01L 27/11582* (2013.01); *H01L 27/224* (2013.01); *H01L 27/24* (2013.01); *H01L 28/91* (2013.01); *H01L 29/66666* (2013.01); *H01L 29/7827* (2013.01); *H01L 29/785* (2013.01); *H01L 45/04* (2013.01); *H01L 45/06* (2013.01); *H01L 45/10* (2013.01); *H01L 45/141* (2013.01); *H01L 45/145* (2013.01); *H01L 21/0337* (2013.01); *H01L 21/0338* (2013.01); *H01L 21/3086* (2013.01); *H01L 21/3088* (2013.01); *H01L 21/31144* (2013.01)

(58) Field of Classification Search

USPC .......... 438/675, 702, 712, 717; 257/E21.231, 257/E21.585

See application file for complete search history.

(56) References Cited

U.S. PATENT DOCUMENTS

| | | | |
|---|---|---|---|
| 7,569,477 B2 | 8/2009 | Park | |
| 2007/0148983 A1* | 6/2007 | Lee et al. | 438/717 |

(Continued)

FOREIGN PATENT DOCUMENTS

| | | |
|---|---|---|
| KR | 100771891 B1 | 10/2007 |
| KR | 10-0780652 B1 | 11/2007 |

(Continued)

*Primary Examiner* — Charles Garber
*Assistant Examiner* — Abdulfattah Mustapha
(74) *Attorney, Agent, or Firm* — Myers Bigel Sibley & Sajovec, P.A

(57) ABSTRACT

A lower layer of a microelectronic device may be patterned by forming a first sacrificial layer on the lower layer; patterning a plurality of spaced apart trenches in the first sacrificial layer; forming a second sacrificial layer in the plurality of spaced apart trenches; patterning the second sacrificial layer in the plurality of spaced apart trenches to define upper openings in the plurality of spaced apart trenches; and patterning the lower layer using the first and second sacrificial layers as a mask to form lower openings in the lower layer.

45 Claims, 43 Drawing Sheets

(51) Int. Cl.
  *H01L 27/102* (2006.01)
  *H01L 27/115* (2006.01)
  *H01L 27/24* (2006.01)
  *H01L 45/00* (2006.01)

(56) References Cited

U.S. PATENT DOCUMENTS

| | | | |
|---|---|---|---|
| 2007/0207620 A1* | 9/2007 | Doebler | 438/712 |
| 2008/0029811 A1* | 2/2008 | Yun et al. | 257/330 |
| 2008/0057733 A1* | 3/2008 | Chung et al. | 438/760 |
| 2008/0160774 A1 | 7/2008 | Kim et al. | |
| 2008/0244504 A1* | 10/2008 | Drapeau et al. | 716/20 |
| 2009/0258318 A1* | 10/2009 | Chan | 430/312 |
| 2010/0173497 A1* | 7/2010 | Chang et al. | 438/703 |
| 2010/0221919 A1* | 9/2010 | Lee et al. | 438/694 |

FOREIGN PATENT DOCUMENTS

| | | |
|---|---|---|
| KR | 10-0913004 B1 | 3/2008 |
| KR | 10-0850216 B1 | 7/2008 |
| KR | 10-0932334 B1 | 12/2009 |

* cited by examiner

METHODS FOR PATTERNING MICROELECTRONIC DEVICES USING TWO SACRIFICIAL LAYERS

CROSS REFERENCE TO RELATED APPLICATION

This application claims the benefit under 35 USC §119 of Korean Patent Application No. 10-2010-0078474, filed on Aug. 13, 2010, the disclosure of which is hereby incorporated herein by reference in its entirety as if set forth fully herein.

BACKGROUND

Various embodiments described herein relate to methods for manufacturing microelectronic devices, and more particularly, to methods for forming fine patterns in microelectronic devices such as memory devices.

Microelectronic devices can include fine patterns therein to form highly integrated circuits (IC). Patterns in a microelectronic device may be formed by forming a photoresist pattern on a target layer and etching the target layer using the photoresist pattern as an etch mask.

As the design rules of microelectronic devices decrease sharply and the integration density continues to increase, the aspect ratio of a photoresist pattern may increase, so that collapse of photoresist patterns may occur. In order to allow interconnection lines to have a fine linewidth while reducing or preventing the collapse of the photoresist patterns, the thickness of the photoresist patterns may be decreased. However, as the photoresist patterns become thinner, the photoresist patterns may not function well as a mask to form fine patterns having a high aspect ratio. Even the use of hard masks have not eliminated this problem.

SUMMARY

A lower layer of a microelectronic device may be patterned according to various methods described herein by forming a first sacrificial layer on the lower layer; patterning a plurality of spaced apart trenches in the first sacrificial layer; forming a second sacrificial layer in the plurality of spaced apart trenches; patterning the second sacrificial layer in the plurality of spaced apart trenches to define upper openings in the plurality of spaced apart trenches; and patterning the lower layer using the first and second sacrificial layers as a mask to form lower openings in the lower layer.

In some embodiments, the plurality of spaced apart trenches and the upper openings extend along a same direction so that the lower openings define a series of trenches in the lower layer. In other embodiments, the plurality of spaced apart trenches in the first sacrificial layer extend along a first direction and the second sacrificial layer is patterned along a second direction that is different from the first direction so that the lower openings define an array of holes in the lower layer. Moreover, in some embodiments, the second sacrificial layer includes wide and narrow portions so that the lower openings define a series of trenches in the lower layer that have wide and narrow portions. In other embodiments, the first sacrificial layer also includes wide and narrow portions and wherein the wide portions of the first sacrificial layer are offset from the wide portions of the second sacrificial layer.

In some embodiments, the first and second sacrificial layers comprise different materials that both include at least 50% carbon by weight. In other embodiments, the first sacrificial layer comprises an amorphous carbon layer. In other embodiments, the second sacrificial layer comprises a spin-on hard mask that comprises at least 80% carbon by weight.

In still other embodiments, patterning a plurality of spaced apart trenches in the first sacrificial layer may be performed by sequentially forming a hard mask, an anti-reflective coating and a patterned photoresist layer including therein the plurality of spaced apart trenches, on the first sacrificial layer; patterning the anti-reflective coating and the hard mask using the patterned photoresist layer as a mask; and etching partially into the first sacrificial layer using the hard mask as an etch mask to form the plurality of spaced apart trenches in the first sacrificial layer while simultaneously removing the patterned photoresist layer and the anti-reflective coating. Moreover, the second sacrificial layer may be formed in the plurality of trenches by spinning a spin-on hard mask on the hard mask and into the plurality of spaced apart trenches in the first sacrificial layer; and etching back the spin-on hard mask to expose the hard mask. In still other embodiments, patterning the second sacrificial layer in the plurality of trenches to define upper openings in the trenches comprises sequentially forming a second hard mask, a second anti-reflective coating and a second patterned photoresist layer on the second sacrificial layer and on the first hard mask; patterning the second anti-reflective coating and the second hard mask using the second patterned photoresist layer as a mask; and etching partially into the second sacrificial layer using the second hard mask as an etch mask to define the upper openings in the trenches while simultaneously removing the second patterned photoresist layer and the second anti-reflective coating.

In still other embodiments, forming a first sacrificial layer is preceded by forming word lines and bit lines crossing the word lines in the lower layer, and patterning a plurality of spaced apart trenches in the first sacrificial layer comprises patterning the plurality of spaced apart trenches to cross the word lines or bit lines.

Moreover, in some embodiments, the lower layer comprises a cell region including the word lines and the bit lines, and a peripheral circuit region disposed at the periphery of the cell region. In these embodiments, the forming of the first sacrificial layer comprises forming a first sacrificial layer comprising an amorphous carbon layer on the lower layer of the cell region and of the peripheral circuit region, using CVD. Moreover, patterning a plurality of spaced apart trenches in the first sacrificial layer comprises forming a first mask pattern covering the first sacrificial layer in the peripheral circuit region, and selectively exposing portions of the first sacrificial layer in the cell region; and patterning the first sacrificial layer in the cell region using the first mask pattern.

Still other embodiments provide other methods of patterning a lower layer of a microelectronic device. These methods comprise forming a first sacrificial layer on the lower layer; forming a first hard mask on the first sacrificial layer; patterning the first hard mask to form a plurality of spaced apart first lines extending along a first direction; forming a second sacrificial layer on the plurality of spaced apart first lines and on the first sacrificial layer therebetween; and etching back the second sacrificial layer to expose the plurality of spaced apart first lines. These methods further comprise forming a second hard mask on the second sacrificial layer and on the plurality of spaced apart first lines; patterning the second hard mask to form a plurality of spaced apart second lines extending in a second direction that is different than the first direction, the plurality of spaced apart first and second lines defining an array of mask openings therebetween; etching the second and first sacrificial layers using the plurality of spaced apart first and second lines as a mask to replicate the array of mask openings into an array of openings in the first sacrificial layer; and etching the lower layer through the array of openings in the first sacrificial layer to replicate the array of openings in the first sacrificial layer as an array of lower openings in the lower layer.

Yet other methods of patterning a lower layer of a microelectronic device may be provided. These methods comprise forming a first sacrificial layer and first mask patterns, on the lower layer; forming trenches in the first sacrificial layer by patterning the first sacrificial layer using the first mask patterns as an etch mask; and forming a second sacrificial layer in the trenches and on the first mask patterns. These methods further comprise retaining at least some of the second sacrificial layer in the trenches by etching the second sacrificial layer to expose the first mask patterns; forming second mask patterns on the first mask patterns, the second mask patterns crossing the trenches; forming second sacrificial layer patterns defining upper openings in the trenches by patterning the second sacrificial layer using the second mask patterns as an etch mask; and patterning the lower layer using the first and second sacrificial layer patterns as a mask to form lower openings in the lower layer.

BRIEF DESCRIPTION OF THE FIGURES

The accompanying drawings are included to provide a further understanding of the inventive concept, and are incorporated in and constitute a part of this specification. The drawings illustrate various embodiments of the inventive concept and, together with the description, serve to explain principles of the inventive concept. In the drawings.

DETAILED DESCRIPTION

Figure 1:
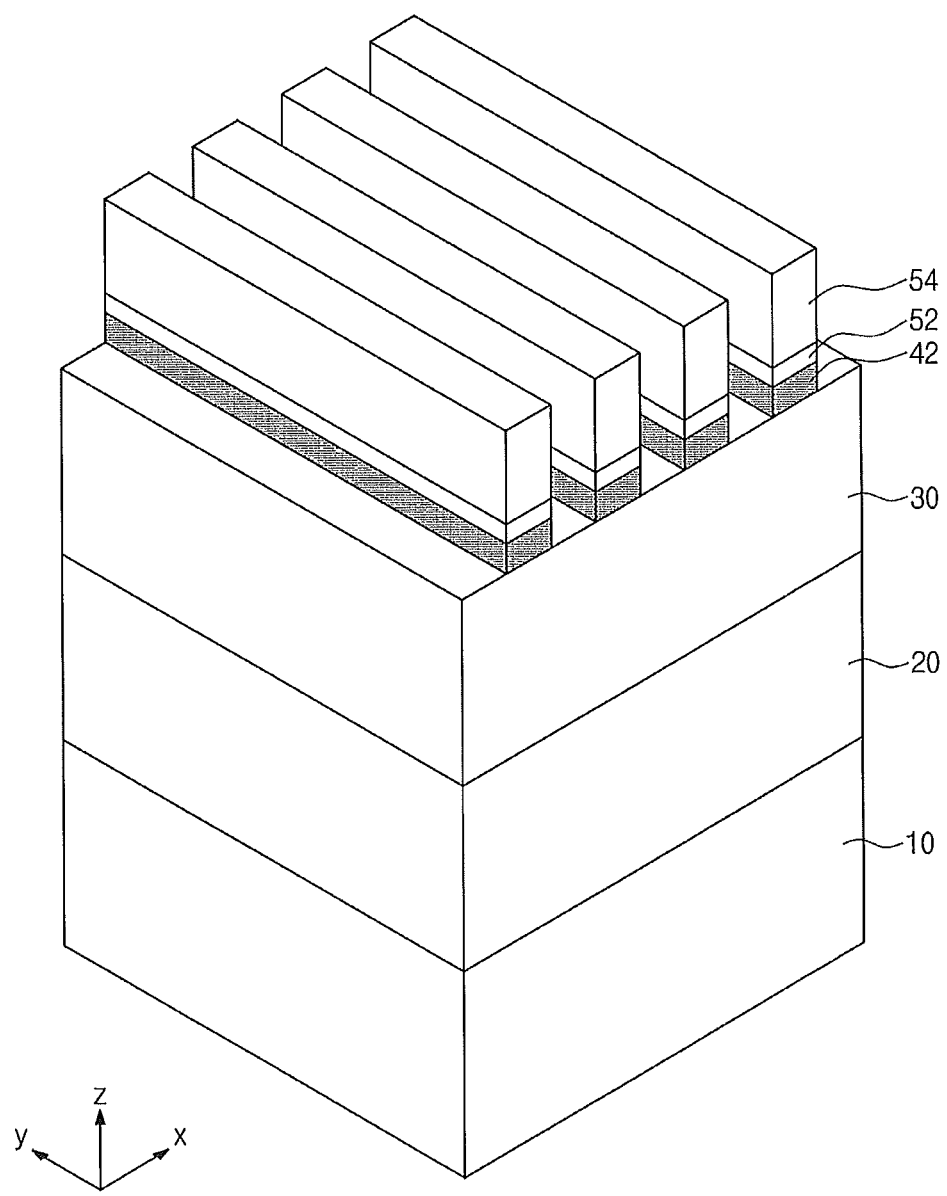
FIGS. 1 through 9 are perspective views illustrating a sequence of a method for forming fine patterns according to first embodiments of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scope of claims. Like reference numerals refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it can be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it can be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms may be used herein to describe one element's relationship to another element as illustrated in the Figures. These relative terms generally relate to an element's position relative to a substrate, when the substrate is at the bottom of a drawing. However, it will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below", "beneath" or "under" other elements would then be oriented "above" or "over" the other elements. The exemplary terms "below", "beneath", "under" "above" and "over" can, therefore, encompass both an orientation of above and below. Also, the terms "horizontal" and "vertical," and the terms "x", "y" and "z" are used herein to describe generally orthogonal directions and do not imply a specific orientation.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

According to various embodiments of the inventive concept, a mask structure for etching a lower layer (i.e., an etching target layer) may be formed on the lower layer. The mask structure may be formed using two sacrificial layers. By using the mask structure, fine patterns may be formed in the lower layer.

First Embodiments

A method for forming fine patterns according to first embodiments of the inventive concept will now be described in detail with reference to FIGS. 1 through 9. FIGS. 1 through 9 are perspective views illustrating a sequence of a method for forming fine patterns according to first embodiments of the inventive concept.

Referring to FIG. 1, lower layer 20 and a first sacrificial layer 30 may be sequentially stacked on a substrate 10.

The lower layer 20 may comprise a semiconductor material, a conductive material, and/or an insulating material. For example, in the case where the lower layer 20 comprises a semiconductor material, the lower layer 20 may be a portion of, or all of the substrate 10 or an epitaxial layer. As another example, in the case where the lower layer 20 comprises a conductive material, the lower layer 20 may be formed of doped polysilicon, metal silicide, metal and/or metal nitride. As a final example, in the case where the lower layer 20 comprises an insulating material, the lower layer 20 may be formed of a high density plasma (HDP) oxide layer, TetraEthylOrthoSilicate (TEOS), Plasma Enhanced TetraEthylOrthoSilicate (PE-TEOS), $O_3$-TEOS, Undoped Silicate Glass (USG), PhosphoSilicate Glass (PSG), BoroSilicate Glass (BSG), BoroPhosphoSilicate Glass (BPSG), Fluoride Silicate Glass (FSG), Spin On Glass (SOG) and/or Tonen SilaZene (TOSZ). Also, the lower layer 20 may comprise silicon nitride, silicon oxynitride and/or low-k material.

Further, the lower layer 20 may comprise a single layer or multi-layer comprised of a plurality of stacked layers. Moreover, the lower layer 20 may include a plurality of stacked insulating layers, and a conductive layer or semiconductor layer disposed between the stacked insulating layers. Also, the lower layer 20 may include a semiconductor pattern, a conductive pattern and/or an insulating pattern.

The first sacrificial layer 30 may be formed of a material having an etch selectivity with respect to the lower layer 20 during a process of etching the lower layer 20. In detail, the first sacrificial layer 30 may be formed of a material having carbon as a main component, i.e., at least 50 wt % carbon. For example, the first sacrificial layer 30 may be formed of a material having a relatively high carbon content of about 80 to 99 wt % based on the total weight of a compound constituting the first sacrificial layer 30. Also, the first sacrificial layer 30 may be deposited on the lower layer 20 by using a chemical vapor deposition (CVD) process, and may have a thickness ranging from about 1,000 Å to about 10,000 Å. In some embodiments, the first sacrificial layer 30 may be an Amorphous Carbon Layer (ACL) formed using the CVD process.

Thereafter, the first sacrificial layer 30 is patterned. The patterning of the first sacrificial layer 30 may be performed by using a photoresist pattern formed directly on the first sacrificial layer 30. However, in that case, the photoresist pattern may be consumed together with the first sacrificial layer 30 while the first sacrificial layer 30 is etched, so that it fails to form a trench (or opening) having a desired depth. That is, a difficulty may occur in forming a hole having a high aspect ratio in the first sacrificial layer 30 by using the photoresist pattern.

Accordingly, in the etching of the first sacrificial layer 30 according to embodiments of the inventive concept, the first sacrificial layer 30 may be etched by using first mask patterns 42 which are formed of a material having an etch selectivity of about 10:1 with respect to the first sacrificial layer 30. Therefore, in the etching of the first sacrificial layer 30, the etch rate of the first sacrificial layer 30 may be faster than that of the first mask patterns 42. Accordingly, while the first sacrificial layer 30 is etched by using the first mask patterns 42, the first sacrificial layer 30 having a large thickness may be etched by using relatively thin first mask patterns 42.

In detail, referring to FIG. 1, the first mask patterns 42 used for patterning the first sacrificial layer 30 are formed on the first sacrificial layer 30.

The forming of the first mask patterns 42 includes forming a first mask layer on the first sacrificial layer 30, forming first photoresist patterns 54 on the first mask layer, and etching the first mask layer by using the first photoresist patterns 54. In some embodiments, a first anti-reflective pattern 52 may be formed between the first mask layer and the first photoresist pattern 54.

The first mask layer may be formed of a material having an etch selectivity with respect to the first sacrificial layer 30. For example, the first mask layer may comprise a silicon-containing material group such as SiON, $SiO_2$, $Si_3N_4$, SiCN, polysilicon, and/or the like. Also, the first mask layer may be formed by using a deposition process such as a CVD and/or a spin coating process. The thickness of the first mask layer may be about 0.1 to 0.5 times greater than that of the first sacrificial layer 30. For example, the first mask layer may be deposited to a thickness ranging from about 300 Å to about 600 Å.

The first photoresist patterns 54 may be formed by coating a resist material on the first mask layer to form a first photoresist layer, and performing an exposure and development process with respect to the first photoresist layer. According to some embodiments, a photolithography process for forming a line and space pattern in the first photoresist layer may be performed. Also, in the photolithography process, an exposure process using a Krypton fluoride (KrF) laser, an argon fluoride (ArF) laser, a fluorine ($F_2$) laser and/or extreme ultraviolet (EUV) may be performed. In some embodiments, the first photoresist patterns 54 may have a hole-shaped opening instead of a line-shaped opening.

The first anti-reflective pattern 52 may be formed of a material, which has an etch selectivity with respect to the first mask layer and absorbs light in the exposure process to reduce or prevent light reflection. The first anti-reflective pattern 52 may be formed of an organic compound or an inorganic compound. According to some embodiments, the first anti-reflective pattern 52 may be formed of an organic material having a similar etching characteristic to the photoresist. The forming of the first anti-reflective pattern 52 includes coating a first anti-reflective layer on the first mask layer by using a spin-on coating process, baking the coated first anti-reflective layer to harden the first anti-reflective layer, and etching the first anti-reflective layer by using the first photoresist patterns 54. Thus, by forming the first anti-reflective patterns 52 between the first mask layer and the first photoresist patterns 54, linewidth variation of the first photoresist pattern 54 is by reflection and scattering of light irradiated to the photoresist layer in the photolithography process may be reduced or prevented.

Next, the first mask layer on the first sacrificial layer 30 is etched by using the first photoresist patterns 54 and the first anti-reflective patterns 52. As a result, first mask patterns 42 which are spaced apart by a predetermined space from each other in a line shape and are parallel to one another may be formed on the first sacrificial layer 30. According to some embodiments, the space between the first mask patterns 42 may be greater than the width of the first mask pattern 42. According to other embodiments, the space between the first mask patterns 42 may be about twice the width of the first mask pattern 42 or less.

Figure 2:
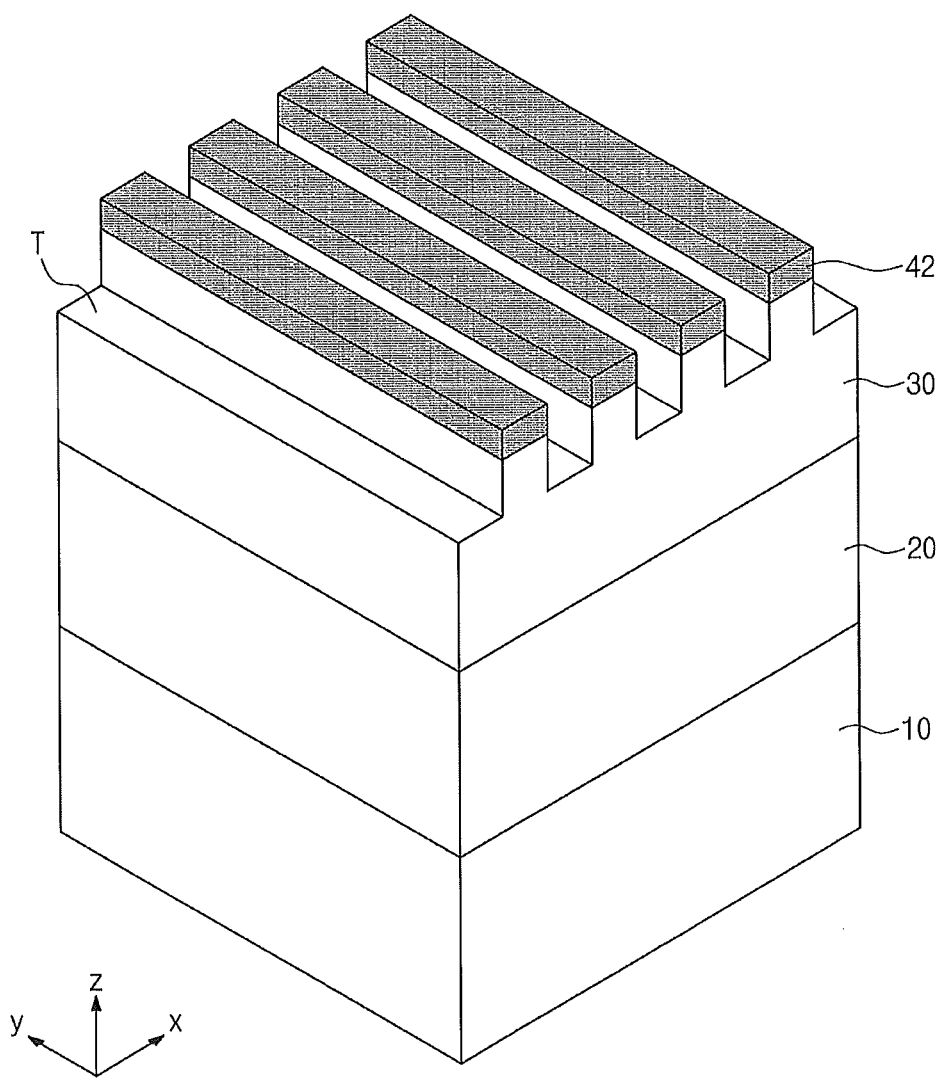

Referring to FIG. 2, trenches T are formed in the first sacrificial layer 30 by using the first mask patterns 42.

The forming of the trenches T includes etching some portions of the first sacrificial layer 30 by using the first mask patterns 42 as an etch mask. The etching of the first sacrificial layer 30 for forming the trenches T may be performed by using an anisotropic etching process, such as an etch back process. At this time, the first sacrificial layer 30 may be etched by using a fluorine-based etching gas. In detail, the anisotropic etching of the first sacrificial layer 30 may be performed by using a mixing gas of a fluorine-based etching gas and $O_2$, and/or a mixing gas of a fluorine-based etching gas, $O_2$ and Ar. Herein, the fluorine-based etching gas may be $C_2F_6$, $C_4F_6$, $C_4F_8$, or $C_5F_8$. Also, $O_2$ gas supplied together with the fluorine-based etching gas may remove a polymer byproduct generated during the etching process, and Ar gas functioning as a carrier gas causes ions to collide with each other. Further, a dry etching process of the first sacrificial layer 30 may be performed under a voltage condition of about 50 V to 200 V, a temperature condition equal to or less than about 60° C., and a flow condition equal to or less than 2,000 sccm. According to some embodiments, the dry etching process of the first sacrificial layer 30 may be performed in a plasma atmosphere by generating plasma of the etching gas. For example, a dry plasma etching process may be performed by using an inductively coupled plasma (ICP)-type plasma etching apparatus and/or a dual frequency capacitively coupled plasma (CCP)-type plasma etching apparatus.

As the trenches T are formed in the first sacrificial layer 30, a top surface of the first sacrificial layer 30 exposed by the first mask patterns 42 may be recessed. In some embodiments, the trenches may have a line shape. The width of the trench T may be greater than that of the first mask pattern 42. For example, the width of the trench T may be more than two times greater than that of the first mask pattern 42. The length of the trench T may be equal to or greater than that of the first mask pattern 42, and may be, for example, in a range of about 200 Å to about 300 Å.

Thus, while the trenches T are formed in the first sacrificial layer 30, the first photoresist patterns 54 and the first anti-reflective patterns 52 on the first mask patterns 42 may be removed.

In other embodiments, trenches T need not be formed in a top surface of the first sacrificial layer 30. Rather, the first photoresist patterns 54 and the first anti-reflective patters 52 may be removed from the first mask patterns 42 without etching the top surface of the first sacrificial layer 30. Thus, a partial etch of the first sacrificial layer as illustrated in FIG. 2 need not be performed according to some embodiments.

Figure 3:
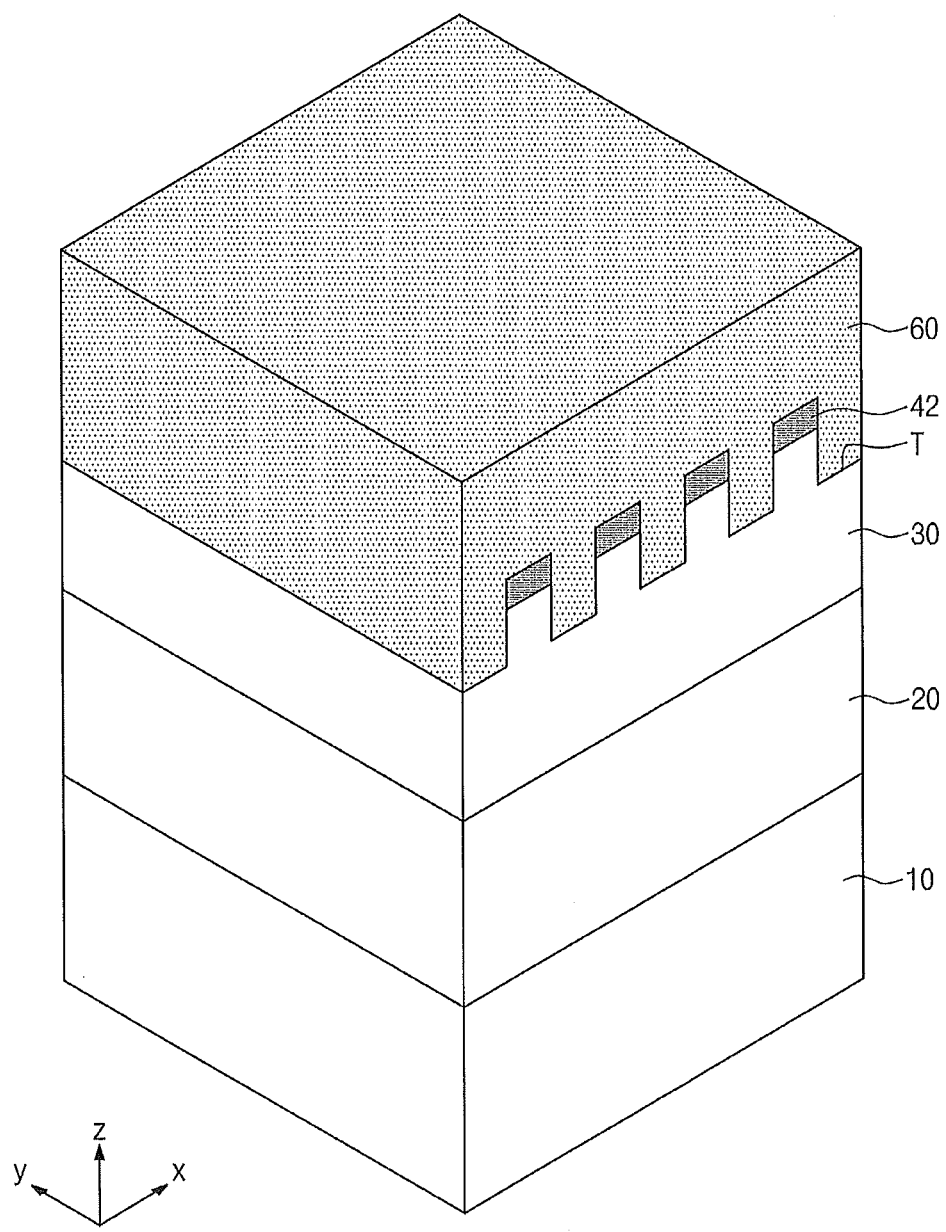

Referring to FIG. 3, a coating layer 60 filling the trenches T formed in the first sacrificial layer 30 is formed.

The coating layer 60 may be formed by using a spin-on coating process, and may be formed of a material having an etch selectivity with respect to the lower layer 20 and the first mask patterns 42 during the etching of the first mask patterns 42. In detail, the coating layer 60 may be formed of a material containing carbon as a main component, i.e., having a carbon content of at least 50 wt %. According to an embodiment, the coating layer 60 may be formed of a material having a relatively high carbon content of about 80 to 99 wt % based on the total weight of a compound constituting the coating layer 60. Various materials may be used for coating layer 60. For example, SOG (Spin On Glass), ARC (Anti-Reflecting Coating layer), photo resist, and carbon mask layer may be used.

Since the coating layer 60 may fill the trenches T formed in the first sacrificial layer 30 and is formed by the spin-on coating process, the roughness of a top surface of the coating layer may be low. That is, the coating layer 60 may have a substantially flat top surface while filling the trenches T of the first sacrificial layer 30. For this purpose, the coating layer 60 may be coated to a thickness greater than the depth of the trench T defined in the first sacrificial layer 30. For example, the coating layer 60 on the first mask patterns 42 may have a thickness ranging from about 800 Å to about 1,000 Å.

According to some embodiments, the coating layer 60 may be formed by coating the coating layer 60 on the first mask patterns 42 to a thickness ranging from about 800 Å to about 1,000 Å and baking the coating layer 60 for about 30 seconds to about 300 seconds under a temperature condition of about 100° C. to about 500° C. At this time, the baking may be performed more than one time under temperature conditions different from each other.

Thus, as the coating layer 60 is formed on the first sacrificial layer 30 having the trenches T by using the spin-on coating process, the coating layer 60 having the flat top surface may be formed without being influenced by the profile of the first sacrificial layer 30 having the trenches T.

In other embodiments, where trenches T are not formed in the first sacrificial layer 30, the coating layer 60 may only fill the spaces between the first mask pattern 42. The coating layer may be formed at the same thicknesses described above, so as to fill the spaces between the first mask patterns 42 and to cover the mask patterns 42 while providing a flat outer surface.

Figure 4:
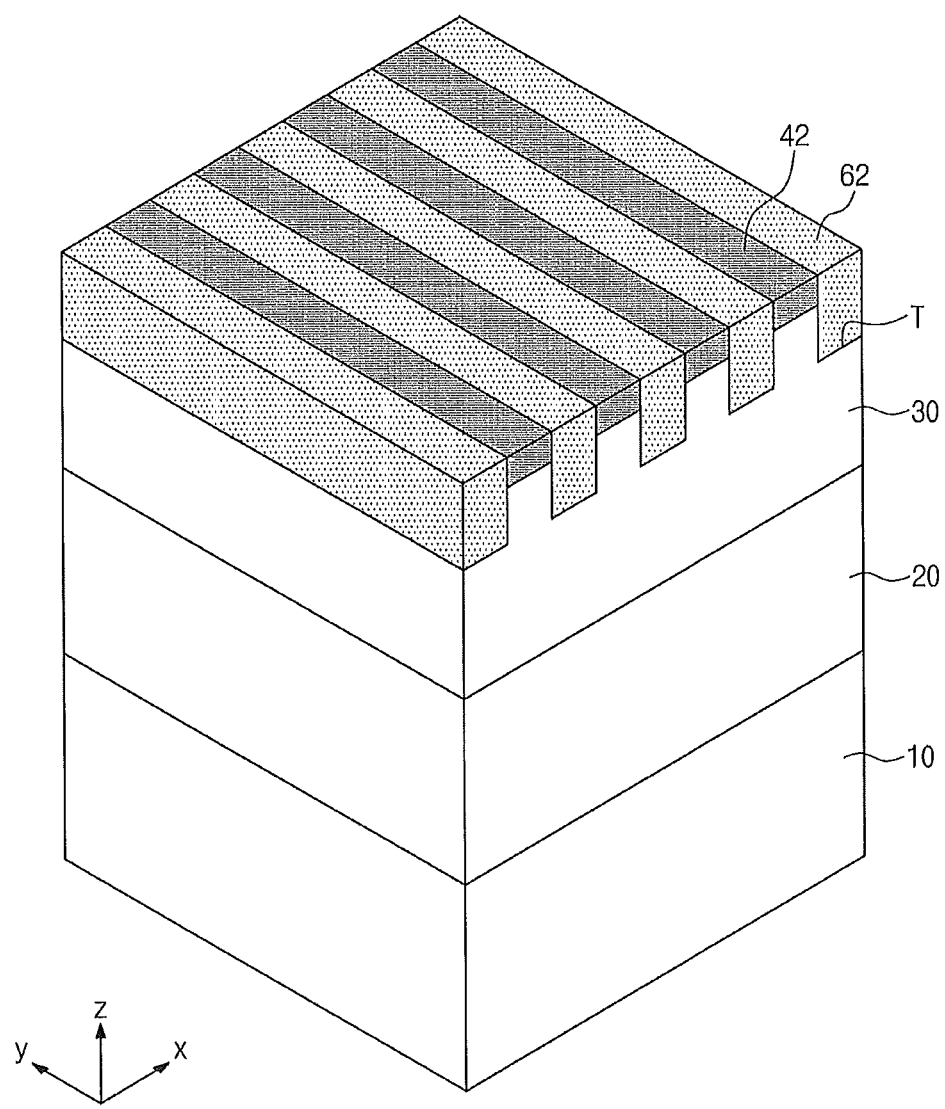

Referring to FIG. 4, the coating layer 60 is etched to form a second sacrificial layer 62 in the trenches T.

The second sacrificial layer 62 may be formed by performing an anisotropic etching process on the coating layer 60 until the top surfaces of the first mask patterns 42 are exposed. While the coating layer 60 is anisotropically etched, the coating layer 60 may have an etch selectivity more than about 10:1 with respect to the first mask pattern 42. That is, while the coating layer 60 is anisotropically etched, the first mask patterns 42 may be used as an etch stop layer.

According to some embodiments, the top surface of the second sacrificial layer 60 may be positioned substantially at the same level as the top surfaces of the first mask patterns 42. Therefore, after the second sacrificial layer 62 is formed, the height of the mask structure on the lower layer 20 may be uniform. According to other embodiments, while the second sacrificial layer 62 is etched, the top surface of the first mask pattern 42 may be recessed. In this case, the top surfaces of the first mask patterns 42 may be positioned at a lower level than the top surface of the second sacrificial layer 62. The top surface of the second sacrificial layer 62 may be positioned between the top surface of the first mask pattern 42 and the top surface of the first sacrificial layer 30.

The second sacrificial layers 62 formed in the trenches T may have a line shape and may be parallel to one another. When viewed from the top, the second sacrificial layers 62 may be disposed between the first mask patterns 42. In some embodiments, both sidewalls of the second sacrificial layer 62 may directly contact inner walls of the trench T. That is, the width of the second sacrificial layer 62 may be substantially the same as the width of the trench T. Also, the thickness of the second sacrificial layer 62 may be greater than the depth of the trench T of the first sacrificial layer 30.

According to other embodiments, trenches T are not formed in the first sacrificial layer, so that during planarization, the second sacrificial layer pattern 62 may only be formed between the first mask patterns 42. As discussed above, the height of the mask structure on the lower layer 20 may be uniform, or the top surface of the first mask pattern 42 may be recessed.

Figure 5:
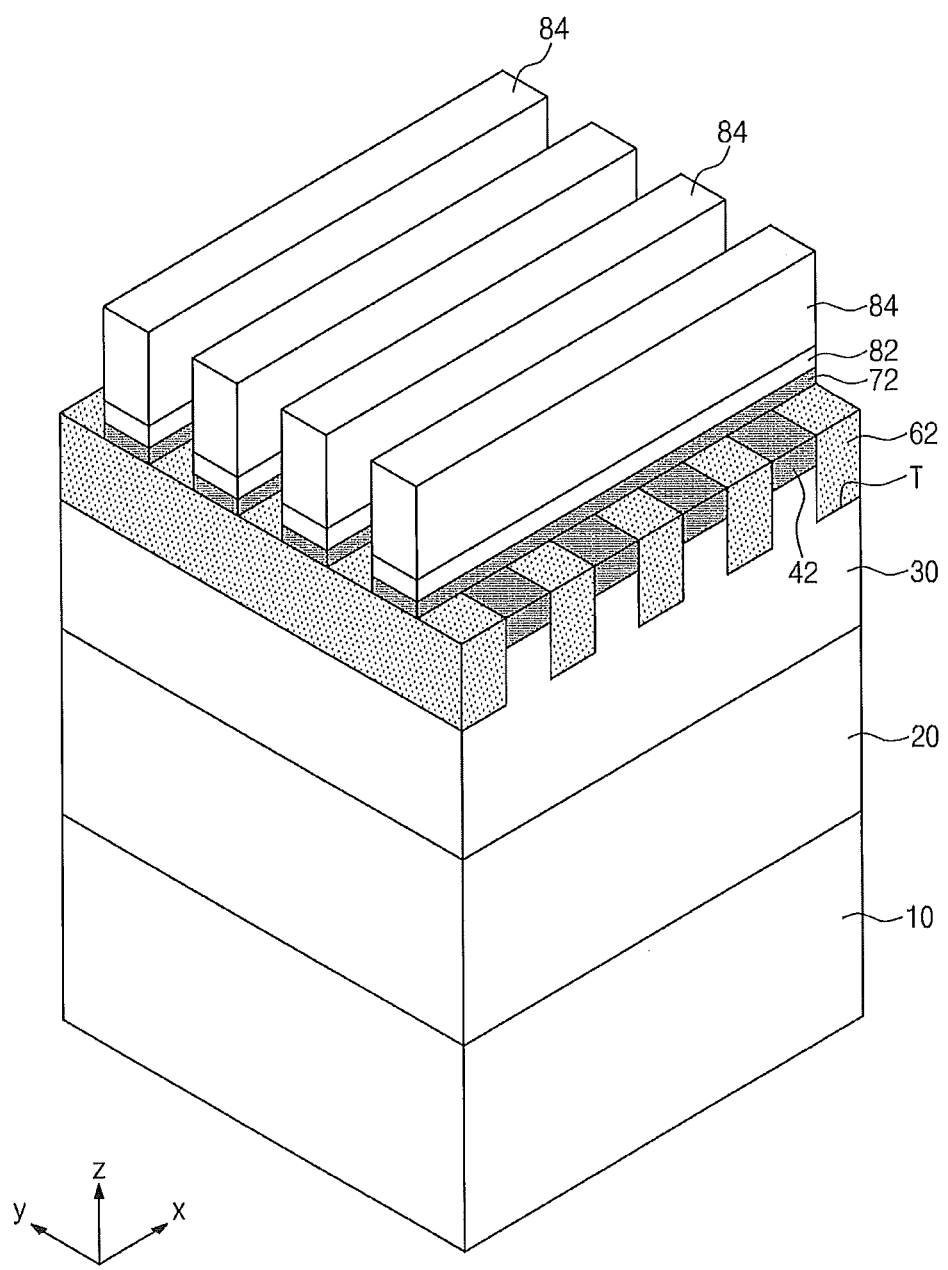

Next, referring to FIG. 5, second mask patterns 72 used for patterning the second sacrificial layer 62 are formed.

In detail, as illustrated in FIG. 5, a second mask layer covering the first mask patterns 42 and the second sacrificial layer 62 is formed. Also, second photoresist patterns 84 may be formed on the second mask layer, and a second anti-reflective pattern 82 may be formed between the second mask layer and the second photoresist pattern 84.

In detail, the second mask layer may be formed by using a deposition process such as a CVD, and may be formed of a material having an etch selectivity with respect to the first and second sacrificial layers 30 and 62 during the etching of the first and second sacrificial layers 30 and 62. For example, the second mask layer may comprise a silicon-containing material group including SiON, $SiO_2$, $Si_3N_4$, SiCN, polysilicon and/or the like.

According to some embodiments, the second mask layer may be formed of the same material as the first mask pattern 42. In other embodiments, the second mask layer may be formed of a material having an etch selectivity with respect to the first mask pattern 42 during the etching of the second mask layer.

The thickness of the second mask layer may be about 0.1 to about 0.5 than that of the first sacrificial layer 30. The thickness of the second mask layer may be equal to or less than that of the first mask pattern 42. For example, the second mask layer may be deposited on the first sacrificial layer 30 to a thickness ranging from about 200 Å to about 400 Å by using a CVD process.

In some embodiments, the second photoresist patterns 84 may be line-shaped patterns crossing the first mask patterns 42 at an oblique or orthogonal angle. The pitch of the second photoresist pattern 84 may be equal to that of the first photoresist pattern 54. The second photoresist patterns 84 may be formed by coating a resist material on the second mask layer to form a second photoresist layer, and performing an exposure and development process on the second photoresist layer. For example, the second photoresist pattern 84 may be formed through an exposure process using a Krypton fluoride (KrF) laser, an argon fluoride (ArF) laser, a fluorine ($F_2$) laser and/or extreme ultraviolet (M).

The second anti-reflective pattern 82 may be formed of a material, which has an etch selectivity with respect to the second mask layer and absorbs light in the exposure process for forming the second photoresist patterns 84 to reduce or prevent light reflection. The second anti-reflective pattern 82 may be formed of an organic compound and/or an inorganic compound. According to some embodiments, the second anti-reflective pattern 82 may be formed of an organic material having a similar etching characteristic to the photoresist. The forming of the second anti-reflective pattern 82 includes coating a second anti-reflective layer on the second mask layer by using a spin-on coating process, baking the coated second anti-reflective layer to harden the second anti-reflective layer, and etching the second anti-reflective layer by using the second photoresist patterns 84. Thus, by forming the second anti-reflective patterns 82 between the second mask layer and the second photoresist patterns 84, linewidth variation of the second photoresist pattern 84 is varied by reflection and scattering of light irradiated to the photoresist layer in the photolithography process may be reduced or prevented.

Next, the second mask patterns 72 are formed by using the second photoresist patterns 84 and the second anti-reflective patterns 82. The second mask patterns 72 may be formed by anisotropically etching the second mask layer until the second sacrificial layer 72 is exposed.

The second mask patterns 72 may cross the first mask patterns 42 and the second sacrificial layers 62 at an oblique or orthogonal angle. That is, the first and second mask patterns 42 and 72 may have a lattice shape, when viewed from the top. The second mask patterns 72 may directly contact some portion of the first mask pattern 42 and some portion of the second sacrificial layer 62.

The second mask patterns 72 formed thus may be formed crossing the trenches T defined in the first sacrificial layer 30, and the second sacrificial layers 62, and may be spaced apart by a predetermined space from one another. The space between the second mask patterns 72 may be greater than or equal to the width of the second mask patterns 72. For example, the space between the second mask patterns 72 may be twice the width of the second mask patterns or less. Also, the width of the second mask patterns 72 may be the width of a minimum pitch that may be realized by the photolithography process. The pitch of the second mask patterns 72 may be substantially the same as that of the first mask patterns 42. Additionally, the width of the second mask patterns 72 may be substantially the same as that of the first mask patterns 42.

In other embodiments, when the second mask patterns 72 are formed, the thickness of the first mask patterns 42 may be decreased due to over etch in the case where the second mask patterns 72 are made of the same material as the first mask patterns 42. At this time, since the thickness of the first mask patterns 42 is greater than that of the second mask patterns 72, the first mask patterns 42 may be left on the first sacrificial layer 30 between the second mask patterns 72.

In other embodiments, in the case where the thickness of the second mask patterns 72 is substantially the same as that of the first mask patterns 42 and the second mask patterns 72 are made of a material having an etch selectivity with respect to the first mask patterns 42, the first mask patterns 42 may be left on the first sacrificial layer 30 between the second mask patterns 72. That is, the first sacrificial layer 30 is not exposed by the second mask patterns 72.

Meanwhile, the second photoresist patterns 84 and the second anti-reflective patterns 82 may be removed during the etching of the second mask patterns 72 and the subsequent etching of the second sacrificial layers 62.

In other embodiments, the second mask patterns 72 may be formed on the first mask patterns 42 and on the second sacrificial layers 62, even though the second sacrificial layers 62 do not extend into the first sacrificial layer 30, i.e., even though no trenches T are formed in the first sacrificial layer 30.

Figure 6:
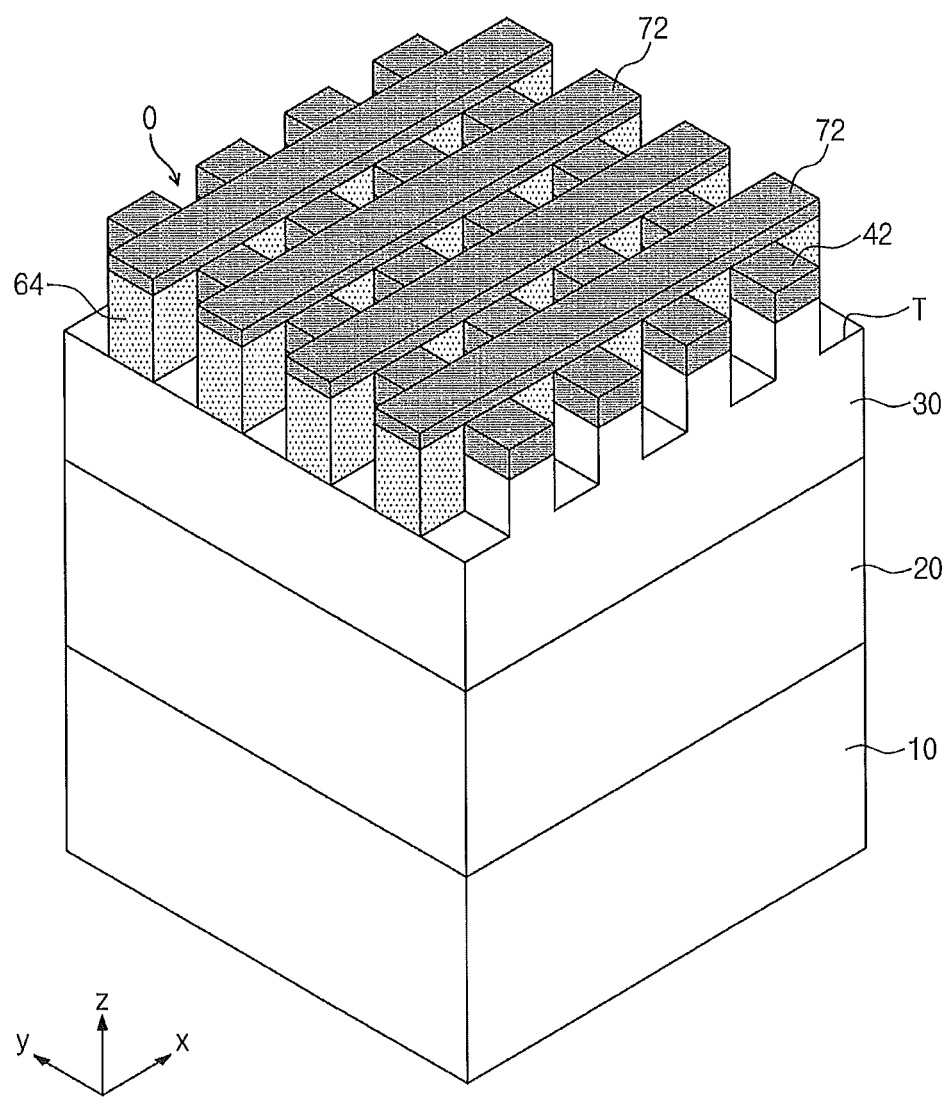
Figure 7:
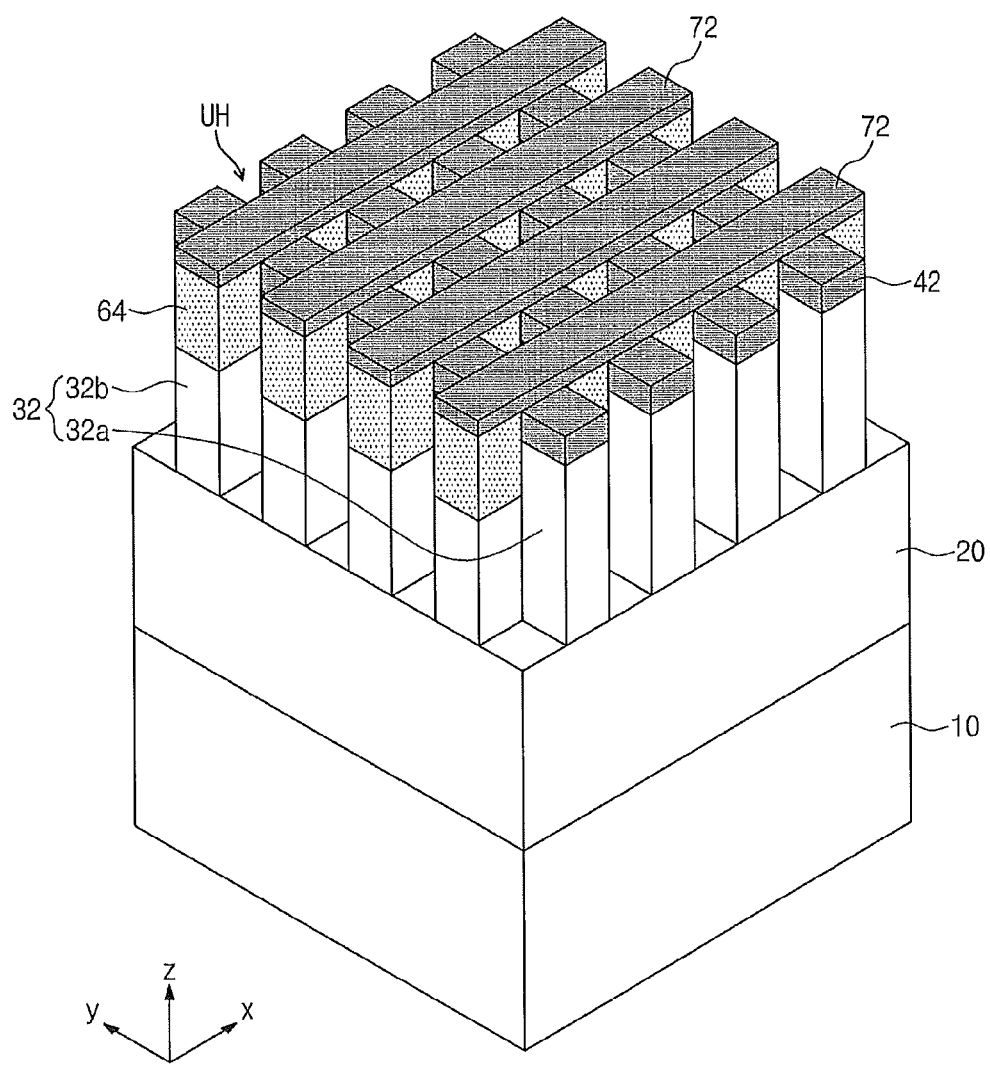

Referring to FIGS. 6 and 7, the first and second sacrificial layers 30 and 62 are etched by using the first and second mask patterns 42 and 72.

In more detail, as illustrated in FIG. 6, the second sacrificial layer 62 may be selectively anisotropically etched by using the first and second mask patterns 42 and 72 to form second sacrificial patterns 64. Concretely, the etching of the second sacrificial layer 62 may be performed by an anisotropic etching such as an etch back process. At this time, the second sacrificial layer 62 containing carbon as a main component may be etched by using a fluorine-based etching gas. In detail, during the anisotropic etching of the second sacrificial layer 62, a mixing gas of a fluorine-based etching gas and $O_2$ and/or a mixing gas of a fluorine-based etching gas, $O_2$ and Ar may be used. Herein, the fluorine-based etching gas may comprise $C_2F_6$, $C_4F_6$, $C_4F_8$, and/or $C_5F_8$. Also, $O_2$ gas supplied together with the fluorine-based etching gas may remove a polymer byproduct generated during the etching process, and Ar gas functioning as a carrier gas causes ions to collide with each other. Further, a dry etching process of the second sacrificial layer 62 may be performed under a DC voltage condition of about 50 V to 200 V, a temperature condition equal to or less than about 60° C., and a flow condition equal to or less than 2,000 sccm. Additionally, according to an embodiment, the dry etching process of the second sacrificial layer 60 may be performed in a plasma atmosphere by generating plasma of the etching gas. For example, a dry plasma etching process may be performed by using an inductively coupled plasma (ICP)-type plasma etching apparatus or a dual frequency capacitively coupled plasma (CCP)-type plasma etching apparatus.

Thus, as predetermined regions of the second sacrificial layer 60 exposed by the first and second mask patterns 42 and 72 are etched, the plurality of second sacrificial patterns 64 may be locally formed in each of the trenches T. That is, the second sacrificial patterns 64 may be locally formed in the trench T. Additionally, the space between the second sacrificial patterns 64 in the trench T may be substantially the same as that between the first mask patterns 42. Further, the second sacrificial patterns 64 disposed under the second mask pattern 72 may be spaced apart from each other by the first sacrificial layer 30. Also, one pair of both sidewalls of the second sacrificial patterns 64 under the second mask patterns 72 may directly contact the first sacrificial layer 30. In other words, the space between the second sacrificial patterns 64 under the second mask patterns 72 may be substantially the same as the width of the first mask patterns 42.

Thus, as the second sacrificial patterns 64 are formed, openings O exposing the first sacrificial layer 30 may be defined between the second sacrificial patterns 64. That is, openings O exposing the first sacrificial layer 30 may be formed in a region exposed by the first and second mask patterns 42 and 72. The plane area of the region exposed by the opening O may be varied depending on the space between the first mask patterns 42 and the space between the second mask patterns 72. The space between the openings O may be varied depending on the width of the first mask patterns 42 and the width of the second mask patterns 72.

In other embodiments, where trenches T are not formed in the first sacrificial layer 30, the predetermined regions of the second sacrificial layer 60 exposed by the first and second mask patterns 42 and 72 are etched to locally form the plurality of second sacrificial patterns 64 beneath the second mask patterns 72 and between the first mask patterns 42.

Next, referring to FIG. 7, the first sacrificial layer 30 is patterned by using the first and second mask patterns 42 and 72 and the second sacrificial patterns 64. As a result, first sacrificial patterns 32 may be formed on the lower layer 20.

In detail, the first sacrificial patterns 32 may be formed by anisotropically etching the first sacrificial layer 30 using the first and second mask patterns 42 and 72. According to some embodiments, the first sacrificial patterns 32 may be formed by continuously performing the etching process of forming the second sacrificial patterns 64 until the lower layer 20 is exposed. Therefore, upper holes UH exposing the lower layer 20 may be formed under the openings O defined by the second sacrificial patterns 64.

Thus, in the etching of forming the first and second sacrificial patterns 32 and 64, the first and second mask patterns 42 and 72 may have an etch selectivity more than about 10:1 with respect to the first and second sacrificial patterns 32 and 64. Therefore, holes having a fine width while maintaining the thickness of the first sacrificial layer 30 may be formed. That is, the first sacrificial pattern 32 with the upper holes UH having a high aspect ratio may be formed by using the first and second thin mask patterns 42 and 72. Also, since the first and second mask patterns 42 and 72 may have an etch selectivity more than about 10:1 with respect to the first and second sacrificial patterns 32 and 64, it may be reduced or prevented that the upper holes UH adjacent to each other are connected to each other during the forming of the first sacrificial pattern 32 or the lower layer 30 is not exposed by the upper holes UH.

The first sacrificial patterns 32 formed as above include first portions 32a having a line shape, and second portions 32b spaced apart from one another between the first portions 32a. At this time, the height of the first portions 32a on the lower layer 20 may be different from that of the second portions 32b on the lower layer 20. That is, the top surface of the first portion 32a of the first sacrificial pattern 32 may be positioned at a higher level than that of the second portion 32b of the first sacrificial pattern 32. In other words, a height difference exists between the first portion 32a and the second portion 32b. Also, the second sacrificial pattern 64 may be positioned on the second portions 32b of the first sacrificial pattern 32. Herein, the height of the second sacrificial pattern 64 may be greater than the height difference between the first portions 32a and the second portions 32b. Therefore, the top surface of the second sacrificial pattern 64 may be positioned at a higher level than the top surface of the first portion 32a of the first sacrificial pattern 32.

Figure 8:
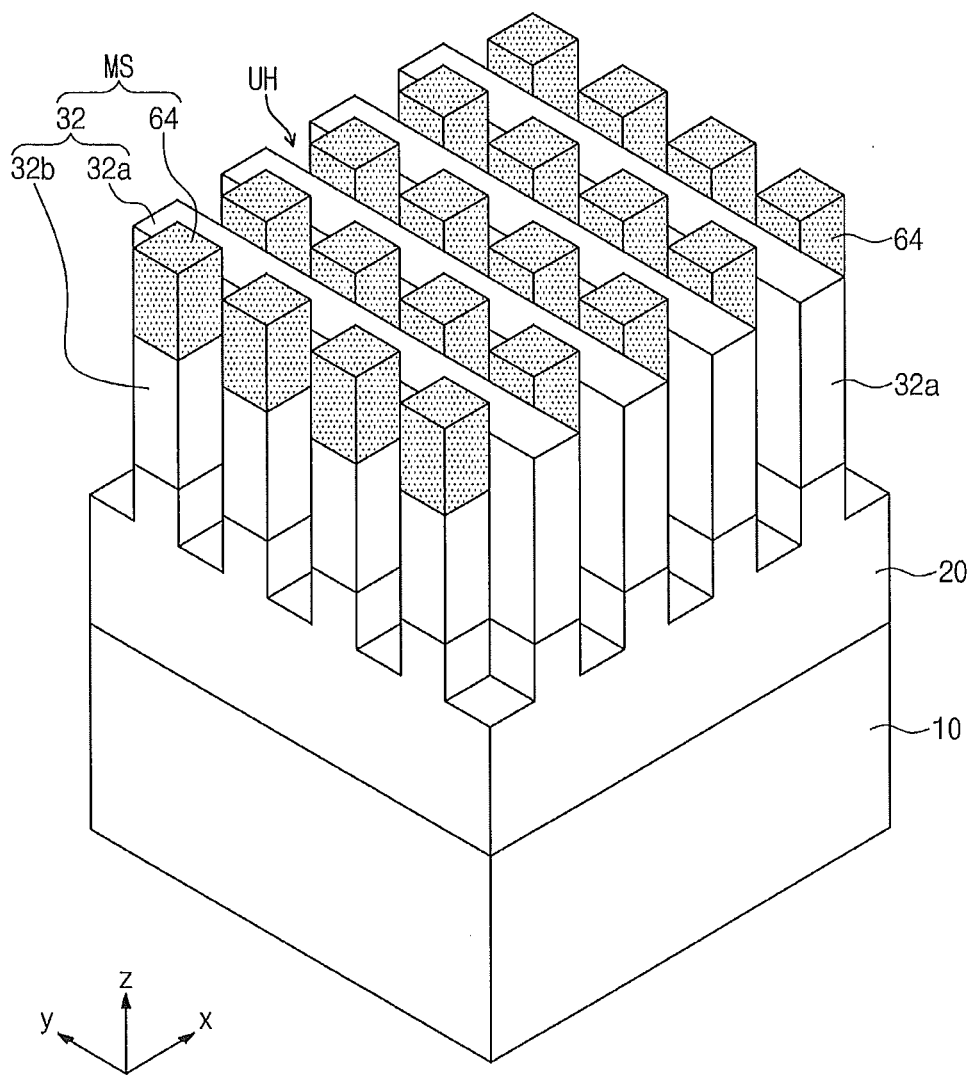

Referring to FIG. 8, the first and second mask patterns 42 and 72 may be removed. At this time, a mask structure MS including the first and second sacrificial patterns 32 and 64 may be left on the lower layer 20.

In detail, the first and second mask patterns 42 and 72 may be removed by a dry etching or wet etching. At this time, since the first and second mask patterns 42 and 72 have a higher etch selectivity than the first and second sacrificial patterns 32 and 64, the first and second mask patterns 42 and 72 on the first and second sacrificial patterns 32 and 64 may be selectively removed. Additionally, in the case where the first and second mask patterns 42 and 72 are formed of the same material, the first and second mask patterns 42 and 72 may be etched at the same time by an etching process. Unlike this, in the case where the first and second mask patterns 42 and 72 are formed of different materials, the first and second mask patterns 42 and 72 may be etched sequentially. Also, while the first and second mask patterns 42 and 72 are removed, as illustrated in FIG. 8, some portion of the lower layer 20 exposed by the first and second sacrificial patterns 32 and 64 may be etched.

Meanwhile, according to some embodiments, the first and second mask patterns 42 and 74 may be removed while the lower layer 20 is patterned by using the first and second sacrificial patterns 32 and 64 without a separate etching process. According to other embodiments, the first and second mask patterns 42 and 72 may be used in patterning the lower layer 20 together with the first and second sacrificial patterns 32 and 64 without a separate etching process.

Since the first and second sacrificial patterns 32 and 64 are formed of a material containing carbon as a main component, the first and second sacrificial patterns 32 and 64 may have an excellent etching resistance. Therefore, the first and second sacrificial patterns 32 and 64 may be used as a hard mask in patterning the thick lower layer.

The mask structure MS formed thus may be comprised of the first and second sacrificial patterns 32 and 64 containing carbon. As described above, the upper holes UH may be defined by the first and second sacrificial patterns 32 and 64. Additionally, the first sacrificial pattern 32 may be comprised of the first portions 32a and the second portions 32b having a smaller height than the first portions 32a, and the second sacrificial patterns 64 are positioned on the second portions 32b of the first sacrificial pattern 32. Further, the height of the second sacrificial pattern 64 may be greater than the height difference between the first portion 32a and the second portion 32b. Therefore, the top surface of the second sacrificial pattern 64 is positioned at a higher level than the top surface of the first portion 32a of the first sacrificial pattern 32.

Since the first and second sacrificial patterns 32 and 64 containing carbon have an excellent etching resistance or excellent etch selectivity, the falling of the first and second sacrificial patterns 32 and 64 or the decrease in thickness may be suppressed. Therefore, patterns having a fine linewidth and a high aspect ratio may be formed stably by using the first and second sacrificial patterns 32 and 64.

Figure 9:
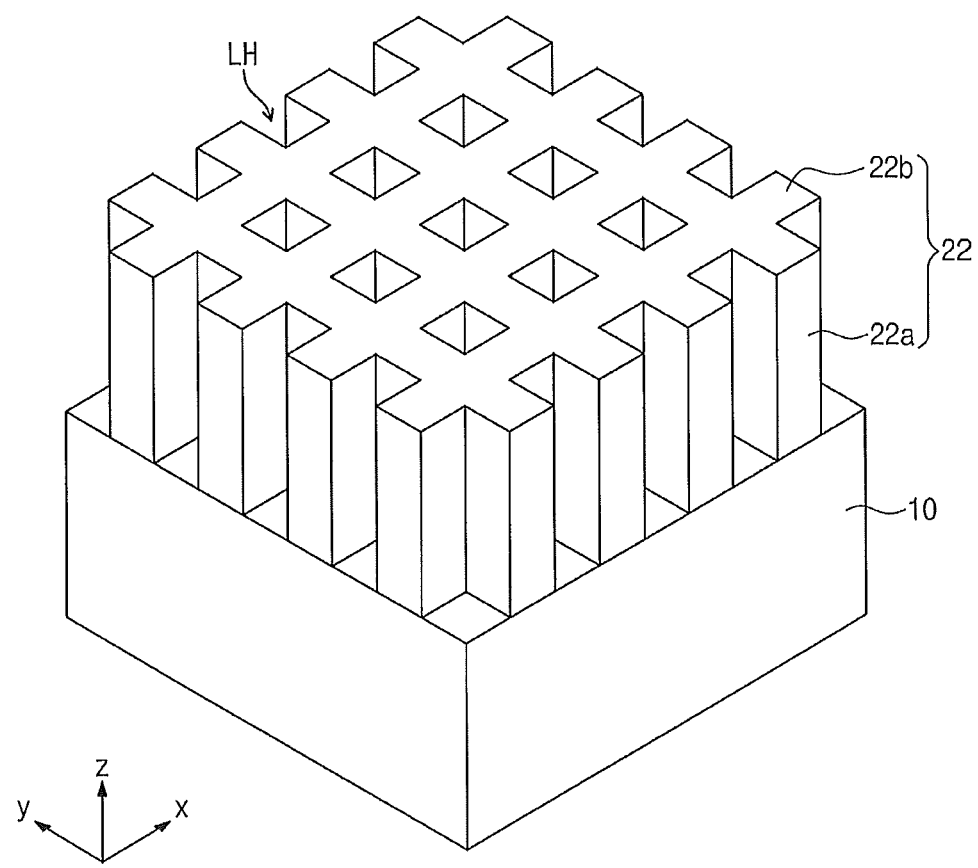

Next, referring to FIG. 9, the lower layer 20 may be etched by using the mask structure MS formed according to an embodiment of the inventive concept as an etch mask. That is, as the upper holes UH formed in the mask structure MS are transferred to the lower layer 20, lower holes LH may be formed in the lower layer 20.

In detail, as illustrated in FIG. 9, a lower pattern 22 may have the lower holes LH arranged in a matrix form. That is, the lower pattern 22 having the top surface of a lattice (or net) shape may be formed. In detail, the lower pattern 22 may include first portions 22b extending in a direction (e.g., y-axis direction), and second portions 22b spaced apart from each other between the first portions 22a and locally disposed.

Thus, by using the first and second sacrificial patterns 32 and 64 containing carbon, the lower holes LH having an aspect ratio of about 2:1 to about 16:1 may be formed in the lower layer 20. Also, in some embodiments, the lower holes LH may have a width ranging from about 10 nm to about 40 nm.

The plane area of the lower holes LH formed in the lower layer 20 may be varied depending on the pitch and linewidth of the first and second mask patterns 42 and 72. According to some embodiments, in FIGS. 1 and 6, the pitch and linewidth of the first mask patterns 42 may be substantially the same as those of the second mask patterns 72. In other embodiments, the pitch and linewidth of the first mask patterns 42 may be different from those of the second mask patterns 72.

Thus, after the lower pattern 22 is formed, the mask structure MS may be removed by an ashing process and/or stripping process.

Second Embodiments

Hereinafter, a method for forming fine patterns according to second embodiments of the inventive concept will be described in detail with reference to FIGS. 10 through 13.

FIGS. 10 through 13 are perspective views illustrating a sequence of a method for forming fine patterns according to second embodiments of the inventive concept. In FIGS. 10 through 13, the same reference numerals will be given for elements substantially identical to those in the embodiment of FIGS. 1 through 9, and thus further detailed description for those elements will be omitted herein.

According to the present embodiment, like the description made with reference to FIG. 1, a lower layer 20 and a first sacrificial layer are formed on a substrate 100 in sequence, and first mask patterns 42 are formed on the first sacrificial layer. The first mask patterns 42 may have a line shape, and may be disposed such that they are separated from each other in parallel.

Figure 10:
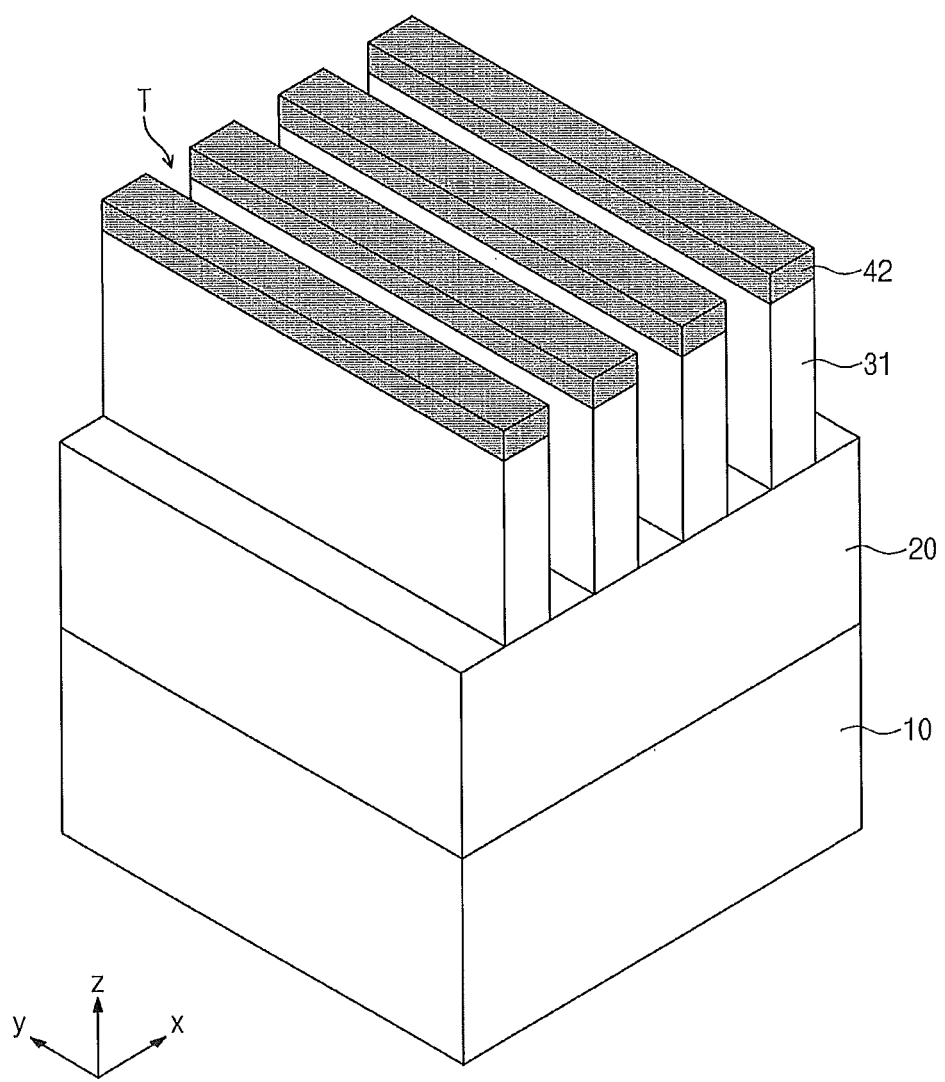
FIGS. 10 through 13 are perspective views illustrating a sequence of a method for forming fine patterns according to second embodiments of the inventive concept.

Subsequently, like the description made with reference to FIG. 2, the first sacrificial layer is etched by using the first mask patterns 42 as an etch mask. The etching of the first sacrificial layer may be performed until the lower layer 20 is exposed. In other embodiments, the first sacrificial layer 60 may only be partially etched. In yet other embodiments, the first sacrificial layer need not be etched at all, so that trenches T need not be formed therein. Accordingly, as illustrated in FIG. 10, line-shaped first sacrificial patterns 31 may be formed on the lower layer 20.

Figure 11:
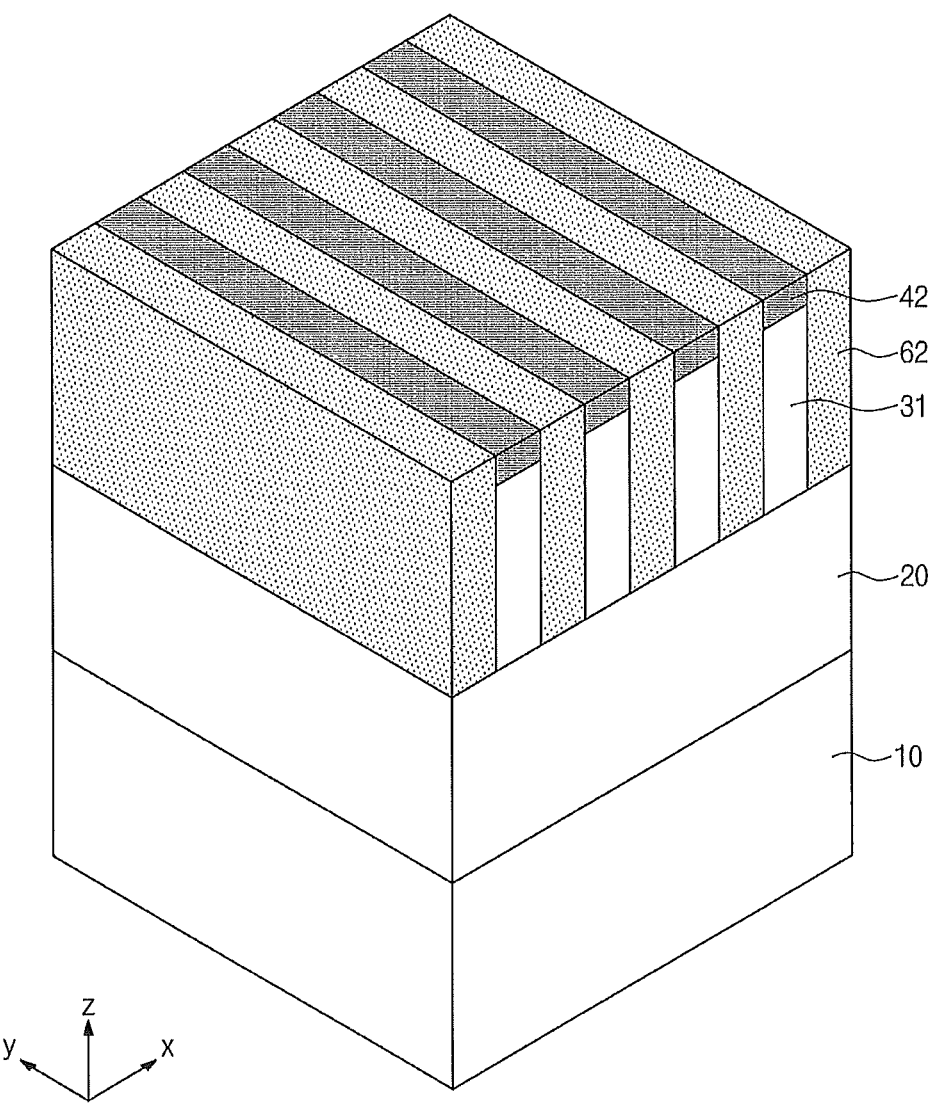

Thereafter, referring to FIG. 11, second sacrificial layers 62 are formed between the line-shaped first sacrificial patterns 31.

Like the description made with reference to FIGS. 3 and 4, the forming of the second sacrificial layers 62 includes forming a coating layer filling the first sacrificial patterns 31 by using spin-on coating, and etching back the coating layer until the first mask patterns 42 are exposed.

The second sacrificial layers 62 formed thus may be disposed between the first sacrificial layers 31 and may directly contact the top surface of the lower layer 20. In other embodiments, the second sacrificial layers 62 may only extend partway down to the lower layer, and need not directly contact the top surface of the lower layer 20. In still other embodiments, the second sacrificial layers 62 may be only be formed between the first mask patterns 42. The widths of the second sacrificial layers 62 may be equal to a space between the first sacrificial patterns 31. Also, between the second sacrificial layers 62 and the first sacrificial patterns 31, there is a height difference corresponding to the thickness of the first mask pattern 42.

Figure 12:
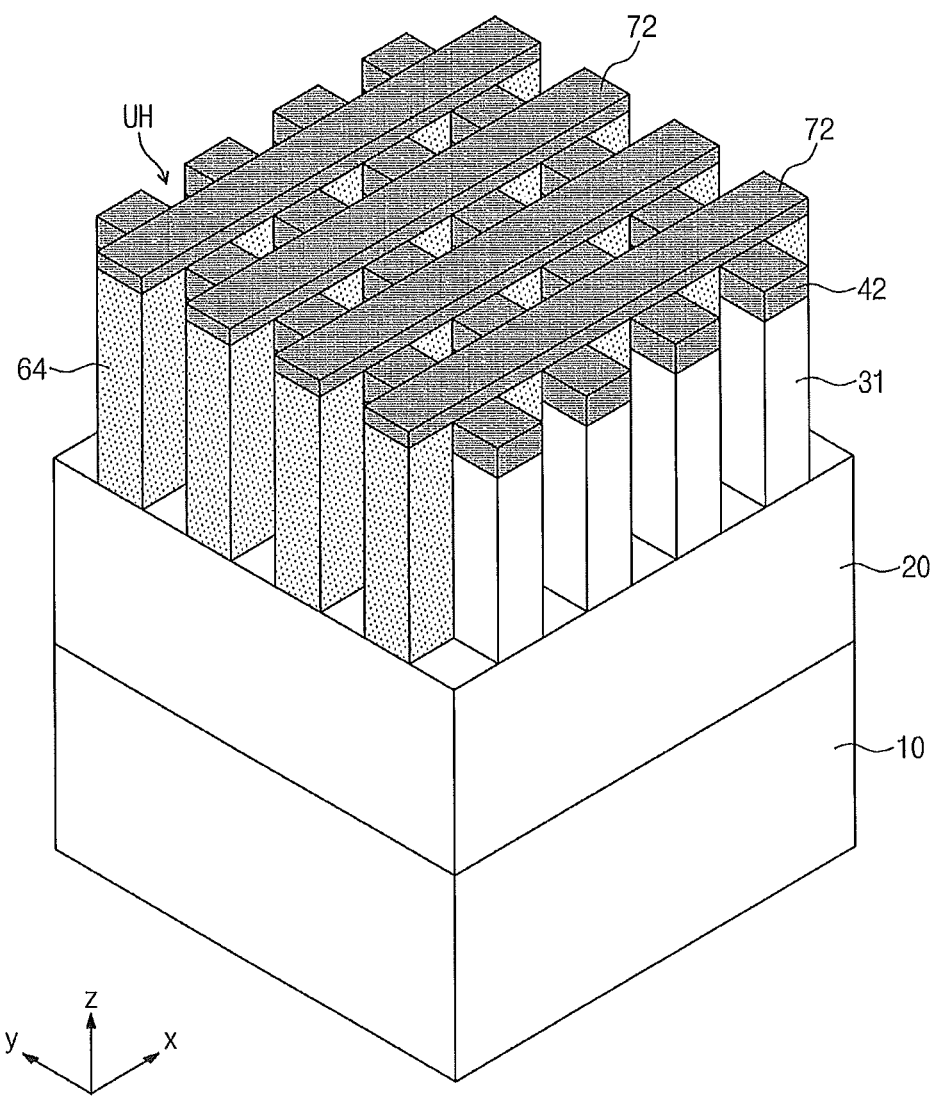

Referring to FIG. 12, like the description made with reference to FIG. 5, second mask patterns 72 crossing the first mask patterns 42 may be formed on the second sacrificial layer 62. Next, the second sacrificial layer 62 is patterned by using the first and second mask patterns 42 and 72, thereby forming second sacrificial patterns 64. In the present embodiment, the anisotropic etching of forming the second sacrificial patterns 64 may be performed until the top surface of the lower layer 20 is exposed. Accordingly, the second sacrificial patterns 64 may be separated from each other between a pair of the first sacrificial patterns 31.

Figure 13:
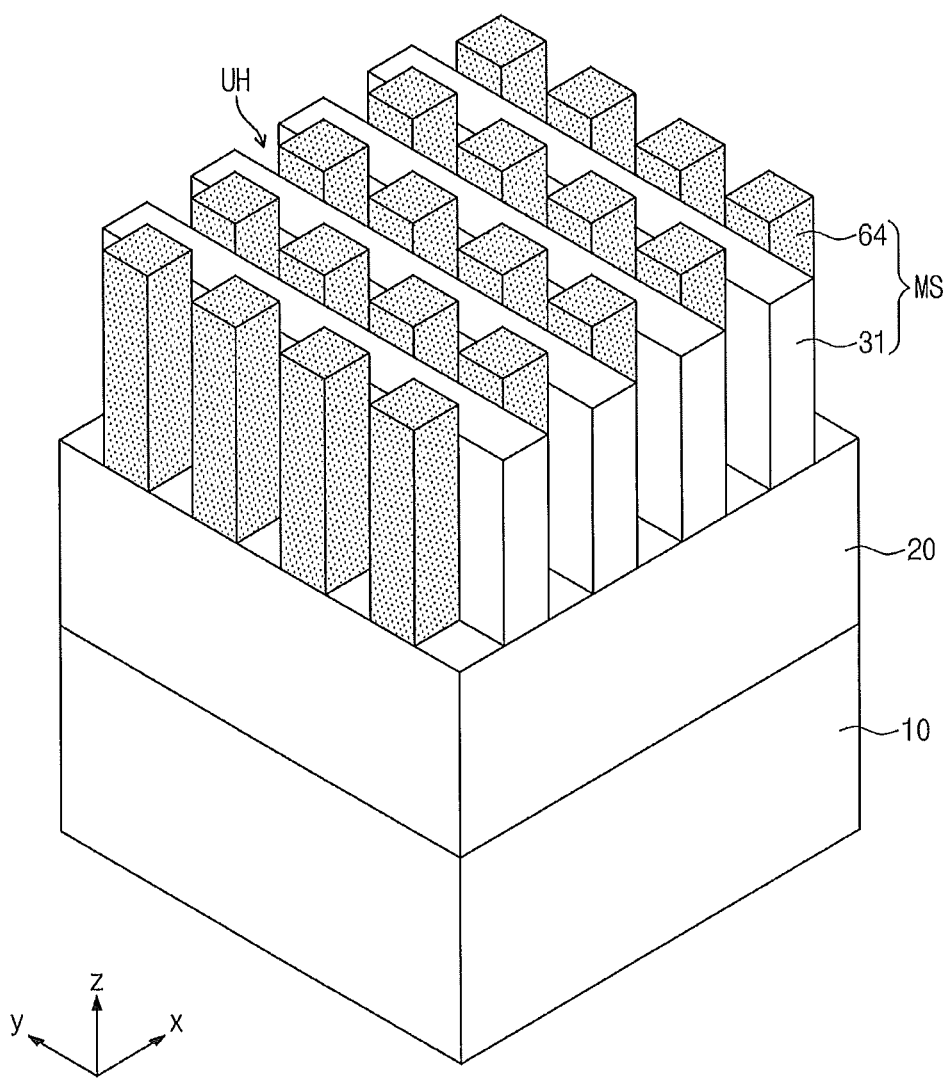

Referring to FIG. 13, the first and second mask patterns 42 and 72 are removed, so that a mask structure MS configured with the line-shaped first sacrificial patterns 31 and the second sacrificial patterns 64 arranged in a matrix form may be formed on the lower layer 20. Like the description made with reference to FIG. 9, the mask structure MS formed thus may be used for patterning the lower layer 20. In other embodiments, the first and second mask patterns 42 and 72 may be used for patterning the lower layer 20 together with the mask structure MS.

Modified Embodiments

Hereinafter, referring to FIGS. 14 through 16, description will be given of various types of fine patterns formed by using a method for forming fine patterns according to the first and second embodiments of the inventive concept.

Figure 14:
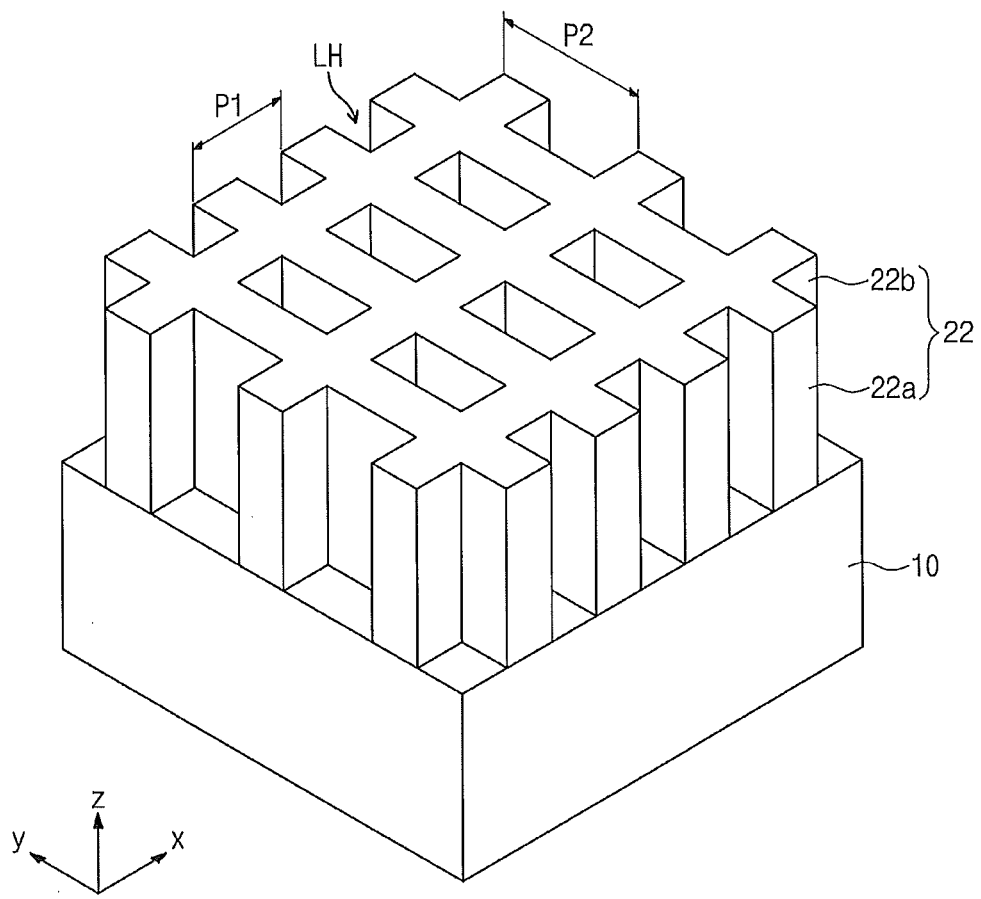
FIGS. 14 through 16 are perspective views illustrating various types of fine patterns formed by the methods for forming fine patterns according to the first and second embodiments of the inventive concept.
Figure 15:
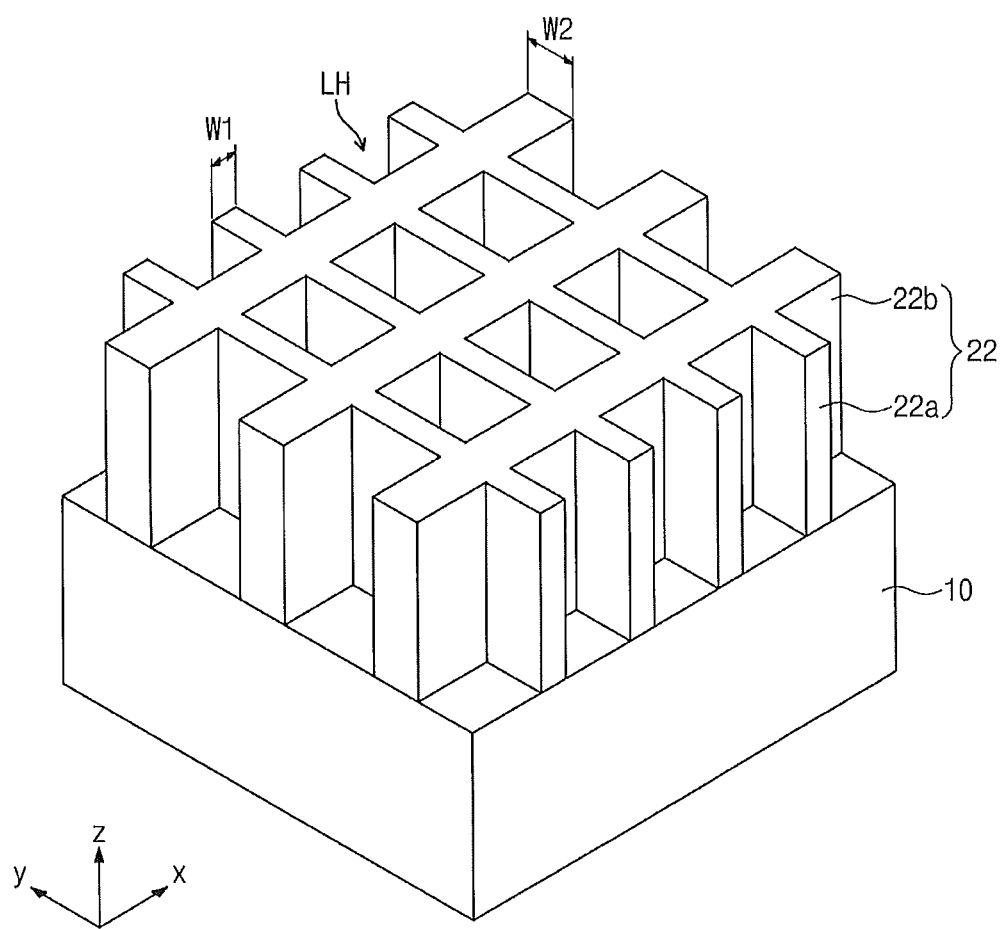
Figure 16:
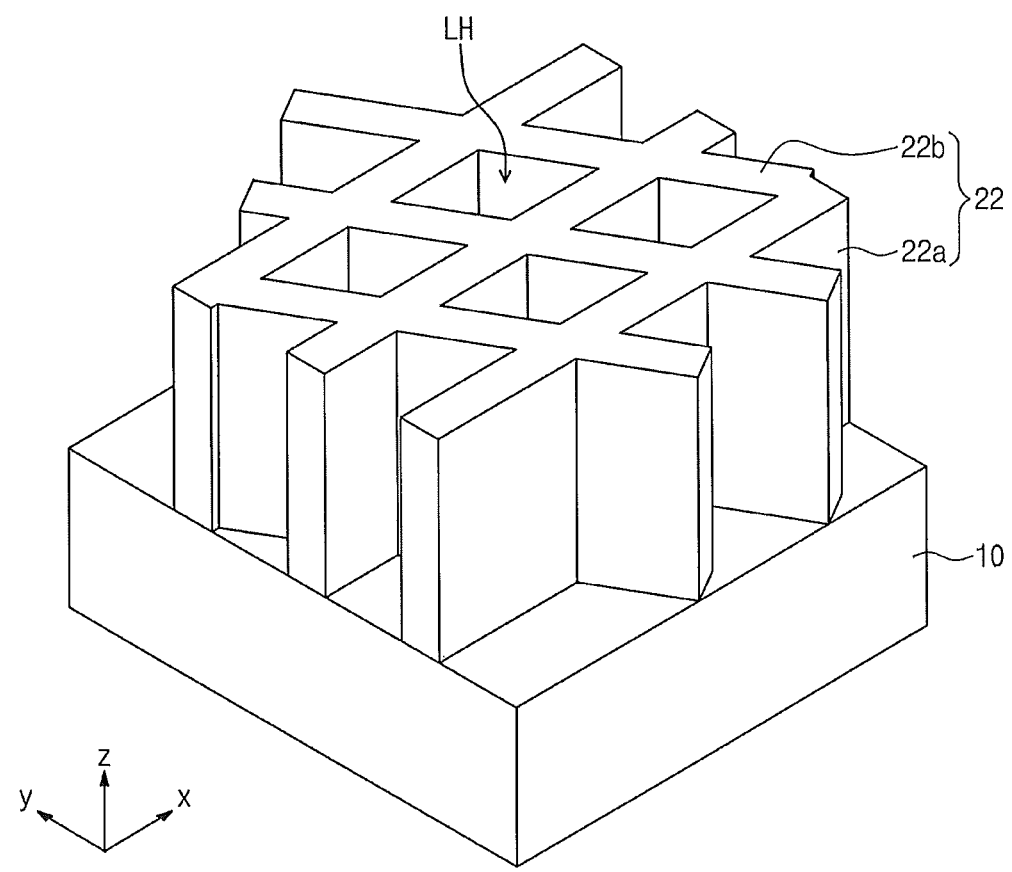

FIGS. 14 through 16 are perspective views illustrating various types of fine patterns formed by the methods for forming fine patterns according to the first and second embodiments of the inventive concept.

Referring to FIGS. 14 through 16, a lower pattern 22 having lower holes LH may be formed on a substrate 10. The lower pattern 22, as described above, may be formed of a semiconductor material, an insulation material and/or a conductive material. The lower pattern 22 may have a multilayered structure where a plurality of layers are stacked. Like the description made with reference to FIG. 9, the lower pattern 22 includes first portions 22a extending in one direction (y-axis direction), and second portions 22b which are separated from each other between the first portions 22a and locally disposed.

According to embodiments illustrated in FIG. 14, the lower pattern 22 may define lower holes LH which are 2-dimensionally arranged, i.e., in an array. In the lower holes LH defined in the lower pattern 22, a width in a first direction (e.g., x-axis direction) may differ a width in a second direction (e.g., y-axis direction). According to the present embodiment, in the lower pattern 22, a pitch P1 between the first portions 22a differs from a pitch P2 between the second portions 22b. A space between the lower holes LH in the first direction may be substantially equal to a space between the lower holes LH in the second direction.

To form the lower pattern 22 of FIG. 14, the first and second mask patterns 42 and 72 are formed such that the pitch P1 of the first mask pattern 42 differs from the pitch P2 of the second mask pattern 72, in FIGS. 1 through 9. The widths of the first mask patterns 42 may be substantially identical to those of the second mask patterns 72.

According to an embodiment illustrated in FIG. 15, a space between the lower holes LH in the first direction may differ from a space between the lower holes LH in the second direction. In other words, a width W1 of the first portion 22a may differ from a width W2 of the second portion 22b in the lower pattern 22.

To form the lower pattern 22 of FIG. 15, a linewidth W1 of the first mask pattern 42 may differ from a linewidth W2 of the second mask pattern 72, in FIGS. 1 through 9.

According to an embodiment illustrated in FIG. 16, the lower pattern 22 defining a substantially diamond-shaped lower holes LH may be formed on the substrate 100. That is, in the lower pattern 22, the second portions 22b may have a predetermined oblique angle with respect to the first portions 22a when viewed from the top. In other words, the first and second portions 22a and 22b may be non-parallel and non-perpendicular to each other, so that they extend along oblique directions.

To form the lower pattern 22 of FIG. 16, in FIGS. 1 through 9, the second mask pattern 72 may be formed to have a predetermined angle with respect to the first mask pattern 42 when viewed from the top. That is, the second mask pattern 72 may have an angle ranging from 0° to 90°, or 90° to 180° with respect to the first mask pattern 42, when viewed from the top.

Third Embodiments

Hereinafter, a method for forming fine patterns according to third embodiments of the inventive concept will be described in detail with reference to FIGS. 17A through 17G.

Figure 17A:
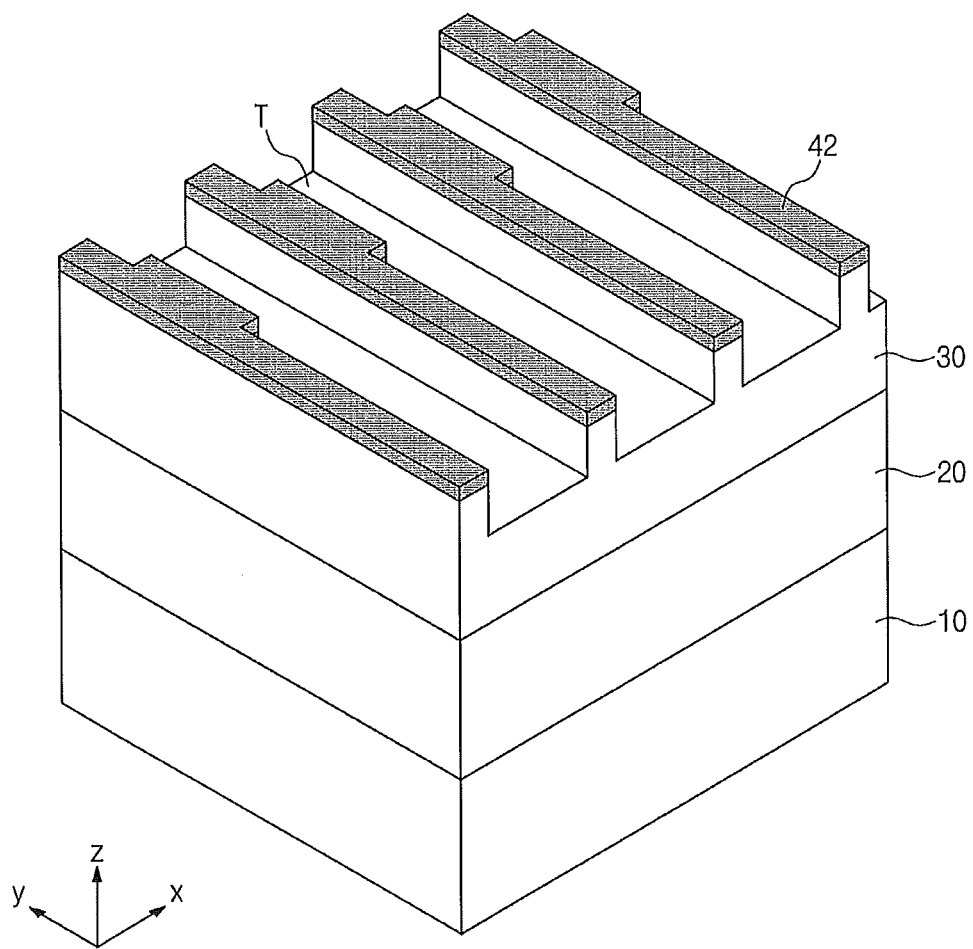
FIGS. 17A through 17G are perspective views illustrating a sequence of a method for forming fine patterns according to third embodiments of the inventive concept.

FIGS. 17A through 17G are perspective views illustrating a method for forming fine patterns according to the third embodiments of the inventive concept. In FIGS. 17A though 17G, the same reference numerals will be given for elements substantially identical to those in the embodiment of FIGS. 1 through 9, and thus further detailed description for those elements will be omitted herein.

According to the embodiments illustrated in FIGS. 17A through 17G, line-shaped lower holes LH may be defined in a lower layer 20 by a mask structure MS formed on the lower layer 20.

Referring to FIG. 17A, a first sacrificial layer 30 may be formed on the lower layer 20, and first mask patterns 42 having the shape of a line extending in one direction may be formed on the first sacrificial layer 30. Like the description made with reference to FIG. 1, the first mask patterns 42 may be formed of a material having an etch selectivity with respect to the first sacrificial layer 30 during etching of the first sacrificial layer 30. In the present embodiment, the first mask pattern 42 includes first and second regions having different widths. The minimum linewidth of the first mask pattern 42 may be the critical dimension that can be realized by the resolution of photolithography process. The space between the first mask patterns 42 may be twice the linewidth of the first mask pattern 42 or less.

Thereafter, trenches T may be defined in the first sacrificial layer 30 by using the first mask patterns 42. Like the description made with reference to FIG. 2, the forming of the trenches T includes anisotropically etching the first sacrificial layer 30 by using the first mask patterns 42 as an etch mask. The first mask patterns 42 may have different widths in predetermined regions, and therefore widths of the trenches T defined in the first sacrificial layer 30 may also differ from one another in the predetermined regions.

As was also described in connection with FIG. 2, trenches T need not be formed in the first sacrificial layer 30. Rather, in some embodiments, the first mask patterns 42 may be formed but the first sacrificial layer 30 need not be etched at this time.

Figure 17B:
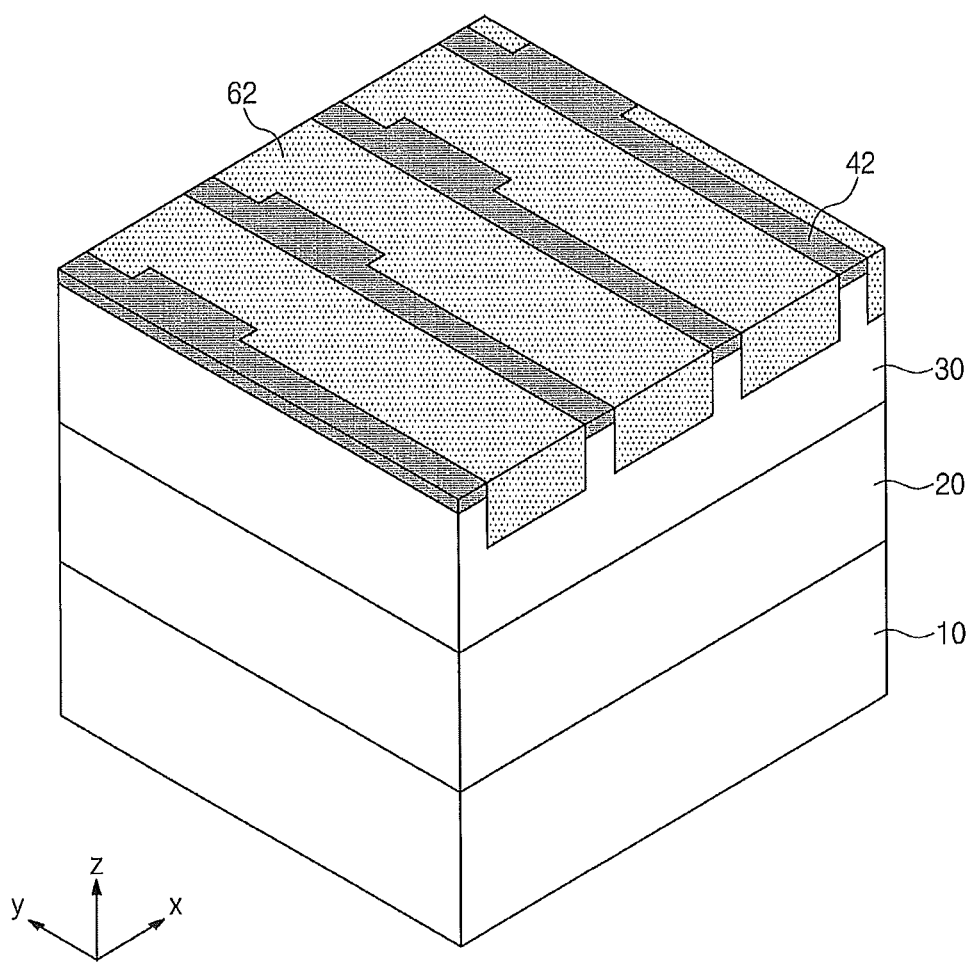

Referring to FIG. 17B, second sacrificial layers 62 are formed in the trenches T defined in the first sacrificial layer 30. Like the description made with reference to FIGS. 3 and 4, the forming of the second sacrificial layers 62 may include a coating layer formed of a material containing carbon as a main component on the first mask patterns 42, and anisotropically etching the coating layer until the top surfaces of the first mask patterns 42 are exposed. In the present embodiment, the second sacrificial layers 52 filling the trenches T may also have different widths in the predetermined regions.

As also described in connection with FIGS. 3 and 4, the second sacrificial layer 62 need not be formed in the trenches T, but may only be formed between the first mask patterns 42, when trenches T are not formed during the processing of FIG. 17A.

Figure 17C:
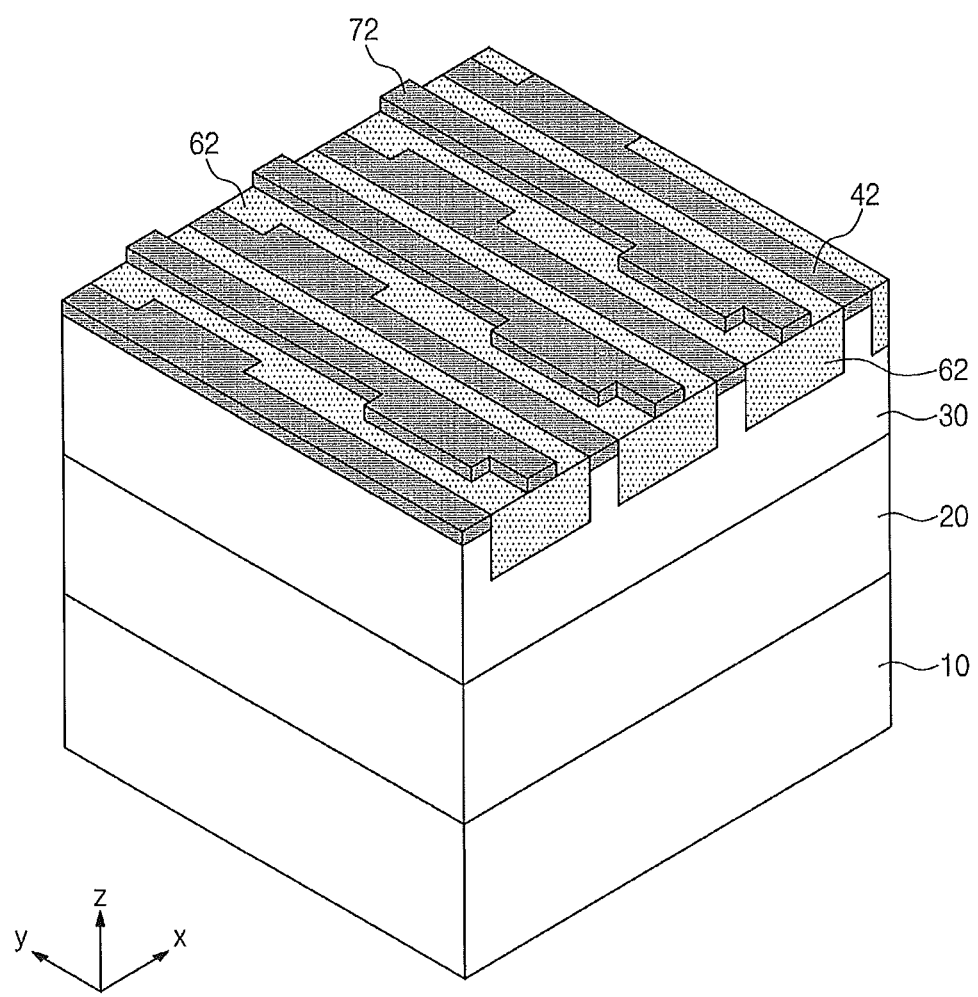

Referring to FIG. 17C, second mask patterns 72 are formed on the second sacrificial layers 62. That is, the second mask patterns 72 may be positioned higher than the first mask patterns 42.

Like the description made with reference to FIG. 5, the second mask patterns 72 may be formed by using a deposition technique such as chemical vapor deposition (CVD), and formed of a material having an etch selectivity with respect to the first and second sacrificial layers 30 and 62. In other embodiments, the second mask patterns 72 may be formed of the same material as the first mask patterns 42.

In the present embodiments, the second mask patterns 72 may be formed parallel with the first mask patterns 42 between a pair of the mask patterns 42 adjacent thereto. The second mask patterns 72 may be smaller in width than the second sacrificial layers 62. Therefore, the top surfaces of the second sacrificial layers 62 may be partially exposed owing to the second mask patterns 72.

In the present embodiments, like the first mask patterns 42, the second mask patterns 72 may have different linewidths in predetermined regions. The wider portions of the first and second mask patterns 42 and 72 may be offset from one another as shown. In other embodiments, the wider portions of the first and second mask patterns 42 and 72 may extend adjacent one another. In yet other embodiments, the second mask patterns 72 may have a uniform linewidth.

In the present embodiments, a pitch of the first mask patterns 42 or second mask patterns 72 may be greater than the maximum space between the first mask patterns 42 and the second mask patterns 72. Accordingly, a process margin may be enhanced during the photolithography process of forming the first or second mask patterns 42 or 72.

Figure 17D:
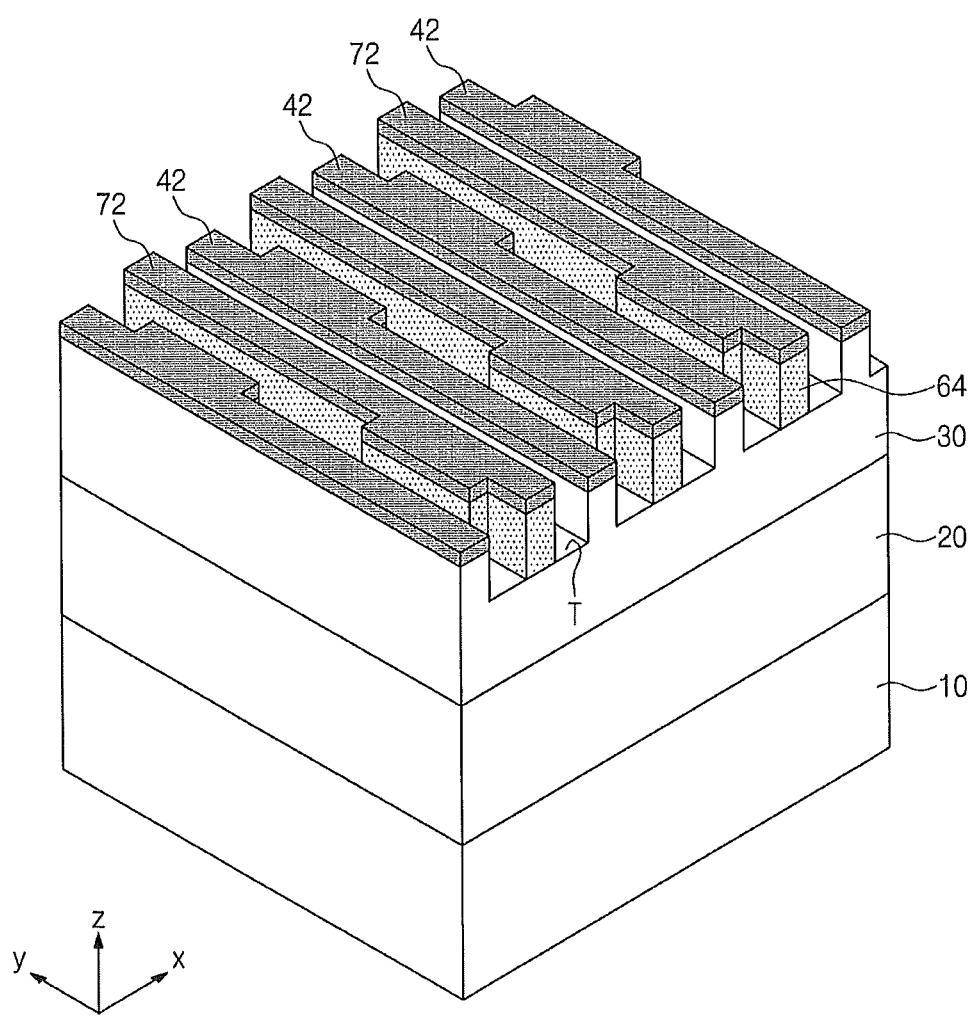
Figure 17E:
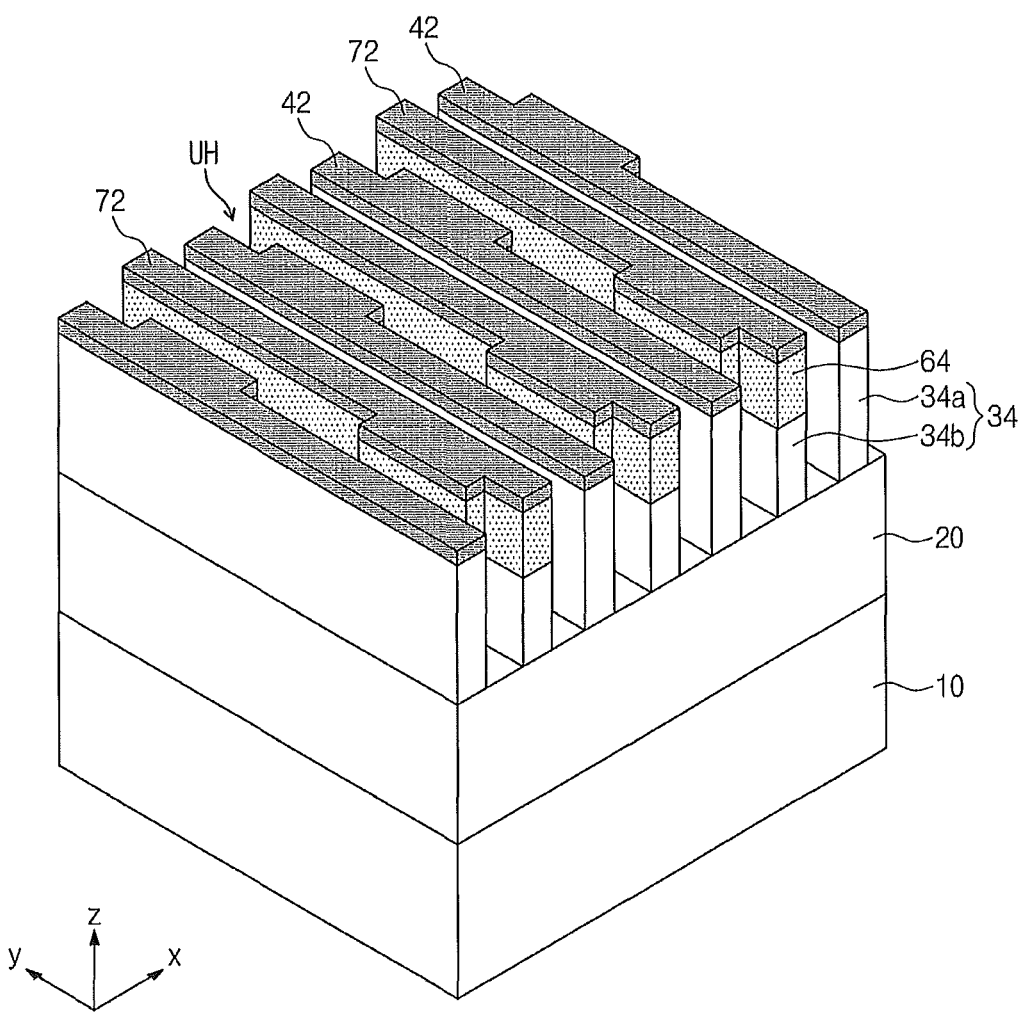

Referring to FIGS. 17D and 17E, first and second sacrificial patterns 34 and 64 may be formed by using the first and second mask patterns 42 and 72.

In detail, like the description made with reference to FIG. 6, the second sacrificial layers 62 exposed between the first and second mask patterns 42 and 72 are selectively etched by using the first and second mask patterns 42 and 72 as an etch mask. As a result, the second sacrificial patterns 64 onto which the second mask patterns 72 are transcribed may be formed.

After forming the second sacrificial patterns 64, an etch process may be successively performed on the first sacrificial layer 30. Thus, the first sacrificial patterns 34 onto which the first and second mask patterns 42 and 72 are transcribed may be formed, as illustrated in FIG. 17E. Specifically, the first sacrificial layer 30 may be divided into first and second patterns 34*a* and 34*b* which are line-shaped and differ in height from each other. The first sacrificial patterns 34 may be configured with the first patterns 34*a*, and the second patterns 34*b* lower than the first patterns 34*a*. The second patterns 34*b* are disposed between the adjacent first patterns 34*a*, and the second sacrificial patterns 64 are positioned on the second patterns 34*b*. According to the present embodiments, the first and second patterns 34*a* and 34*b* may include a first region having a first width, and a second region having a second width greater than the first width. The wider regions may be offset from one another in some embodiments, as illustrated in FIG. 17E.

According to the present embodiments, spaces between the first sacrificial patterns 34 and the second sacrificial patterns 64 may be smaller than the pitch of the first or second mask patterns 42 or 72. The minimum space between the first and second sacrificial patterns 34 and 64 may be smaller than the minimum feature size in the photolithography. The spaces between the first and second sacrificial patterns 64 may differ from one another in predetermined regions.

Thus, as the first and second sacrificial patterns 34 and 64 are formed, a mask structure having upper holes UH which are substantially line-shaped may be formed on the lower layer 20. The upper holes UH may expose the lower layer 20 between the first and second sacrificial patterns 34 and 64. Widths of the upper holes UH defined in the mask structure may differ from one another in predetermined regions.

Figure 17F:
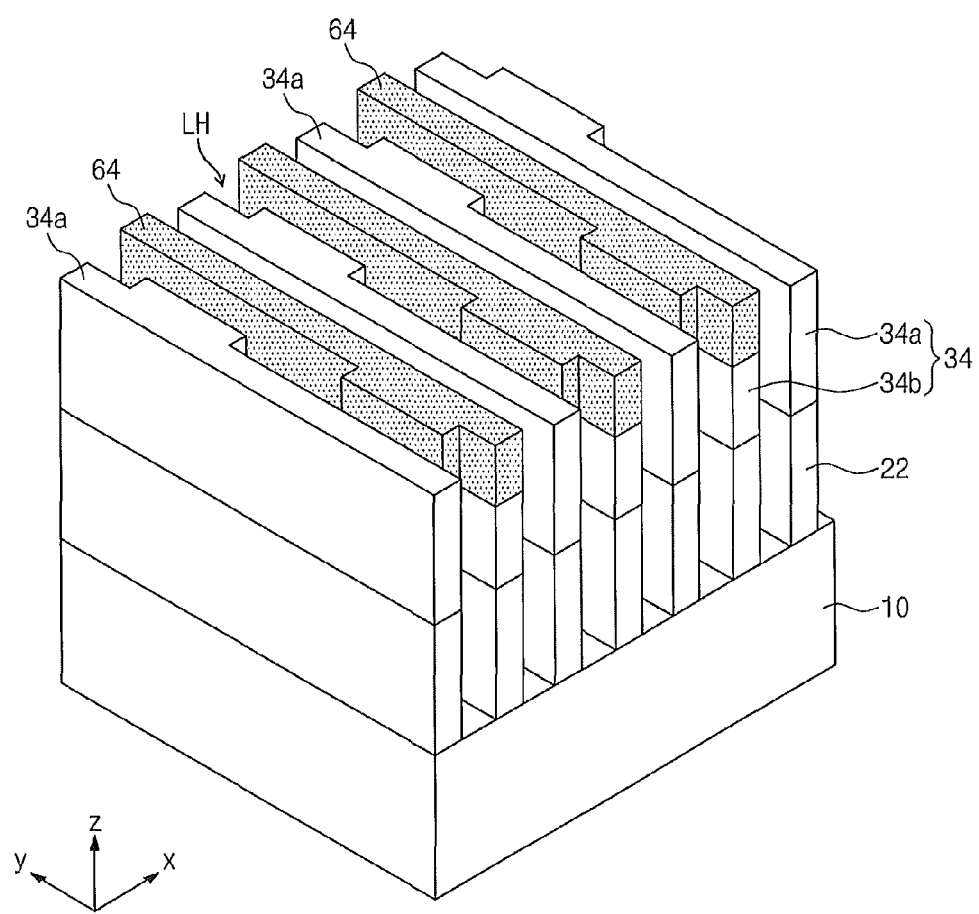

Next, referring to FIG. 17F, the lower layer 20 may be patterned by using the mask structure having the upper holes UH which are substantially line-shaped. That is, lower holes LH may be formed in the lower layer 20 by transcribing the upper holes UH defined in the mask structure onto the lower layer 20.

Afterwards, lower patterns 22 are formed, and thereafter the mask structure MS may be removed by ashing and or stripping process.

Figure 17G:
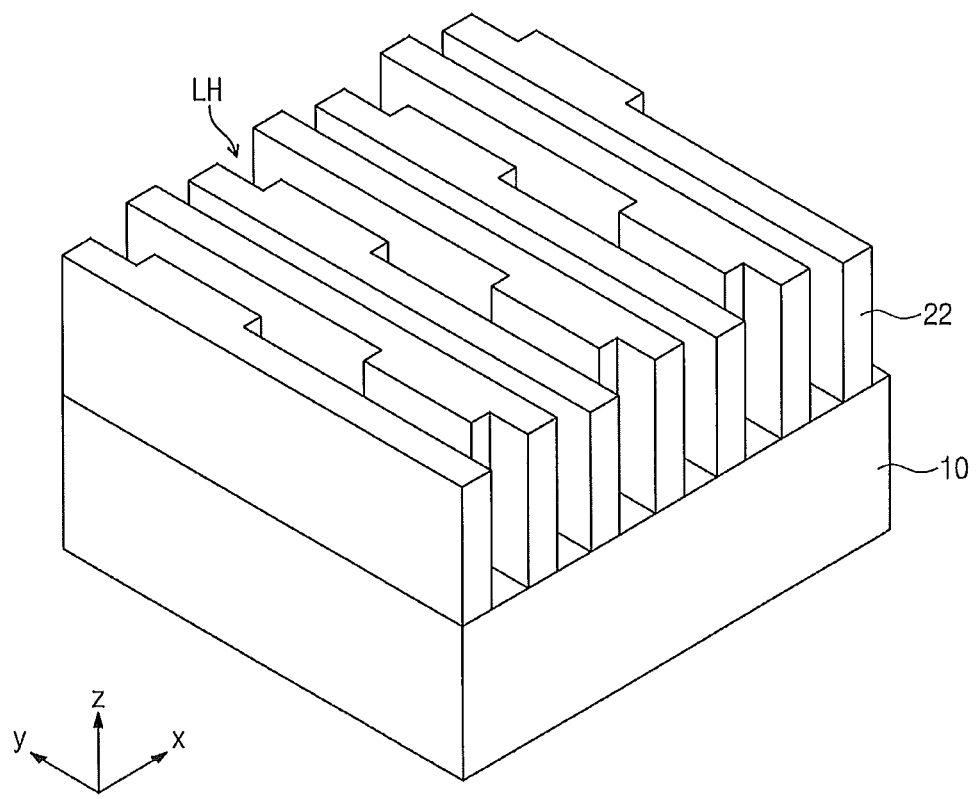

The lower patterns 22 formed thus may be line patterns which are disposed parallel with each other, as illustrated in FIG. 17G. Each of the lower patterns 22 may include first and second regions having different widths. A space between the adjacent lower patterns 22 may be smaller than widths of the lower patterns 22. That is, the space between the lower patterns 22 may be smaller than the critical dimension realized by the limiting resolution of the photolithography.

Figure 18:
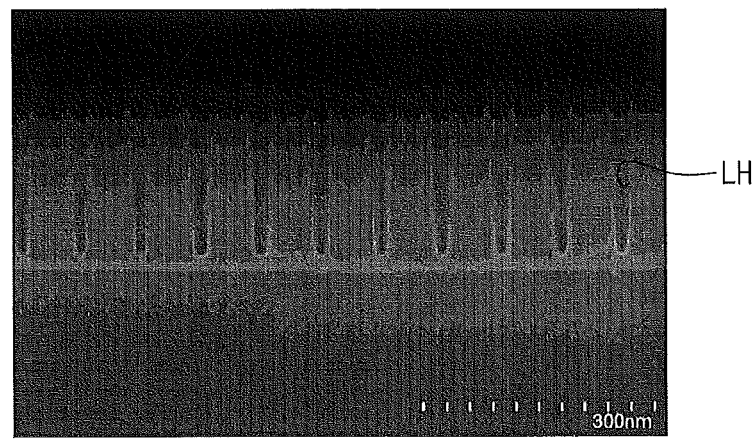
FIG. 18 is a SEM photograph showing a lower pattern formed by a method for forming fine patterns according to embodiments of the inventive concept.

FIG. 18 is a SEM photograph showing a lower pattern formed by a method for forming fine patterns according to embodiments of the inventive concept. In FIG. 18, the lower pattern is an insulation pattern in which the lower holes are defined. Referring to FIG. 18, the lower holes LH, which are formed by using the method for forming fine patterns according to embodiments of the inventive concept, have widths of about 30 nm. Also, the lower holes LH have an aspect ratio of about 8:1.

Hereinafter, description will be given of methods for manufacturing microelectronic devices by using methods for forming fine patterns according to embodiments of the inventive concept. The microelectronic device described herein may include: a highly integrated memory device such as a dynamic random access memory (DRAM), a static RAM (SRAM), a phase change RAM (PRAM), a resistance RAM (RRAM), a magnetic RAM (MRAM), a ferroelectric RAM (FRAM) and a flash memory; an optoelectronic device; and a processor such as CPU and DSP. Also, the microelectronic device may be configured with the same types of semiconductor elements, or a single chip data processing device such as a system-on chip (SOC) configured with different types of semiconductor elements may be provided.

<Application Example of Contact Plug>

Figure 19:
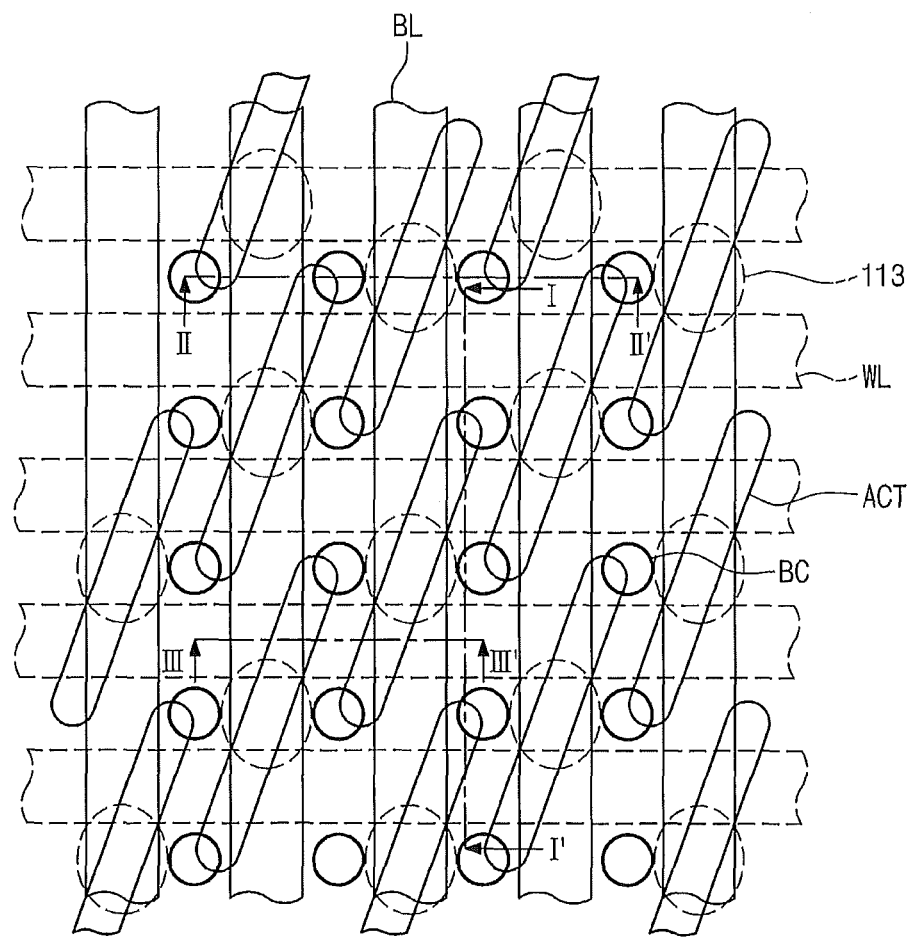
FIG. 19 is a plan view illustrating a cell region of a memory device formed using embodiments of the inventive concept.

FIG. 19 is a plan view illustrating a cell region of a DRAM device formed using embodiments of the inventive concept. FIGS. 20A through 20G are cross-sectional views taken along lines I-I', II-II' and III-III' of FIG. 19 and a cross-section of a peripheral circuit region, which illustrate a method for manufacturing a DRAM device using a method for forming fine patterns according to embodiments of the inventive concept.

Figure 20A:
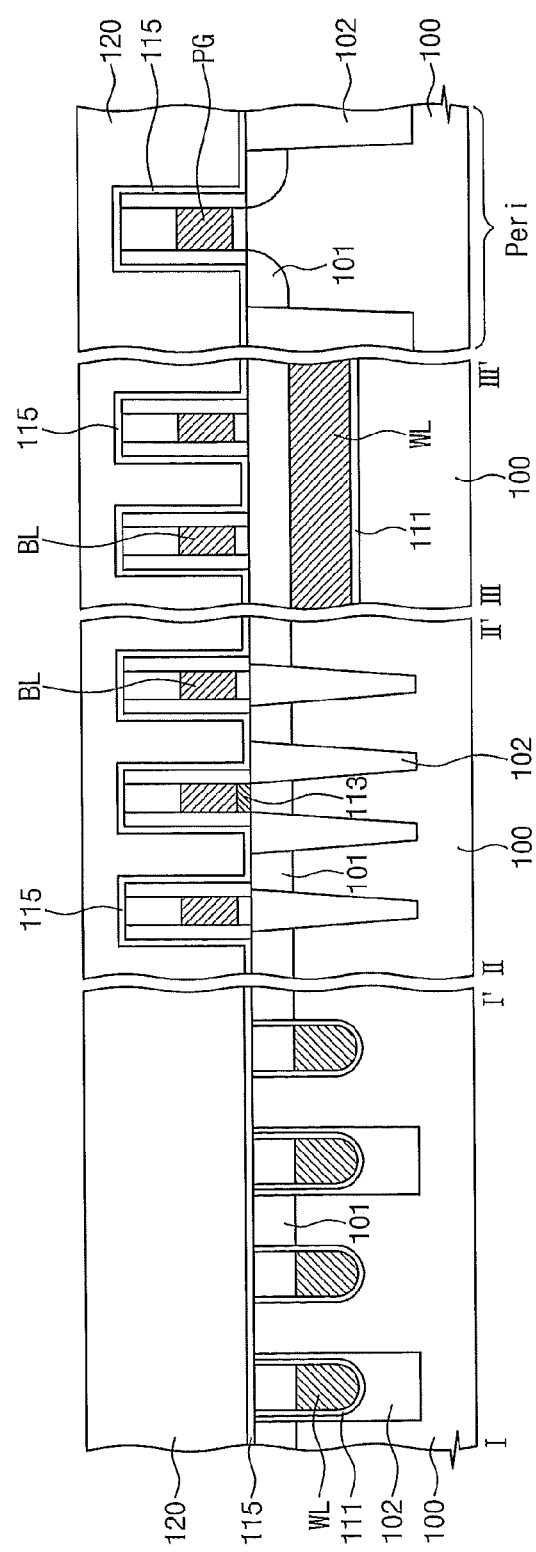
FIGS. 20A through 20G are cross-sectional views taken along lines I-I', II-II' and of FIG. 19 and illustrate a method for manufacturing a semiconductor device using a method for forming fine patterns according to various embodiments of the inventive concept.

Referring to FIGS. 19 and 20A, a semiconductor substrate 100 is provided, which includes a cell region and a peripheral circuit region Peri. The semiconductor substrate 100 may be a bulk silicon substrate, a silicon-on-insulator (SOI) substrate, a germanium substrate, a germanium-on-insulator (GOI) substrate, a silicon-germanium substrate, and/or a substrate of an epitaxial thin film obtained by performing selective epitaxial growth (SEG).

A device isolation layer 102 defining active regions ACT is provided in the semiconductor substrate 100. Recess regions may be formed in the semiconductor substrate 100 of the active region ACT. The recess regions may be formed to a predetermined depth from the surface of the semiconductor substrate 100, and disposed to cross the active region ACT. Word lines WL are formed in the recess region, with a gate dielectric disposed therebetween. The word lines WL may be buried in the recess region. That is, the top surfaces of the word lines may be lower than the top surface of the semiconductor substrate 100. An insulation material may be filled into the recess region where the word line WL is formed.

Source and drain regions 101 may be formed in the active region at both sides of the word lines WL. The source and drain regions 101 may be an impurity region doped with impurities. Also, the source and drain regions 101 may be an epitaxial layer doped with impurities, and the epitaxial layer may be elevated over the surface of the semiconductor substrate 100.

In this way, since the word lines WL and the source and drain regions 101 are formed, a plurality of MOS transistors may be formed on the semiconductor substrate 100.

Thereafter, bit lines BL crossing the word lines WL may be formed on the semiconductor substrate 100. The bit lines BL may be formed on the semiconductor substrate 100 with an insulation layer interposed therebetween, and conductive patterns 113 electrically connecting the source and drain regions 101 and the bit line BL may be formed between the active region ACT and the bit line BL.

A peripheral gate electrode PG is formed on the semiconductor substrate 100 of the peripheral circuit region PERI. The peripheral gate electrode may be configured with a gate dielectric, a gate conductive pattern, and a capping layer which are stacked in sequence. Sidewall spacers may be formed at both sides of the gate electrode. Also, the source and drain regions 101 may be formed in the active region at both sides of the peripheral gate electrode PG.

A first interlayer dielectric (ILD) 120 may be formed on the semiconductor substrate 100 where the word lines WL, the bit lines BL and the peripheral gate electrodes PG are formed. Also, prior to forming the first ILD 120, an etch stop layer 115 may be formed, which conformally covers the semiconductor substrate 100 where the bit lines BL and the peripheral gate electrodes PG are formed.

The first ILD 120 may be composed of high density plasma (HDP) oxide, tetraethylorthosilicate (TEOS), plasma enhanced-TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG) and/or tonen silazene (TOSZ). Alternatively, the first ILD 120 may be composed of silicon nitride, silicon oxynitride and/or low dielectric constant (low-k) material. The etch stop layer 115 may be formed of a material having an etch selectivity during the etching of the first ILD 120. For example, the etch stop layer 115 may be formed of a silicon nitride layer or a silicon oxynitride layer.

Subsequently, referring to FIGS. 20B through 20F, contact holes CH are formed in the first ILD 120.

Figure 20B:
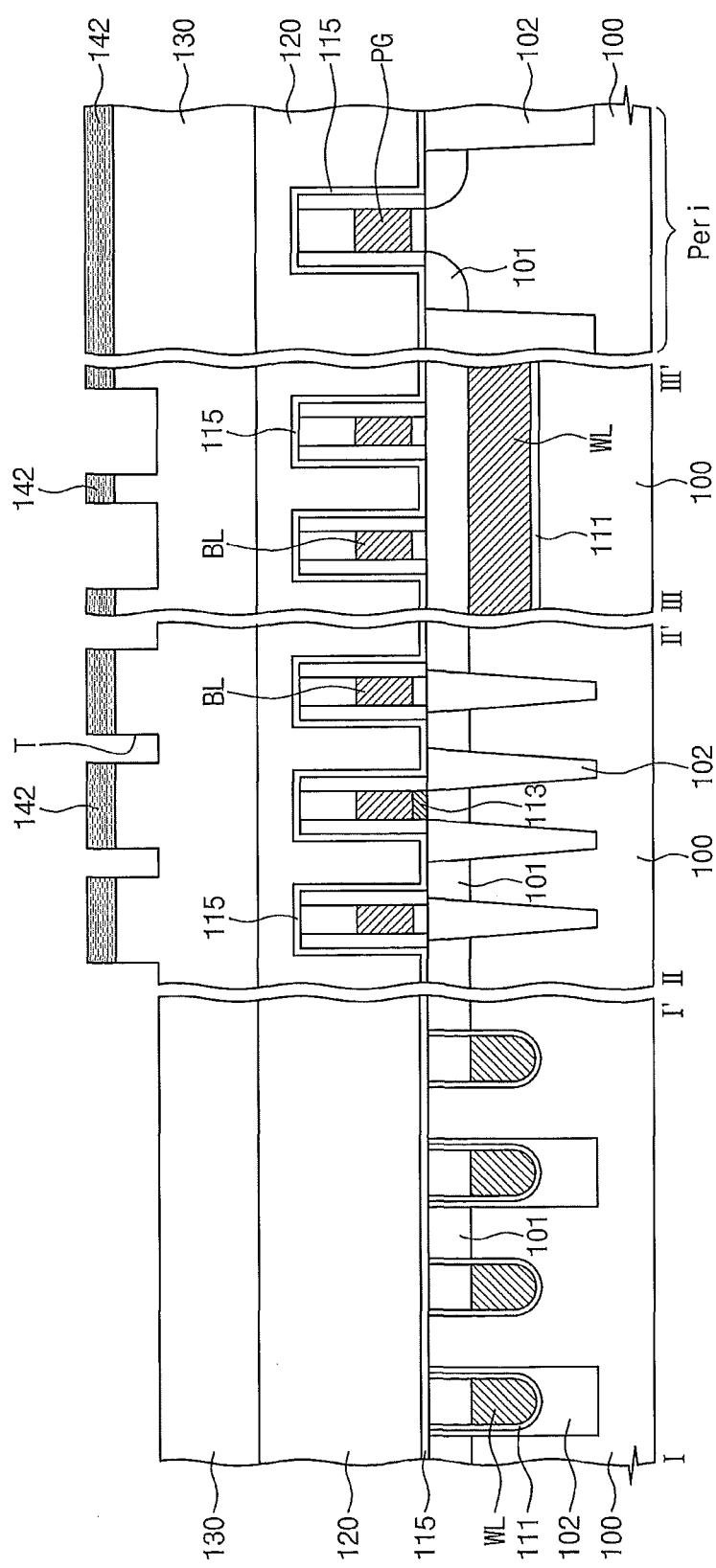

In detail, referring to FIG. 20B, a first sacrificial layer 130 with trenches T defined is formed on the first ILD 120. For example, the first sacrificial layer 130 may be an amorphous carbon layer which is deposited by using chemical vapor deposition (CVD).

Like the description made with reference to FIGS. 1 and 2, the forming of the first sacrificial layer 130 includes forming first mask patterns 142 on the first sacrificial layer 130, and etching a portion of the first sacrificial layer by using the first mask patterns 142.

According to some embodiments, the first mask patterns 142 may be disposed on the first sacrificial layer 130 of the cell region such that they are parallel with the word lines WL or bit lines BL. In an embodiment, the first mask patterns 142 may be formed in parallel with the bit line BL. Also, the first mask patterns 142 may be formed on the bit lines BL. That is, when viewed from the top, the first mask patterns 142 may overlap the bit line BL. Meanwhile, the first mask patterns 142 may cover an entire surface of the first sacrificial layer 130 of the peripheral circuit region Peri. That is, the first sacrificial layer 130 is not exposed in the peripheral circuit region Peri.

Figure 20C:
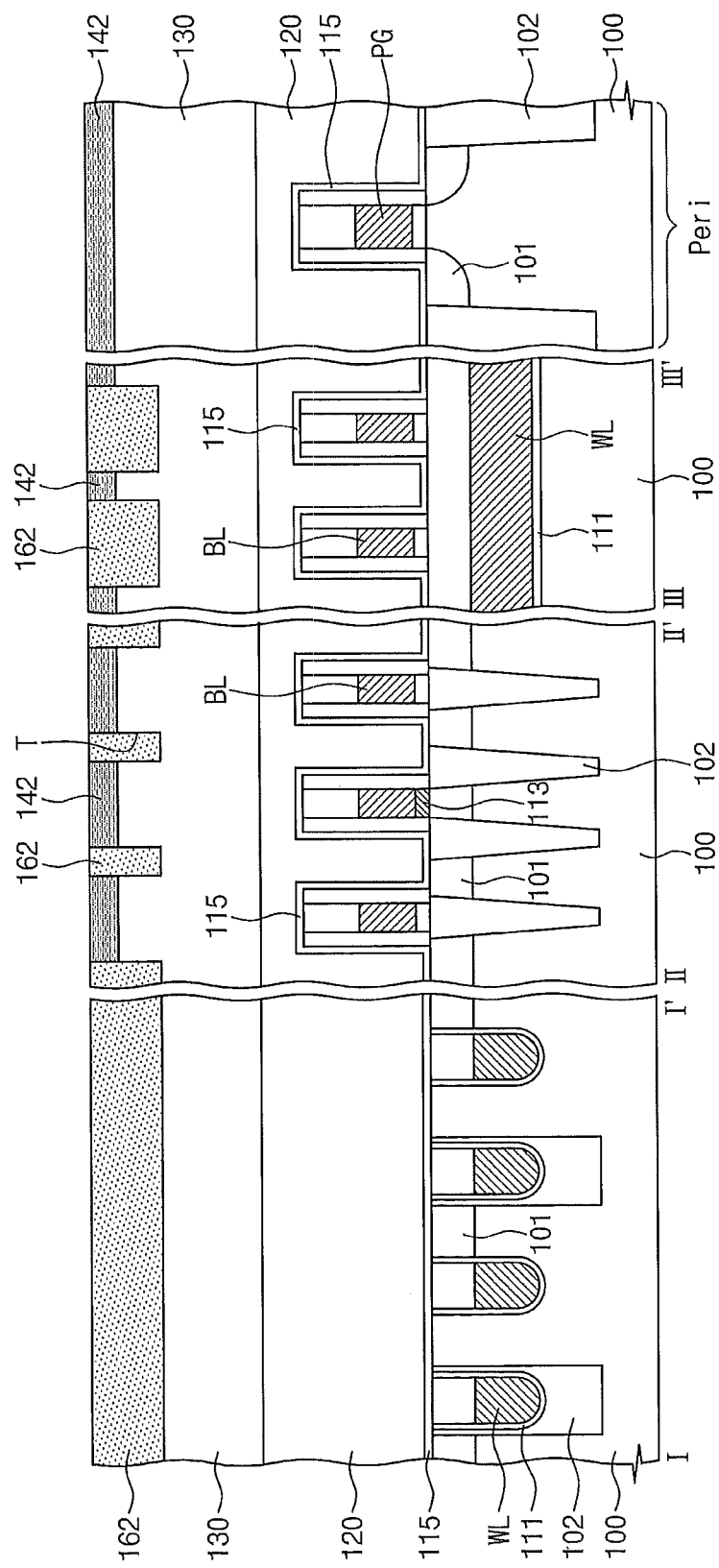

Afterwards, referring to FIG. 20C, second sacrificial layers 162 are formed in the trenches T defined in the first sacrificial layer 130.

Like the description made with reference to FIGS. 3 and 4, the forming of the second sacrificial layer 162 may include forming a coating layer on the first mask patterns 142 so as to fill the trenches T formed in the first sacrificial layer 130, and anisotropically etching the coating layer until the top surfaces of the first mask patterns 142 are exposed. The second sacrificial layers 162 formed in the trench T may have the shape of a line crossing the word lines WL. Also, since the second sacrificial layer 162 is formed by anisotropically etching the coating layer, the second sacrificial layer 162 in the peripheral circuit region PERI may be removed from the first sacrificial layer 130.

Figure 20D:
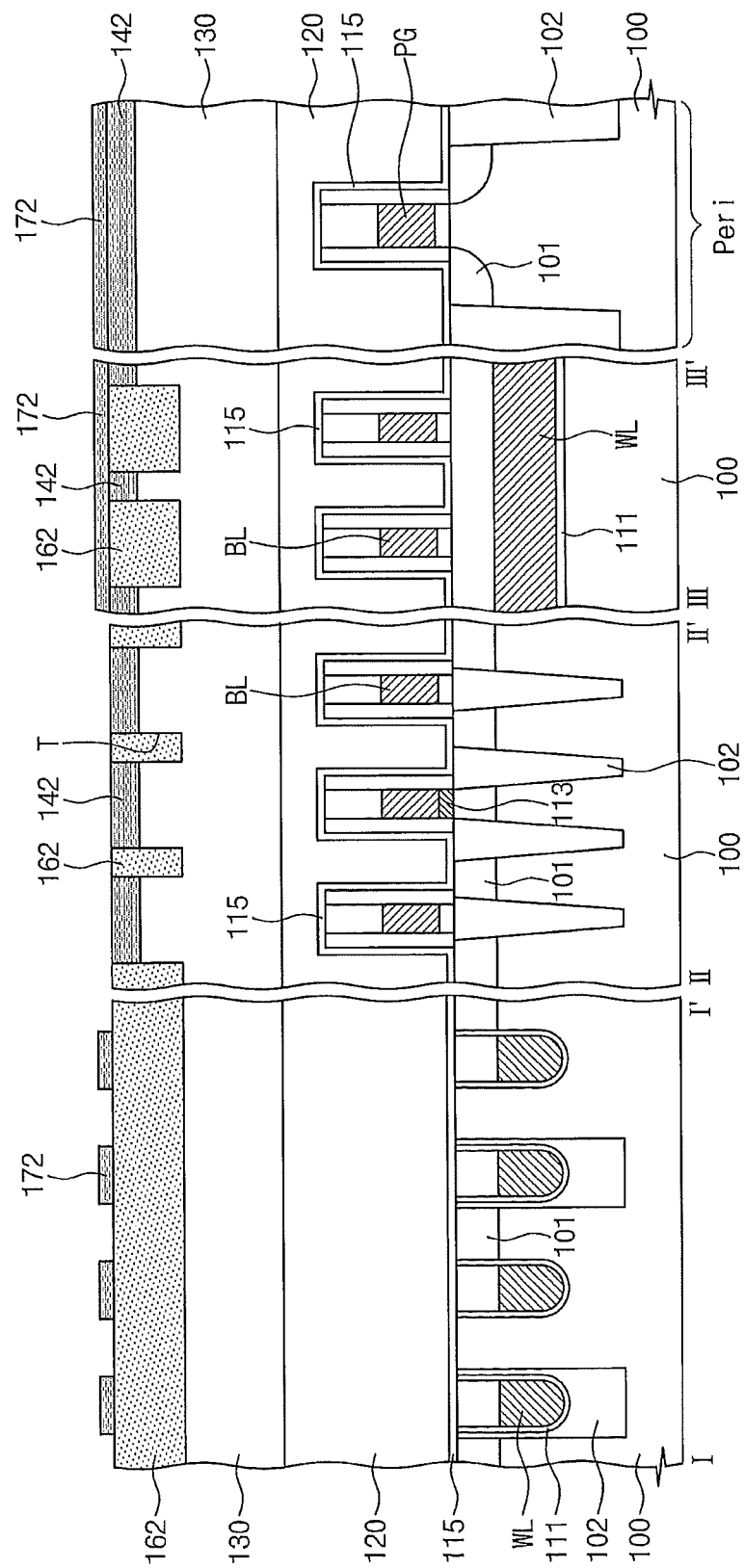

Referring to FIG. 20D, second mask patterns 172 are formed on the first mask patterns 142 and the second sacrificial layers 162.

The second mask patterns 172, as illustrated in FIG. 5, may be formed in such a way to cross the first mask patterns 142 and the second sacrificial layers 162 at an orthogonal angle. In an embodiment, the second mask patterns 172 may be parallel with the word lines WL. Also, the second mask pattern 172 may overlap the word lines WL when viewed from the top. The second mask patterns 172 may be in direct contact with the first mask patterns 142 and the second sacrificial layers 162 partially.

The second mask patterns 172 may cover an entire surface of the first mask pattern 142 of the peripheral circuit region Peri. That is, the first sacrificial layer 130 is not exposed in the peripheral circuit region Peri.

Figure 20E:
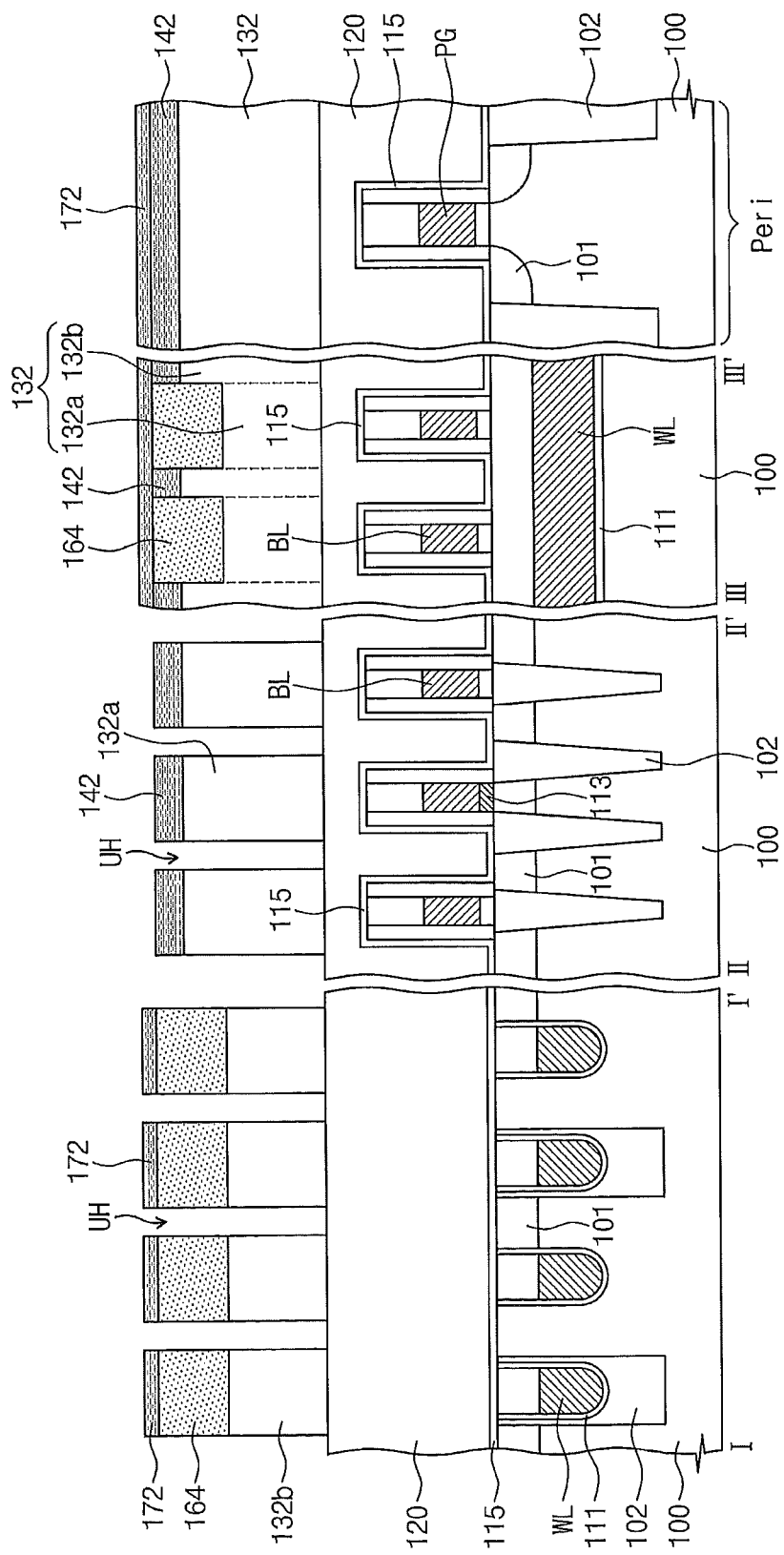

Referring to FIG. 20E, the first and second sacrificial layers 130 and 162 are patterned by using the first and second mask patterns 142 and 172, thereby forming a mask structure in which upper holes UH are defined to expose the first ILD 120. According to an embodiment, the upper holes UH may be formed over the source and drain regions 101.

Like the description made with reference to FIG. 8, the mask structure may include first and second sacrificial patterns 132 and 164 containing carbon. The upper holes UH may be defined by the first and second sacrificial patterns 132 and 164. Here, the first sacrificial pattern 132 of the mask structure may include first portions 132a and second portions 132b having heights smaller than the first portions 132a, and the second sacrificial patterns 164 are positioned on the second portions 132b of the first sacrificial pattern 132.

Figure 20F:
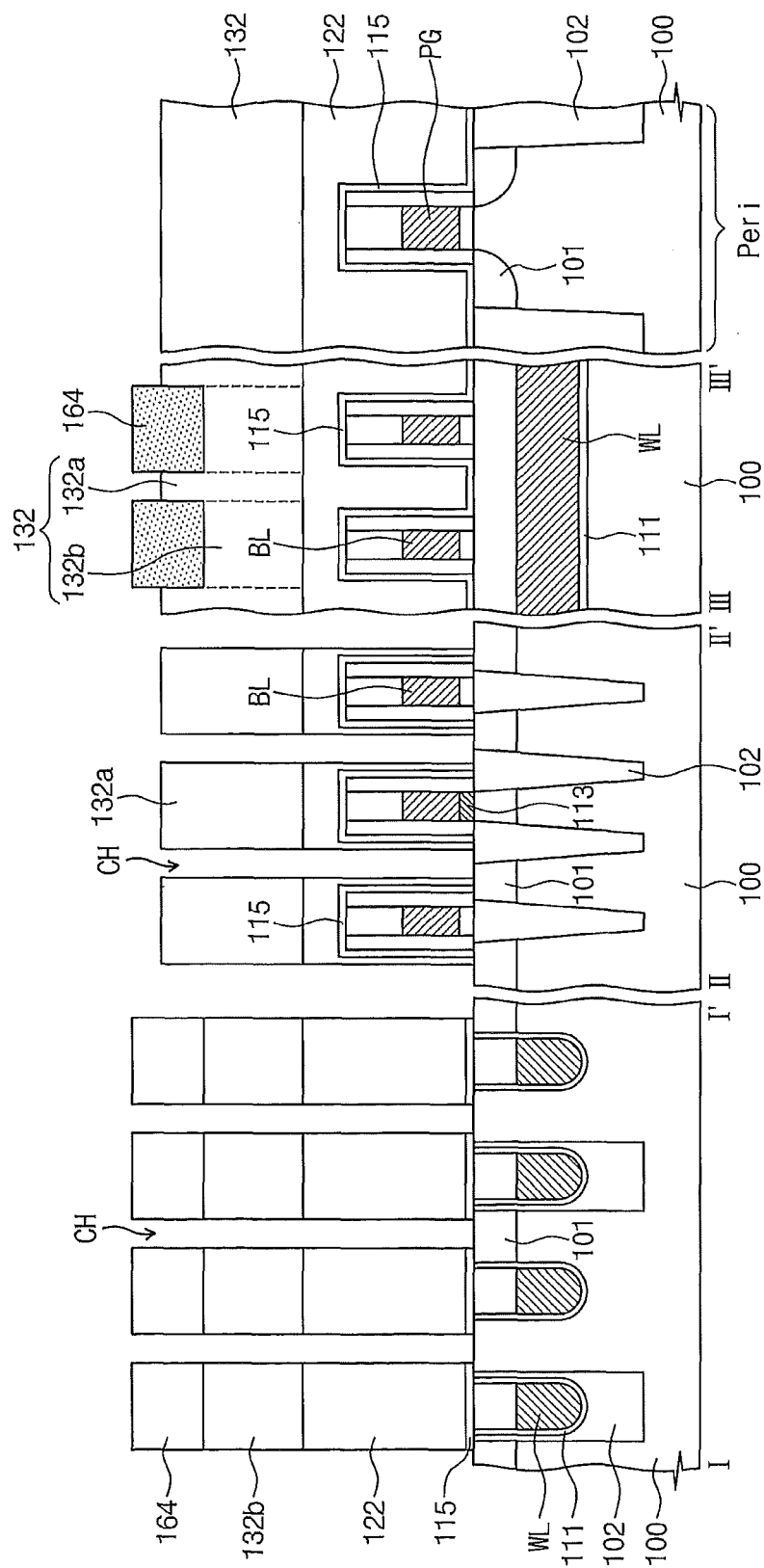

Referring to FIG. 20F, contact holes CH exposing the source and drain regions 101 may be formed by anisotropically etching the first ILD 120 and the etch stop layer 115 in sequence by using the mask structure. The width of the contact hole CH may be smaller than the critical dimension realized by photolithography because the contact holes CH are formed by a method for forming fine patterns according to embodiments of the inventive concept. In other words, the width of the contact hole CH may be smaller than the linewidth of the word line WL or bit line BL. That is, in an embodiment, the contact holes CH do not expose the etch stop layer 115 formed on sidewalls of the bit lines BL. Fine patterns may thereby be formed, that can be finer than the critical dimension of the photolithography that is used.

According to some embodiments, prior to forming of the contact holes CH, a process of removing the first and second mask patterns 142 and 147 may be performed. When the first and second mask patterns 142 and 147 are formed of the same material, the first and second mask patterns 142 and 172 may be removed simultaneously.

In detail, the first and second mask patterns 142 and 172 may be removed by using dry or wet etching. Since the first and second mask patterns 142 and 172 have a high etch selectivity with respect to the first and second sacrificial patterns 132 and 164, the first and second mask patterns 142 and 172 may be selectively removed from the first and second sacrificial patterns 132 and 164.

In some embodiments, when the first and second mask patterns 142 and 172 are formed of the same material, the etching of the first and second mask patterns 142 and 172 may be performed in-situ because the first and second mask patterns 142 and 172 are in direct contact with each other. In other embodiments, when the first and second mask patterns 142 and 172 are formed of different materials, the first and second mask patterns 142 and 172 may be etched in sequence.

Meanwhile, according to other embodiments, the process of removing the first and second mask patterns 142 and 172 may be performed after the contact holes CH are formed in the first ILD 120. However, when the etch stop layer 115 and the sidewall spacers of the bit lines BL are exposed to the contact holes CH, the etch stop layer 115 and the sidewall spacers of the bit lines BL may be removed simultaneously during the process of removing the first and second mask patterns 142 and 172. In this case, the bit lines BL may be exposed to the contact holes CH, and the contact plugs BC formed in the contact holes CH may contact the bit lines BL. Therefore, before the contact holes CH are formed, the process of removing the first and second mask patterns 142 and 172 may be performed. In this case, while removing the first and second mask patterns 142 and 172, a portion of the first ILD 120 uncovered by the first and second sacrificial patterns 132 and 164 may be removed.

Figure 20G:
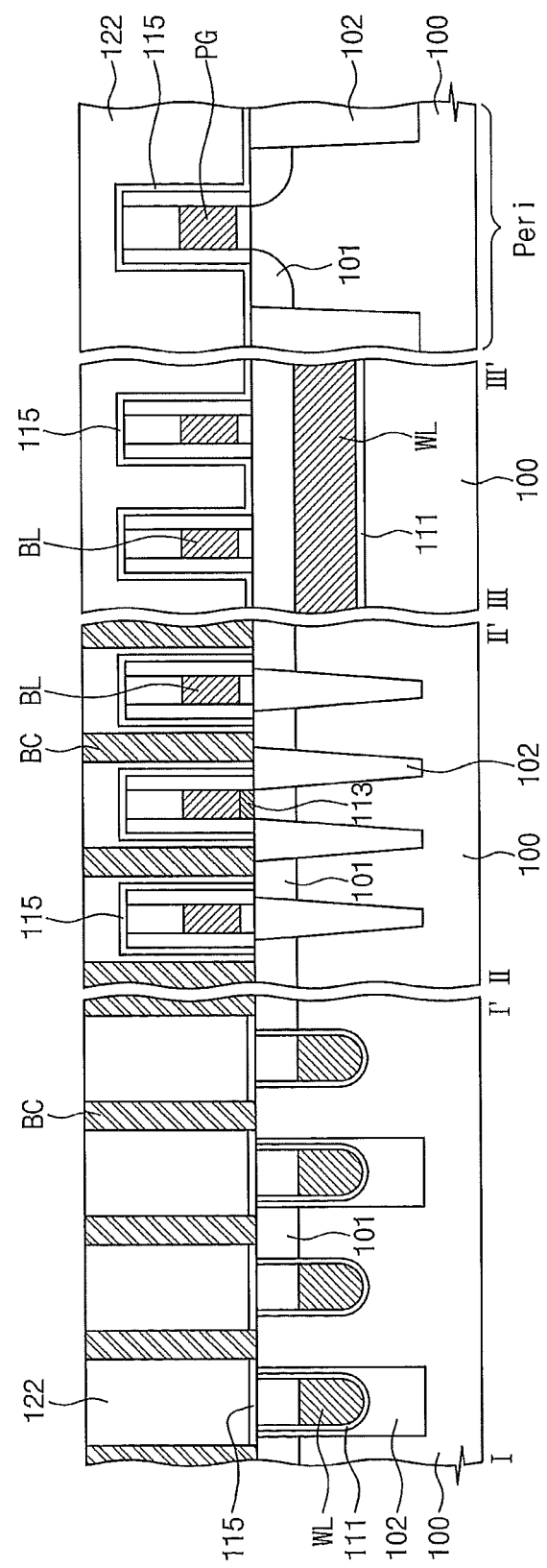

Thereafter, referring to FIG. 20G, after the contact holes CH are formed in the first ILD 120, the first and second sacrificial patterns 132 and 164 are removed by performing ashing and/or stripping process. Subsequently, the contact plugs BC contacting the source and drain regions 101 are formed in the contact holes CH.

The contact plugs BC may be formed by depositing a conductive layer on the first ILD 122 to fill the contact holes CH, and then planarizing the conductive layer. The contact plug BC may be formed of a polysilicon layer doped with impurities, a metal layer, a metal nitride layer and/or a metal silicide layer.

The contact plugs BC formed in the contact holes CH may have widths smaller than the linewidths of the word lines WL or bit lines BL. The contact plugs BC may be separated from the etch stop layer 115 and the sidewall insulation layers formed on the sidewalls of the bit lines BL. For example, the contact plugs BC formed in the present embodiment may have a width ranging from about 10 nm to about 40 nm. Also, the contact plugs may have an aspect ratio ranging from about 4:1 to about 16:1. Fine patterns may thereby be formed, that can be finer than the critical dimension of the photolithography that is used.

Figure 21:
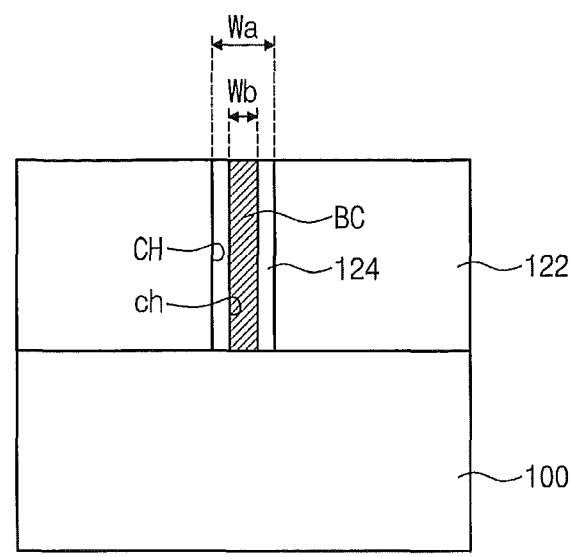
FIG. 21 is a schematic sectional view illustrating a contact plug formed using embodiments of the inventive concept.

The contact plugs BC may be formed in a configuration illustrated in FIG. 21. FIG. 21 is a schematic sectional view illustrating a contact plug formed using embodiments of the inventive concept.

Referring to FIG. 21, an insulation pattern 122 having the contact holes CH using embodiments of the inventive concept may be formed on the substrate 100. That is, the contact holes CH may be formed by anisotropically etching an insulation layer by using the mask structure of FIG. 8 as an etch mask.

According to the present embodiments, before a conductive material is filled into the contact hole CH, a spacer 124 may be formed on inner walls of the contact holes CH. The spacer 124 may be selectively formed on the inner walls of the contact hole CH by conformally forming an insulation layer on the insulation pattern 122 with the contact holes CH formed by using a deposition technique providing excellent step coverage, and then etching the insulation layer anisotropically. A fine contact hole ch may be formed in the contact hole CH by the spacer 124. Accordingly, a width Wb of the fine contact hole ch may be smaller than a width Wa of the contact hole CH. Afterwards, a conductive material is filled into the fine contact hole ch to thereby form the contact plug BC. The contact plug BC formed thus may have the width Wb smaller than the width Wa of the contact hole CH.

<Application Example of Capacitor>

FIGS. 22A through 22E are cross-sectional views illustrating a method for forming a capacitor of a DRAM device using a method for forming fine patterns according to embodiments of the inventive concept. The manufacturing method described with reference to FIGS. 22A to 22E may follow the aforesaid processes of FIGS. 20A through 20G.

Figure 22A:
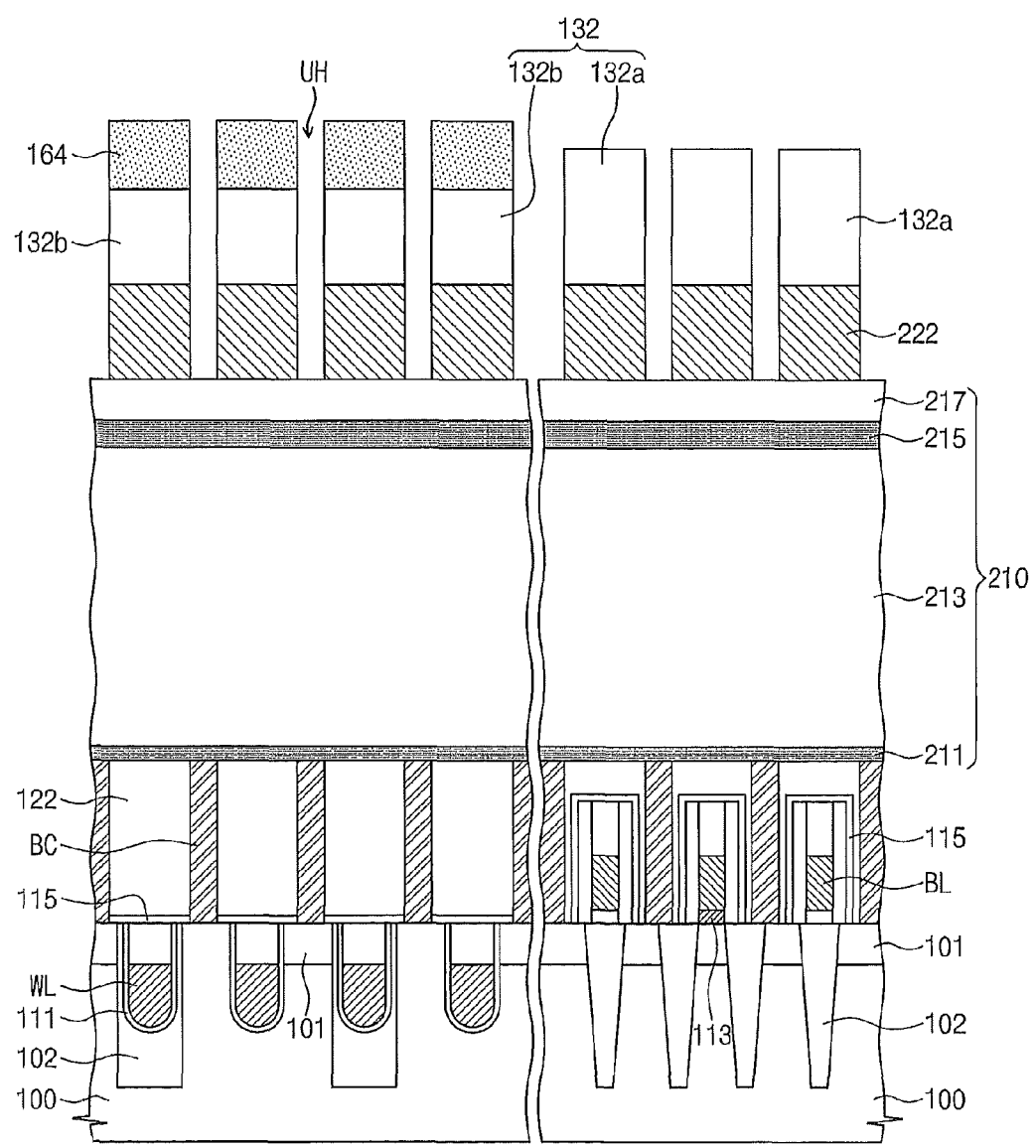
FIGS. 22A through 22E are cross-sectional views illustrating a method for forming a capacitor of a DRAM device using a method for forming fine patterns according to embodiments of the inventive concept.

Referring to FIG. 22A, a mold layer 210 in which a plurality of insulation layers are stacked may be formed on the first ILD 122 with the contact plugs BC formed. For example, the mold layer 210 may include an etch stop layer 211, a lower mold layer 213, a support layer 215, and an upper mold layer 217. Here, the lower and upper mold layers 213 and 217 may be formed of silicon oxide, and the etch stop layer 211 and the support layer 215 may be formed of a material which has an etch selectivity with respect to the lower and upper mold layers 213 and 217 during the wet etching of the lower and upper mold layers 213 and 217. For example, the etch stop layer 211 and the support layer 215 may be formed of silicon nitride.

In forming of a cylinder type capacitor, the height of a storage electrode may vary with the thickness of the mold layer 210, and the capacitance of the capacitor may vary with the height of the storage electrode. That is, as the height of the storage electrode increases, the capacitance of the capacitor may increase. Therefore, a memory capacity of a DRAM device may be increased by forming a thick mold layer 210. According to some embodiments, the mold layer 210 may have a thickness ranging from about 5,000 Å to about 10,000 Å. Thus, a mask structure having an excellent etch selectivity with respect to the mold layer 210 during the etching of the mold layer 210 is desired in order to form storage holes penetrating the thick mold layer 210.

Accordingly, storage holes SH are formed in the mold layer 210 using the method for forming fine patterns according to embodiments of the inventive concept.

According to the present embodiments, to form the storage holes SH, the mask structure formed with reference to FIGS. 1 through 9 may include an upper mask structure 132 and 164 formed of a material containing carbon as a main component, and a lower mask structure 222 formed of polysilicon. Here, like the description made with reference to FIG. 8, the upper mask structure 132 and 164 may include a first sacrificial pattern 132 provided with first and second patterns 132a and 132b, and a second sacrificial pattern 164. The lower mask structure 222 is higher in etch selectivity with respect to the mold layer 210 than the upper mask structure 132a and 132b during the etching of the mold layer 210. For example, the lower mask structure 222 may be formed of a polysilicon layer, and may thus be formed by patterning the polysilicon layer by using the upper mask structure 132 and 164.

Figure 22B:
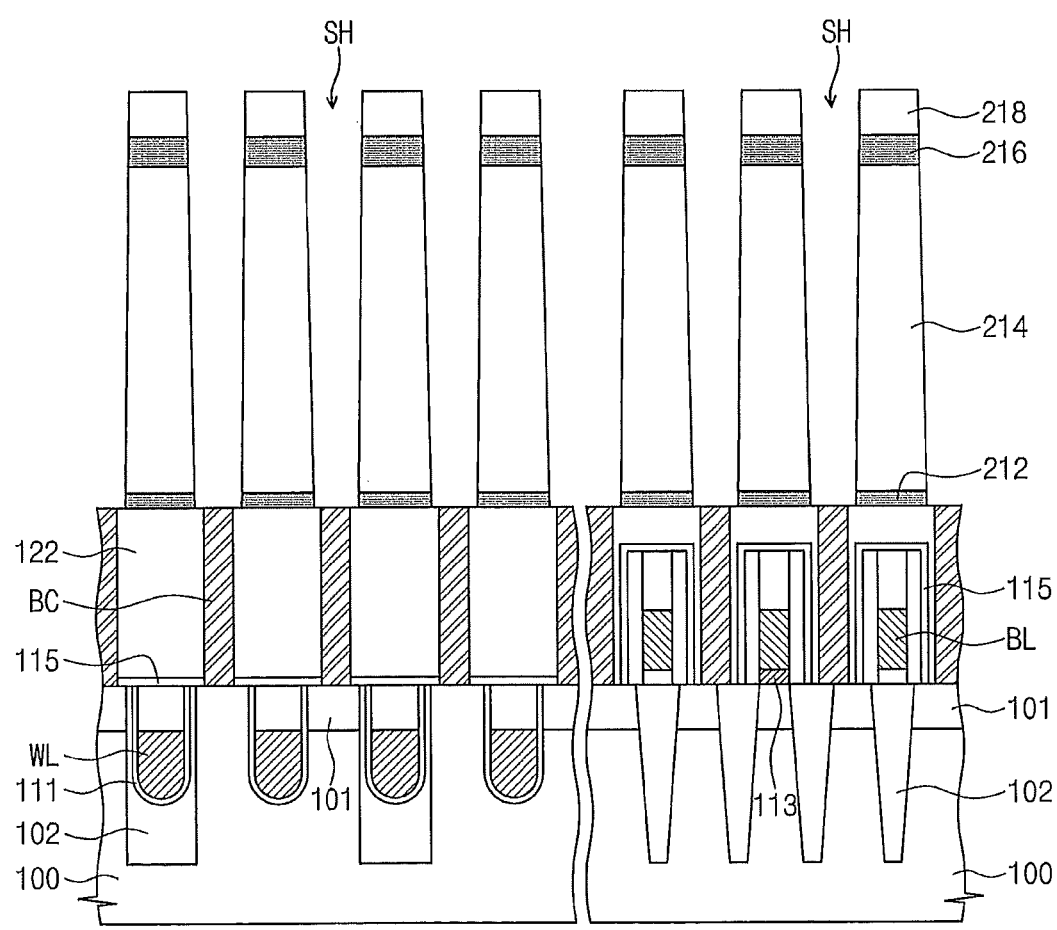

Subsequently, the mold layer 210 is anisotropically etched by using the upper and lower mask structures, 132, 164 and 222 as etch masks. Accordingly, as illustrated in FIG. 22B, mold patterns 212, 214, 216 and 218 having the storage holes SH exposing the contact plugs BC may be formed. In an embodiment, the storage holes SH may have an aspect ratio ranging from about 6:1 to about 16:1. Moreover, the walls of the storage holes may be oblique relative to the substrate, rather than orthogonal thereto, so that the storage holes are narrower adjacent the substrate than remote from the substrate.

Figure 22C:
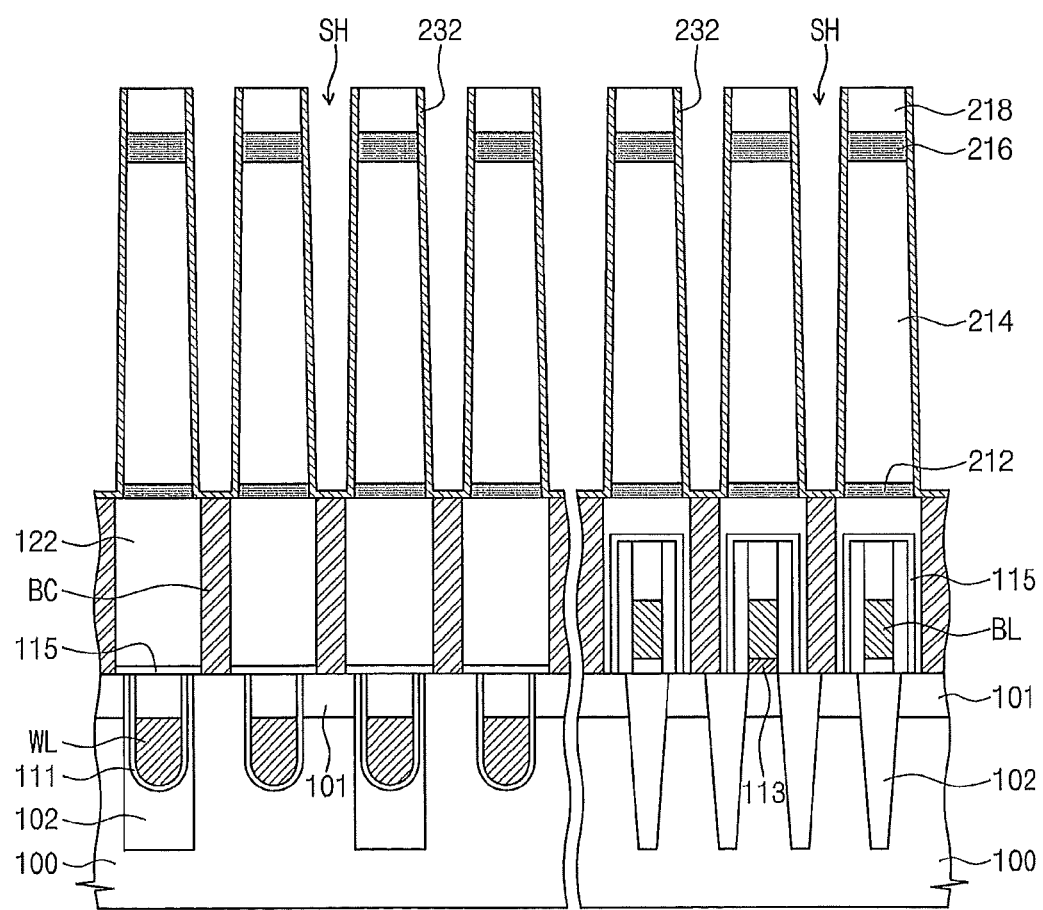

Thereafter, referring to FIG. 22C, storage electrodes 232 may be formed in the storage holes SH. The storage electrode 232 may be a cylinder type storage electrode, and formed in the storage hole SH by conformally depositing a conductive layer along inner walls of the storage hole SH, and removing the conductive layer deposited on the upper mold pattern 218.

Figure 22D:
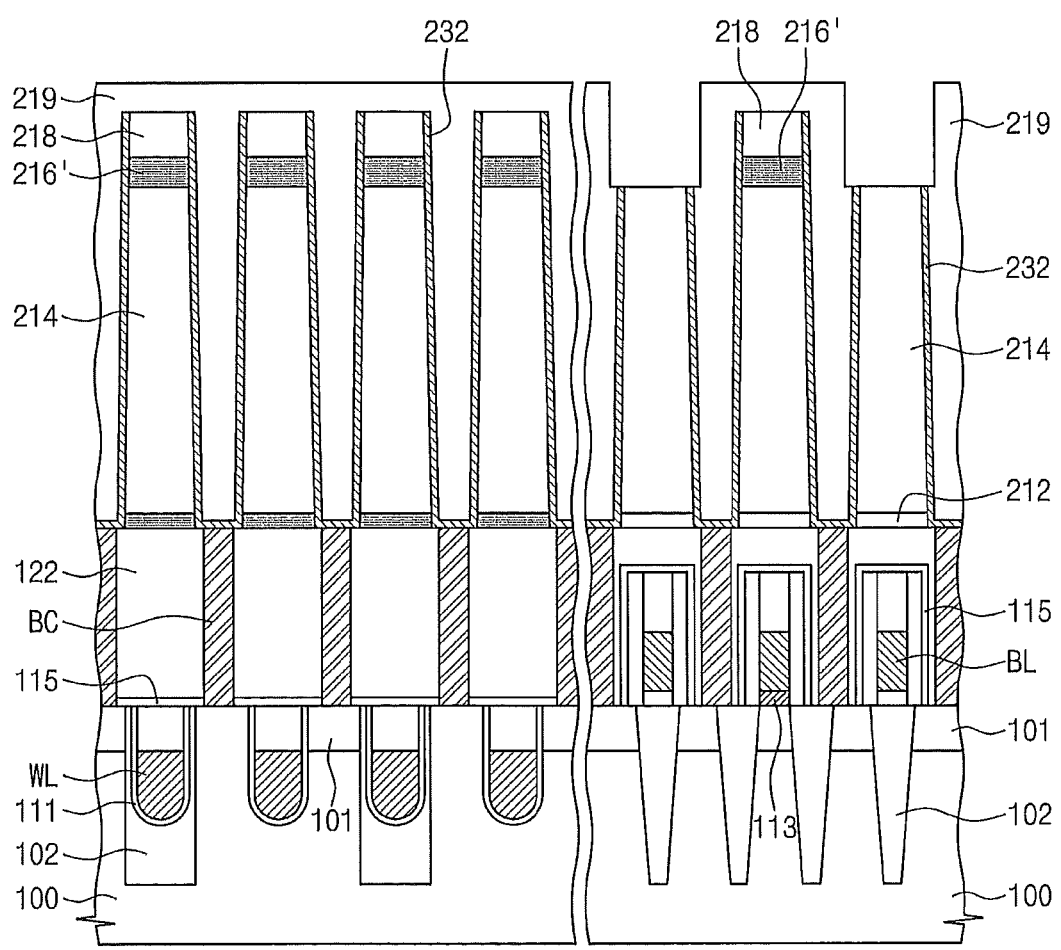

After forming the storage electrodes 232, a support pattern 216' may be formed, as illustrated in FIG. 22D. To form the support pattern 216', a sacrificial layer 219 filling the inside of the storage electrode 232 is formed, and openings exposing a portion of a support layer 216 are then formed in the sacrificial layer 219. Thereafter, the portion of the support layer 216 exposed by the openings are removed, thereby forming the support pattern 216'. As the support pattern 216' is formed, portions of the lower mold layer 214 between the storage electrodes 232 may be exposed. That is, the support pattern 216' may expose the portion of the lower mold layer 214 while surrounding outer walls of the storage electrodes 232. The support pattern 216' formed thus may prevent the storage electrodes 232 with a high aspect ratio from being collapsed even after the upper and lower mold layers 214 and 218 are removed during a subsequent process.

Figure 22E:
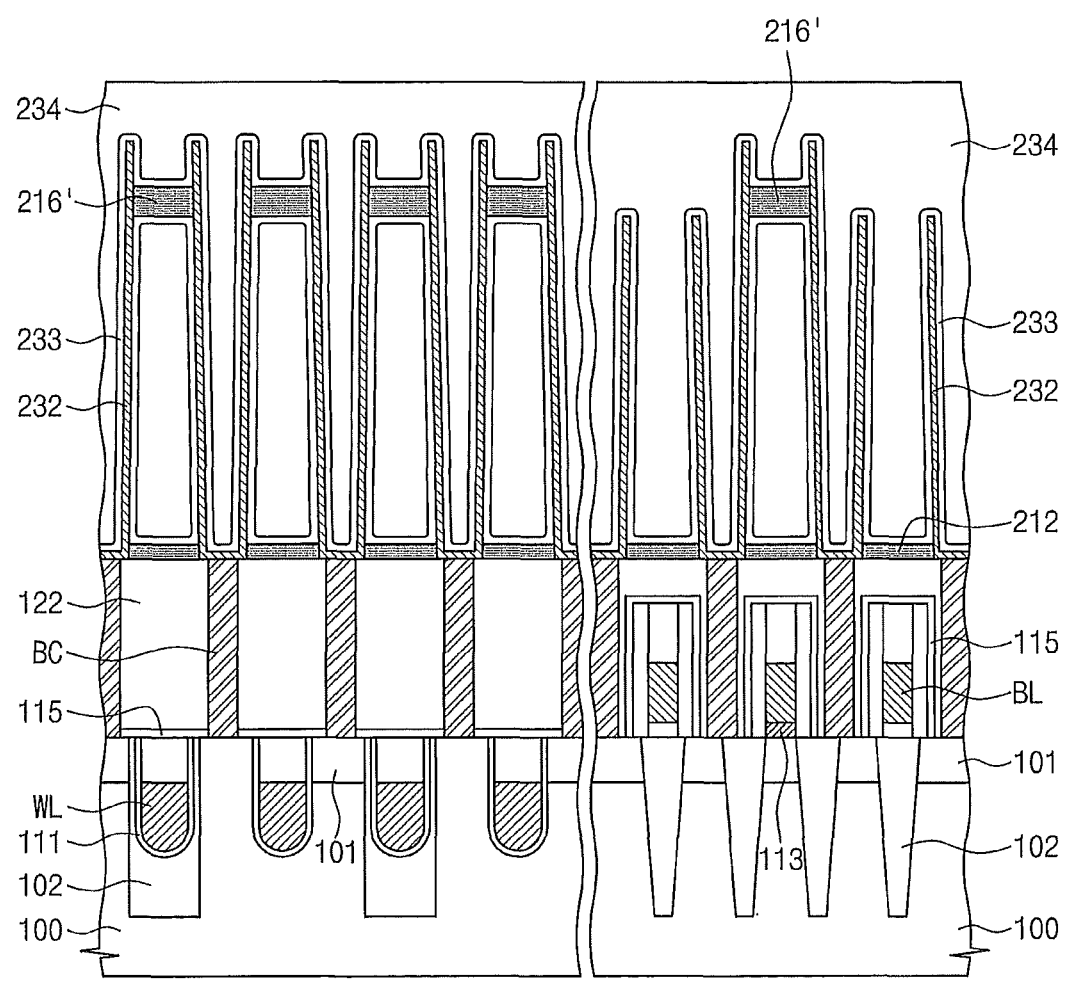

Next, referring to FIG. 22E, an etch process may be performed to selectively remove the lower and upper mold patterns 214 and 218. A dielectric layer 233 may be conformally formed along the inner and outer walls of the storage electrode 232. Also, a top electrode 234 may be formed on the dielectric layer 233.

<Application Example of Fin FET>

Figure 23:
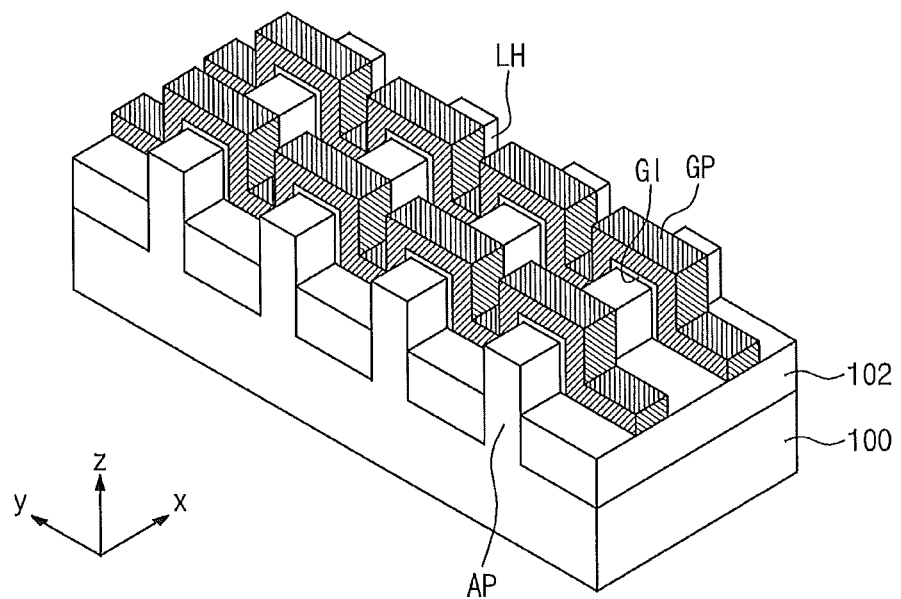
FIG. 23 is a perspective view illustrating a fin-type field effect transistor formed using embodiments of the inventive concept.

FIG. 23 is a perspective view illustrating a fin-type field effect transistor (fin FET) formed using embodiments of the inventive concept.

In the fin FET illustrated in FIG. 23, active patterns AP protruding upward from a top surface of a substrate 100 may be used as a channel region. The active patterns AP may be 2-dimensionally arranged on the substrate 100, and may be a single or poly crystalline semiconductor material or an epitaxial layer growing from the semiconductor substrate 100.

According to present embodiments, the active patterns AP may have the shape of a bar, and a device isolation layer 102 may be disposed between the active patterns AP. The top surface of the device isolation layer 102 may be positioned lower than the top surfaces of the active patterns AP. That is, both of sidewalls and top surface of the active patterns AP may be exposed by the device isolation layer 102. Meanwhile, although, in FIG. 23, the active patterns AP are disposed such that they are perpendicular to gate electrodes GP, the active patterns AP may be non-parallel and non-particular to the gate electrodes GP.

The gate electrodes GP may be disposed to cross the active patterns AP. Specifically, the gate electrodes GP may conformally cover the sidewalls and top surface of the active patterns AP. A gate dielectric GI may be disposed between the gate electrode GP and the active patterns AP. Source/drain regions doped with impurities may be formed in the active regions AP at both sides of the gate electrode GP.

The active patterns AP of the fin FET may be formed by a method for forming fine patterns according to embodiments of the present invention.

In detail, a mask structure (MS in FIG. 8) is formed on the substrate 100 as illustrated in FIGS. 1 through 8. Upper holes UH (UH in FIG. 8) formed in the mask structure (MS in FIG. 8) may have the shape of a bar when viewed from the top. The upper holes (UH in FIG. 8) may expose the top surface of the substrate 100. Subsequently, a portion of the substrate 100 is anisotropically etched by using the mask structure (MS in FIG. 8) as an etch mask. Accordingly, the top surface of the substrate 100 exposed by the upper holes (UH in FIG. 8) is recessed to thereby form lower holes (LH in FIG. 9) in the substrate 100. Here, both sidewalls of the lower holes (LH in FIG. 9) define both sidewalls of the active pattern AP. Thereafter, the mask structure (MS in FIG. 8) is removed, and resultantly the active patterns AP may be formed in the substrate 100.

<Application Example of Vertical Channel Transistor>

Figure 24:
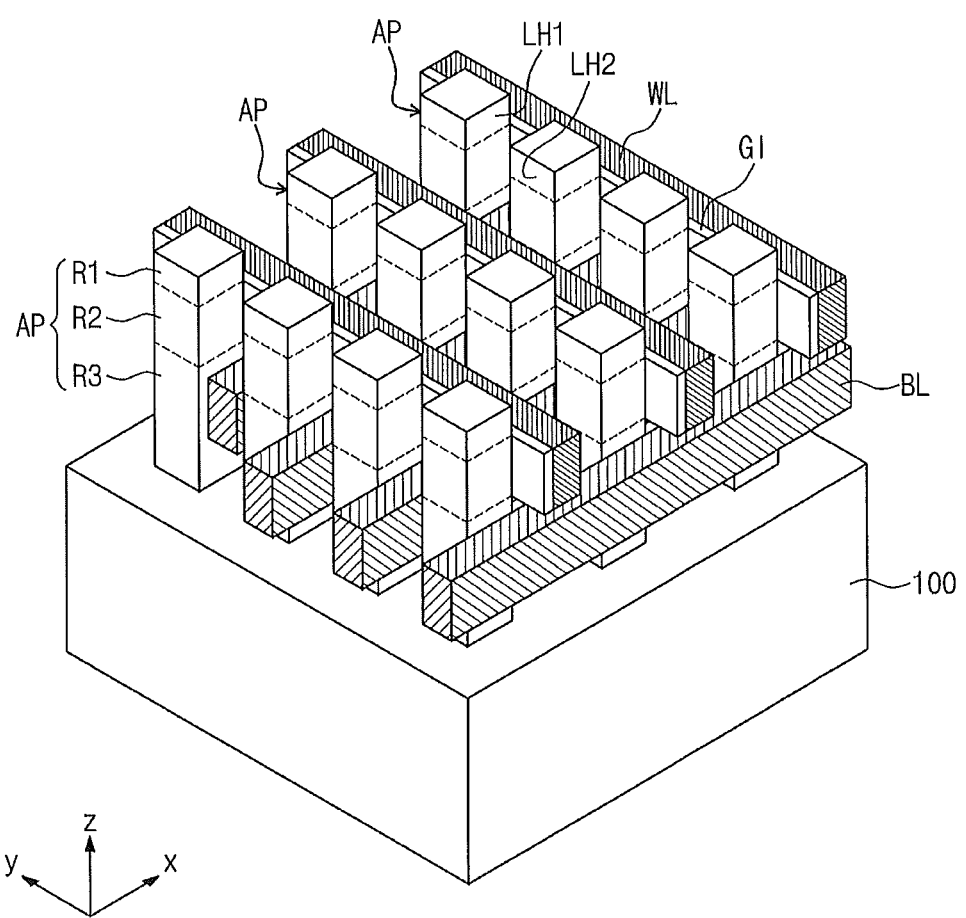
FIG. 24 is a perspective view illustrating a transistor having a vertical channel formed using embodiments of the inventive concept.

FIG. 24 is a perspective view illustrating a vertical channel transistor formed using embodiments of the inventive concept.

In the vertical channel transistor illustrated in FIG. 24, active patterns AP protruding upward from a top surface of a substrate 100 may be used as a channel region. The active patterns AP may be 2-dimensionally arranged on the substrate 100, and may be a single or poly crystalline semiconductor material or an epitaxial layer growing from the semiconductor substrate 100.

The active pattern AP may include a first region R1 on the substrate 100, a second region R2 between the substrate 100 and the first region R1, and a third region R3 between the substrate 100 and the second region R2. That is, the third, second and first regions R3, R2 and R1 are sequentially disposed on the substrate 100 such that they are in direct contact with each other. The first and third regions R1 and R3 may have a conductivity type differing from the substrate 100, and the second region R2 may have the same conductivity type as the substrate 100 or may be an intrinsic semiconductor. For example, if the substrate is p-type semiconductor, the first and third regions R1 and R3 may be n-type semiconductor, and the second region R2 may be p-type semiconductor or intrinsic semiconductor.

The word lines WL may be disposed crossing the second regions R2 of the active patterns AP. A gate dielectric GI may be disposed between the second region R2 of the active pattern AP and the word line WL. Bit lines BL may be electrically connected to the third regions R3 of the active patterns AP, and disposed crossing the word lines WL. That is, the bit lines BL may be disposed to cross the third regions R3 of the active patterns AP.

The word lines WL and bit lines BL may be formed of a conductive material. For example, the word lines WL and bit lines BL may include doped semiconductor (e.g., doped silicon, doped germanium, etc.), conductive metal nitride (e.g., titanium nitride, tantalum nitride, etc.), metal (e.g., tungsten, titanium, tantalum, etc.), and/or metal-semiconductor compounds (e.g., tungsten silicide, cobalt silicide, titanium silicide, etc.). The gate dielectric layer GI may be formed of oxide, nitride and/or oxynitride.

In this structure, the first region R1 of the active pattern AP may be used as a drain electrode of the vertical channel transistor, and the third region R3 of the active pattern AP may be used as a source electrode of the vertical channel transistor. The second region R2 of the active pattern AP may be used as a channel region of the vertical channel transistor.

The pillar-shaped active patterns AP of the vertical channel transistor may be formed through the method for forming fine patterns according to embodiments of the inventive concept. For example, the pillar-shaped active patterns AP may be formed as follows.

A first mask structure may be formed on the substrate prepared with reference to FIGS. 1 through 8. Like the description made with reference to FIG. 23, the first mask structure may have bar-shaped upper holes when viewed from the top. Subsequently, a portion of the substrate 100 is etched by using the first mask structure. Accordingly, the top surface of the substrate 100 exposed by the upper holes is recessed, and first lower holes LH1 may thus be formed in the substrate 100. That is, by virtue of the first mask structure, the bar-shaped active patterns AP may be formed on the substrate 100 as illustrated in FIG. 23. Herein, the first lower holes LH1 may define a pair of first sidewalls facing each other in the active pattern AP.

Thereafter, a second mask structure having upper holes crossing the bar-shaped active patterns may be formed over the substrate 100. Next, the bar-shaped active patterns AP exposed by the upper holes may be anisotropically etched. Resultantly, second lower holes LH2 may be formed in the substrate 100. The second lower holes LH2 may define a pair of second sidewalls facing each other in the active pattern AP.

As the pillar-shaped active patterns AP are formed using the mask structure having the bar-shaped upper holes twice, the active patterns AP may have a rectangular shape when viewed from the top.

Meanwhile, the active patterns AP may be formed by forming a lower pattern (22 in FIG. 8) on the substrate 100, and then performing selective epitaxial growth to selectively grow a semiconductor layer from the substrate 100.

<Application Example of VNAND>

Figure 25:
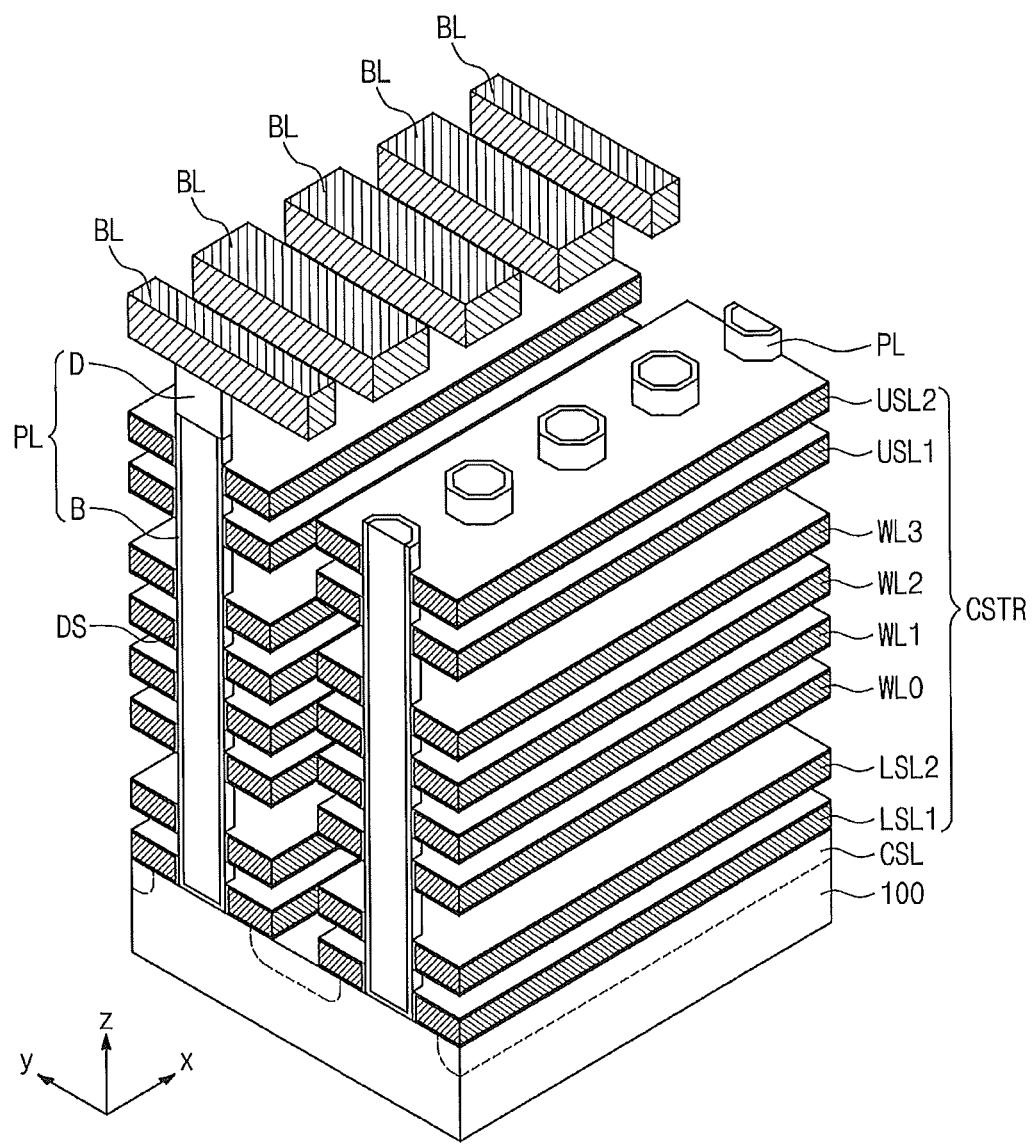
FIG. 25 is a perspective view illustrating a three-dimensional semiconductor memory device formed using a method for forming fine patterns according to embodiments of the inventive concept.

FIG. 25 is a perspective view illustrating a three-dimensional memory device formed using a method for forming fine patterns according to embodiments of the inventive concept.

The three-dimensional memory device according to these embodiments may include a common source line CSL, a plurality of bit lines BL, and a plurality of cell strings CSTR disposed between the common source line CSL and the bit lines BL.

The common source line CSL may be a conductive thin film disposed on the substrate 100 and/or an impurity region formed in the substrate 100. The bit lines BL may be conductive patterns (e.g., metal lines) which are separated from the substrate 100 and disposed thereon. The bit lines BL are 2-dimensionally arranged and the plurality of cell strings CSTR are connected to each of the bit lines BL in parallel. Thus, the cell strings CSTR may be 2-dimensionally arranged over the common source line CSL or substrate 100.

Each of the cell strings CSTR includes a plurality of lower select lines LSL1 and LSL2, a plurality of word lines WL0 to WL3, and a plurality of upper select lines USL1 and USL2, between the common source line CSL and the bit lines BL. The lower select lines LSL1 and LSL2, the word lines WL0 to WL3, and the upper select lines USL1 and USL2 may be conductive patterns stacked on the substrate 100.

Each of the cell strings CSTR may include semiconductor pillars PL which extend perpendicularly from the common source line CSL to contact the bit line BL. The pillars PL may be formed to penetrate the lower select lines LSL1 and LSL2, the word lines WL0 to WL3, and the upper select lines USL1 and USL2. In other words, the semiconductor pillars PL may penetrate a plurality of conductive patterns stacked on the substrate 100. In addition, the semiconductor pillar PL may include a body B, and an impurity region formed at one end or both ends of the body. For example, a drain region D may be formed on an upper end of the semiconductor pillar PL (i.e., between the body B and the bit line BL).

A data storage layer DS may be disposed between the word lines WL0 to WL3 and the semiconductor pillars PL. According to some embodiments, the data storage layer DS may be a charge storage layer. For example, the data storage layer DS may be one of a trap insulation layer, a floating gate electrode, and/or an insulation layer having conductive nano dots.

Between the lower select lines LSL1 and LSL2 and the semiconductor pillars PL, or between the upper select lines USL1 and USL2 and the semiconductor pillar PL, a dielectric layer used as a gate dielectric of a transistor may be disposed. Here, the dielectric layer may be formed of the same material as the data storage layer DS, and may be a gate dielectric (e.g., silicon oxide layer) for typical metal oxide semiconductor field effect transistors (MOSFETs).

In this structure, together with the lower select lines LSL1 and LSL2, the word lines WL0 to WL3, and the upper select lines USL1 and USL2, the semiconductor pillars PL constitute a MOSFET in which the semiconductor pillar PL is used as a channel region. Also, together with the lower select lines LSL1 and LSL2, the word lines WL0 to WL3, and the upper select lines USL1 and USL2, the semiconductor pillars PL constitute a MOS capacitor.

In this case, the lower select lines LSL1 and LSL2, the word lines WL0 to WL3, and the upper select lines USL1 and USL2 may be used as gate electrodes of select transistors and cell transistors, respectively. An inversion layer may be formed on the semiconductor pillars PL owing to a fringe field generated from a voltage applied to the lower select lines LSL1 and LSL2, the word lines WL0 to WL3, and the upper select lines USL1 and USL2. The inversion layer formed on the semiconductor pillar PL forms a current path which electrically connects the selected bit line from the common source line CSL.

That is, the cell string CSTR may have a configuration in which lower and select transistors formed by the lower and upper select lines LSL1, LSL2, USL1 and USL2 are connected to cell transistors formed by the word lines WL0 to WL3 in series.

Thus, in the three-dimensional semiconductor memory device including the semiconductor pillars PL, the semiconductor pillars PL may be formed using the method for forming fine patterns according to embodiments of the inventive concept.

More specifically, the forming of the three-dimensional semiconductor memory device of FIG. 25 includes forming a stack structure in which conductive patterns and insulation patterns are alternatingly stacked on the substrate 100, forming a plurality of contact holes penetrating the stack structure, and forming the semiconductor pillars PL in the contact holes. Here, the contact holes may be formed by using the previously described mask structure (MS in FIG. 8). That is, the stack structure where the conductive patterns and the insulation patterns are alternatingly stacked may be patterned by using the mask structure (MS in FIG. 8).

<Application Example of Cross Point Memory>

Figure 26A:
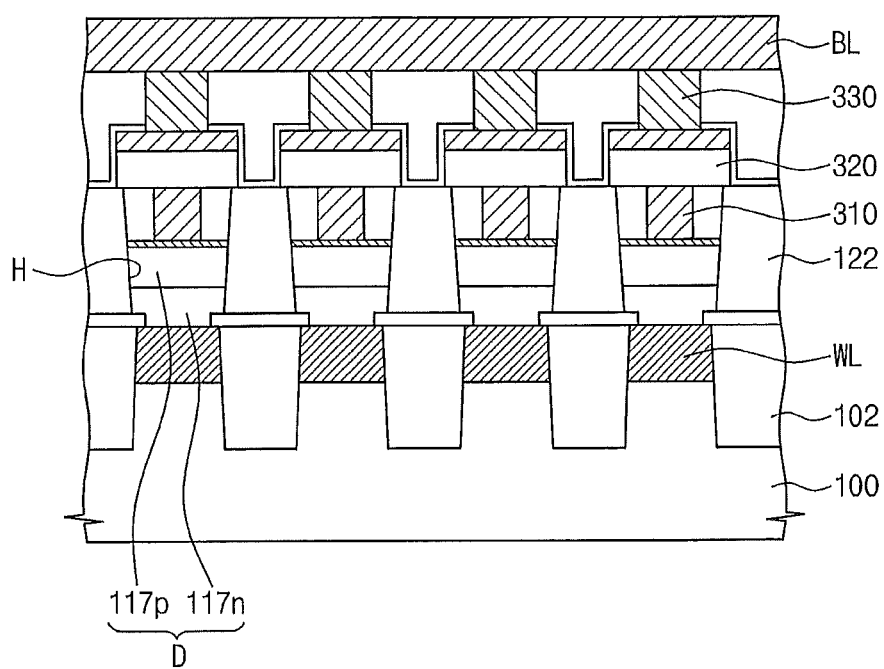
FIGS. 26A and 26B are cross-sectional views of a variable resistance memory device formed using a method for forming fine patterns according to embodiments of the inventive concept.
Figure 26B:
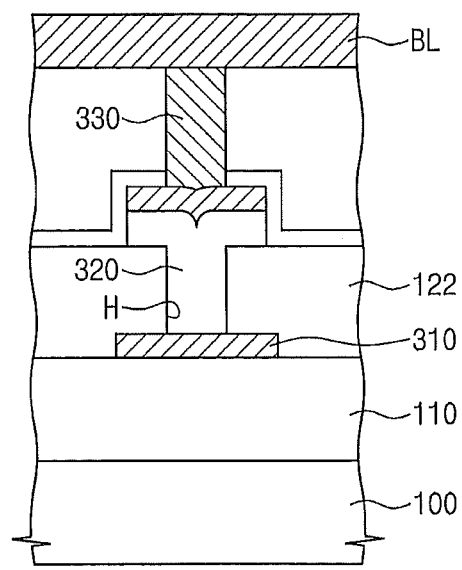

FIGS. 26A and 26B are cross-sectional views of a variable resistance memory device formed using a method for forming fine patterns according to embodiments of the inventive concept.

According to an embodiment illustrated in FIG. 26A and 26B, a variable resistance memory device may be formed using the method for forming fine patterns.

Referring to FIG. 26A, the variable resistance memory device includes a plurality of word lines WL, and a plurality of bit lines BL crossing the word lines WL. Memory cells may be disposed at intersections of the word lines WL and the bit lines BL. Each of the memory cells includes a data storage element and a select element which are connected to each other in series. The select element may be connected between the data storage element and the word line WL. While FIG. 26A exemplary illustrates a diode D as the select element, a MOS transistor or bipolar transistor may be used as the select element.

Specifically, a lower insulation layer 122 is provided on a semiconductor substrate 100 having the plurality of word lines WL. In the lower insulation layer 122, contact holes H may be formed by using the method for forming fine patterns according to embodiments of the inventive concept. The contact holes H defined in the lower insulation layer 122 may expose the top surface of the word line WL. The diode D may be formed in the contact hole H. The diode D may include an n-type semiconductor layer 117n and a p-type semiconductor layer 117b which are stacked in sequence. An interface where the n-type semiconductor layer 117n and the p-type semiconductor layer 117p are in contact with each other may be disposed inside the contact hole H. Also, a bottom electrode 310 connecting the diode D and the data storage element may be formed in the contact hole H.

A data storage layer 320 may be formed on the bottom electrode 310. The data storage layer 320 may be connected to the bit line BL crossing the word lines WL through a top electrode 330. For example, the data storage layer 320 may include a charge trapping material, a phase change material, a variable resistance material, or a magnetic material. For example, the phase change material may contain at least one chalcogenide element selected from tellurium (Te) and selenium (Se). The variable resistance material may be a colossal magneto-resistive (CMR) material layer, a high-temperature super conducting (HTSC) material layer and/or a transition metal oxide having two stable resistive states.

Meanwhile, referring to FIG. 26B, the bottom electrode connected to the select element (e.g., diode or transistor) is formed on the semiconductor substrate 100 with the word line WL formed, and the underlying insulation layer 122 is patterned so that holes partially exposing the bottom electrode 310 are formed in the underlying insulation layer 122. Here, the holes may be contact holes formed using the method for forming fine patterns according to embodiments of the inventive concept. In the holes formed thus, the data storage layer 320 may be formed. As described above, the data storage layer 320 may include a charge trapping material, a phase change material, a variable resistance material and/or a magnetic material.

In accordance with methods for forming fine patterns according to the embodiments of the inventive concept, fine patterns having an aspect ratio ranging from about 6:1 to about 16:1 can be formed by using a mask structure formed of a material containing carbon as a main component. Furthermore, it is possible to form fine patterns having a width ranging from about 10 nm to about 40 nm.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of patterning a lower layer of a microelectronic device, the method comprising:
   forming a first sacrificial layer on the lower layer;
   patterning the first sacrificial layer to form a plurality of spaced apart trenches, the plurality of spaced apart trenches extending along a first direction;
   forming a second sacrificial layer in the plurality of spaced apart trenches;
   defining upper openings in the plurality of spaced apart trenches by patterning the second sacrificial layer to form second sacrificial patterns in the plurality of spaced apart trenches, the second sacrificial patterns spaced apart from each other in the first direction; and
   patterning the lower layer using the first and second sacrificial layers as a mask to form lower openings in the lower layer,
   wherein the first and second sacrificial layers cross one another.

2. A method according to claim 1 wherein the plurality of spaced apart trenches and the upper openings extend along a same direction so that the lower openings define a series of trenches in the lower layer.

3. A method according to claim 1 wherein the plurality of spaced apart trenches in the first sacrificial layer extend along a first direction and the second sacrificial layer is patterned along a second direction that is different from the first direction so that the lower openings define an array of holes in the lower layer.

4. A method according to claim 2 wherein the second sacrificial layer includes wide and narrow portions so that the lower openings define a series of trenches in the lower layer that have wide and narrow portions.

5. A method according to claim 4 wherein the first sacrificial layer also includes wide and narrow portions and wherein the wide portions of the first sacrificial layer are offset from the wide portions of the second sacrificial layer.

6. A method according to claim 3 wherein the first and second directions are oblique or orthogonal to one another.

7. A method according to claim 1 wherein the first and second sacrificial layers comprise different materials that both include at least 50% carbon by weight.

8. A method according to claim 1 wherein the first sacrificial layer comprises an amorphous carbon layer.

9. A method according to claim 1 wherein the second sacrificial layer comprises a spin-on hard mask that comprises at least 80% carbon by weight.

10. A method according to claim 1 wherein patterning a plurality of spaced apart trenches in the first sacrificial layer comprises:
sequentially forming a hard mask, an anti-reflective coating and a patterned photoresist layer including therein the plurality of spaced apart trenches, on the first sacrificial layer;
patterning the anti-reflective coating and the hard mask using the patterned photoresist layer as a mask; and
etching partially into the first sacrificial layer using the hard mask as an etch mask to form the plurality of spaced apart trenches in the first sacrificial layer while simultaneously removing the patterned photoresist layer and the anti-reflective coating.

11. A method according to claim 10 wherein forming a second sacrificial layer in the plurality of trenches comprises:
spinning a spin-on hard mask on the hard mask and into the plurality of spaced apart trenches in the first sacrificial layer; and
etching back the spin-on hard mask to expose the hard mask.

12. A method according to claim 11 wherein etching back the spin-on hard mask to expose the hard mask comprises recessing the spin-on hard mask in the plurality of trenches relative to the hard mask.

13. A method according to claim 10 wherein the hard mask is a first hard mask, the anti-reflective coating is a first anti-reflective coating and the patterned photoresist layer is a first patterned photoresist layer and wherein patterning the second sacrificial layer in the plurality of trenches to define upper openings in the trenches comprises:
sequentially forming a second hard mask, a second anti-reflective coating and a second patterned photoresist layer on the second sacrificial layer and on the first hard mask;
patterning the second anti-reflective coating and the second hard mask using the second patterned photoresist layer as a mask; and
etching partially into the second sacrificial layer using the second hard mask as an etch mask to define the upper openings in the trenches while simultaneously removing the second patterned photoresist layer and the second anti-reflective coating.

14. A method according to claim 13 wherein the first and second patterned photoresist layers extend along a same direction.

15. A method according to claim 13 wherein the first and second patterned photoresist layers extend along different directions.

16. A method according to claim 1 wherein the lower openings have an aspect ratio of between about 2:1 and about 16:1 and a width of between about 10 nm and about 40 nm.

17. A method according to claim 1:
wherein forming a first sacrificial layer is preceded by forming word lines and bit lines crossing the word lines in the lower layer; and
wherein patterning a plurality of spaced apart trenches in the first sacrificial layer comprise patterning the plurality of spaced apart trenches to cross the word lines or bit lines.

18. A method according to claim 17, wherein the lower layer comprises a semiconductor substrate having MOS transistors using the word lines as gate electrodes,
the method further comprising forming contact plugs electrically connected to the MOS transistors by placing a conductive material into the lower openings.

19. A method according to claim 17 further comprising forming bottom electrodes of a capacitor in the lower openings.

20. A method according to claim 1 wherein the lower openings define a contact hole for a contact plug, a storage hole for a capacitor, active patterns for a Fin-FET, active patterns for a vertical channel transistor and/or holes for semiconductor pillars of a three-dimensional memory device.

21. A method according to claim 17 wherein the lower layer comprises a cell region including the word lines and the bit lines, and a peripheral circuit region disposed at the periphery of the cell region,
the forming of the first sacrificial layer comprising forming a first sacrificial layer comprising an amorphous carbon layer on the lower layer of the cell region and of the peripheral circuit region, using CVD; and
wherein patterning a plurality of spaced apart trenches in the first sacrificial layer comprises:
forming a first mask pattern covering the first sacrificial layer in the peripheral circuit region, and selectively exposing portions of the first sacrificial layer in the cell region; and
patterning the first sacrificial layer in the cell region using the first mask pattern.

22. A method according to claim 21, wherein the patterning of the second sacrificial pattern comprises:
forming a second mask pattern which directly contacts portions of the first mask pattern and exposes portions of the second sacrificial layer; and
removing the portions of the second sacrificial layer exposed by the second mask pattern.

23. A method according to claim 22, further comprising, before the forming of the lower openings, removing the first and second mask patterns.

24. A method according to claim 1 wherein patterning the lower layer is followed by removing the first and second sacrificial layers.

25. A method of patterning a lower layer of a microelectronic device, the method comprising:
forming a first sacrificial layer on the lower layer;
forming a first hard mask on the first sacrificial layer;
patterning the first hard mask to form a plurality of spaced apart first hard mask lines extending along a first direction;
forming a second sacrificial layer on the plurality of spaced apart first hard mask lines and on the first sacrificial layer therebetween;
etching back the second sacrificial layer to expose the plurality of spaced apart first hard mask lines;
forming a second hard mask on the second sacrificial layer and on the plurality of spaced apart first hard mask lines;
patterning the second hard mask to form a plurality of spaced apart second hard mask lines extending in a second direction that is different than the first direction, the plurality of spaced apart first and second hard mask lines defining an array of hard mask openings therebetween;

etching the second and first sacrificial layers using the plurality of spaced apart first and second hard mask lines as a mask to replicate the array of hard mask openings into an array of openings in the first sacrificial layer; and etching the lower layer through the array of openings in the first sacrificial layer to replicate the array of openings in the first sacrificial layer as an array of lower openings in the lower layer, wherein the plurality of spaced apart second hard mask lines are in contact with portions of the plurality of spaced apart first hard mask lines.

26. A method according to claim 25 wherein the first sacrificial layer comprises an amorphous carbon layer.

27. A method according to claim 26 wherein the second sacrificial layer comprises a spin-on hard mask.

28. A method according to claim 25 wherein the first and second directions are oblique or orthogonal to one another.

29. A method according to claim 25 wherein the lower openings have an aspect ratio of between about 2:1 and about 16:1 and a width of between about 10 nm and about 40 nm.

30. A method according to claim 25:
wherein forming a first sacrificial layer is preceded by forming word lines and bit lines crossing the word lines in the lower layer; and
wherein patterning the first hard mask to form a plurality of spaced apart first hard mask lines comprises patterning the first hard mask to form a plurality of spaced apart first mask lines that cross the word lines or bit lines.

31. A method according to claim 30, wherein the lower layer comprises a semiconductor substrate having MOS transistors using the word lines as gate electrodes,
the method further comprising forming contact plugs electrically connected to the MOS transistors by placing a conductive material in the lower openings.

32. A method according to claim 25 further comprising forming bottom electrodes of a capacitor in the lower openings.

33. A method according to claim 25 wherein the lower openings define a contact hole for a contact plug, a storage hole for a capacitor, active patterns for a Fin-FET, active patterns for a vertical channel transistor and/or holes for semiconductor pillars of a three-dimensional memory device.

34. A method according to claim 25 wherein etching the lower layer is followed by removing the first and second sacrificial layers.

35. A method of patterning a lower layer of a microelectronic device, the method comprising:
forming a first sacrificial layer and first mask patterns, on the lower layer;
forming trenches in the first sacrificial layer by patterning the first sacrificial layer using the first mask patterns as an etch mask;
forming a second sacrificial layer in the trenches and on the first mask patterns;
retaining at least some of the second sacrificial layer in the trenches by etching the second sacrificial layer to expose the first mask patterns;
forming second mask patterns on the first mask patterns, the second mask patterns crossing the trenches;
forming second sacrificial layer patterns defining upper openings in the trenches by patterning the second sacrificial layer using the second mask patterns as an etch mask; and
patterning the lower layer using the first and second sacrificial layer patterns as a mask to form lower openings in the lower layer.

36. A method according to claim 35, wherein the first and second sacrificial layers comprise a material that comprises at least 50% carbon by weight.

37. A method according to claim 35, wherein the first sacrificial layer comprises an amorphous carbon layer formed using chemical vapor deposition (CVD).

38. A method according to claim 35, wherein the forming of the upper openings comprises patterning the first sacrificial layer disposed under the second sacrificial layer using the first and second mask patterns to thereby form a first sacrificial pattern including first portions parallel with each other and second portions separated from each other between the adjacent first portions.

39. A method according to claim 35, wherein portions of the first mask patterns are in direct contact with the second mask patterns.

40. A method according to claim 35, wherein the first and second mask patterns have thicknesses of about 0.1 to about 0.5 times the thickness of the first sacrificial layer.

41. A method according to claim 35, wherein the first mask patterns are thicker than the second mask patterns.

42. A method according to claim 35, wherein the first mask patterns comprise a material having an etch selectivity with respect to the second mask patterns during the etching of the second mask patterns.

43. A method according to claim 35, wherein the first and second mask patterns comprise a material having an etch selectivity with respect to the first and second sacrificial layers during the etching process of forming the upper openings.

44. A method according to claim 35, wherein the lower layer comprises a semiconductor material, a conductive material, and/or an insulation material.

45. A method according to claim 35 wherein patterning the lower layer is followed by removing the first and second sacrificial layers.

* * * * *